(12) United States Patent
Mushiga et al.

(10) Patent No.: US 10,797,070 B2
(45) Date of Patent: Oct. 6, 2020

(54) THREE-DIMENSIONAL MEMORY DEVICE CONTAINING A REPLACEMENT BURIED SOURCE LINE AND METHODS OF MAKING THE SAME

(71) Applicant: SANDISK TECHNOLOGIES LLC, Addison, TX (US)

(72) Inventors: Mitsuteru Mushiga, Yokkaichi (JP); Kenji Sugiura, Yokkaichi (JP); Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/241,221

(22) Filed: Jan. 7, 2019

(65) Prior Publication Data
US 2020/0219896 A1    Jul. 9, 2020

(51) Int. Cl.
*H01L 27/11582*    (2017.01)
*H01L 27/11565*    (2017.01)
(Continued)

(52) U.S. Cl.
CPC .. *H01L 27/11582* (2013.01); *H01L 21/32139* (2013.01); *H01L 21/76897* (2013.01);
(Continued)

(58) Field of Classification Search
CPC .................. H01L 24/72; H01L 25/071; H01L 2924/10254; H01L 2924/10272;
(Continued)

(56) References Cited

U.S. PATENT DOCUMENTS 9,799,670 B2    10/2017    Nishikawa et al.
9,805,805 B1    10/2017    Zhang et al.
(Continued)

FOREIGN PATENT DOCUMENTS

CN    109256392 A    1/2019

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
(Continued)

*Primary Examiner* — Zandra V Smith
*Assistant Examiner* — Andre C Stevenson
(74) *Attorney, Agent, or Firm* — The Marbury Law Group, PLLC

(57) ABSTRACT

An alternating stack of insulating layers and spacer material layers is formed over a source-level sacrificial layer overlying a substrate. The spacer material layers are formed as, or are subsequently replaced with, electrically conductive layers. Memory stack structures including a respective vertical semiconductor channel and a respective memory film are formed through the alternating stack. A source-level cavity is formed by removing the source-level sacrificial layer. Semiconductor pillar structures may be used to provide mechanical support to the alternating stack during formation of the source-level cavity. A source-level semiconductor material layer can be formed in the source-level cavity. The source-level semiconductor material layer adjoins bottom end portions of the vertical semiconductor channels and laterally surrounds the semiconductor pillar structures. The source-level semiconductor material layer may be electrically isolated from a substrate semiconductor material layer in the substrate by a series connection of two p-n junctions having opposite polarities.

20 Claims, 67 Drawing Sheets

(51) Int. Cl.
*H01L 21/768* (2006.01)
*H01L 21/3213* (2006.01)
*H01L 27/1157* (2017.01)
*H01L 21/28* (2006.01)

(52) U.S. Cl.
CPC .... *H01L 27/1157* (2013.01); *H01L 27/11565* (2013.01); *H01L 29/40117* (2019.08)

(58) Field of Classification Search
CPC ..... H01L 2924/1033; H01L 2924/1203; H01L 2924/13055
See application file for complete search history.

(56) References Cited

U.S. PATENT DOCUMENTS

| | | | |
|---|---|---|---|
| 9,824,966 | B1 | 11/2017 | Kanakamedala et al. |
| 9,831,266 | B2 | 11/2017 | Kai et al. |
| 9,917,100 | B2 | 3/2018 | Zhang et al. |
| 9,985,098 | B2 | 5/2018 | Matsumoto et al. |
| 10,008,570 | B2 | 6/2018 | Yu et al. |
| 10,020,363 | B2 | 7/2018 | Ogawa et al. |
| 2015/0255619 | A1 | 9/2015 | Shimabukuro |
| 2016/0172366 | A1* | 6/2016 | Koka ................ H01L 21/02356 257/314 |
| 2016/0233227 | A1 | 8/2016 | Zhang et al. |
| 2016/0351709 | A1 | 12/2016 | Nishikawa et al. |
| 2017/0117271 | A1 | 4/2017 | Lai et al. |
| 2017/0125436 | A1* | 5/2017 | Sharangpani ..... H01L 27/11582 |
| 2017/0148800 | A1 | 5/2017 | Nishikawa et al. |
| 2017/0148810 | A1 | 5/2017 | Kai et al. |
| 2017/0148811 | A1 | 5/2017 | Zhang et al. |
| 2017/0365612 | A1 | 12/2017 | Yun et al. |
| 2018/0122904 | A1 | 5/2018 | Matsumoto et al. |
| 2018/0122905 | A1 | 5/2018 | Ogawa et al. |
| 2018/0122906 | A1 | 5/2018 | Yu et al. |
| 2019/0312054 | A1 | 10/2019 | Yun et al. |
| 2019/0371807 | A1* | 12/2019 | Nishikawa ........ H01L 27/11519 |
| 2020/0020715 | A1* | 1/2020 | Nakamura ........ H01L 27/11519 |

OTHER PUBLICATIONS

U.S. Appl. No. 16/241,171, filed Jan. 7, 2019, SanDisk Technologies LLC.
USPTO Office Communication for U.S. Appl. No. 16/241,171, dated Apr. 1, 2020, 21 pages.
Notification of Transmittal of the International Search Report and Written Opinion of the International Search Authority for International Patent Application No. PCT/US2019/062286, dated Feb. 25, 2020, 10 pages.

* cited by examiner

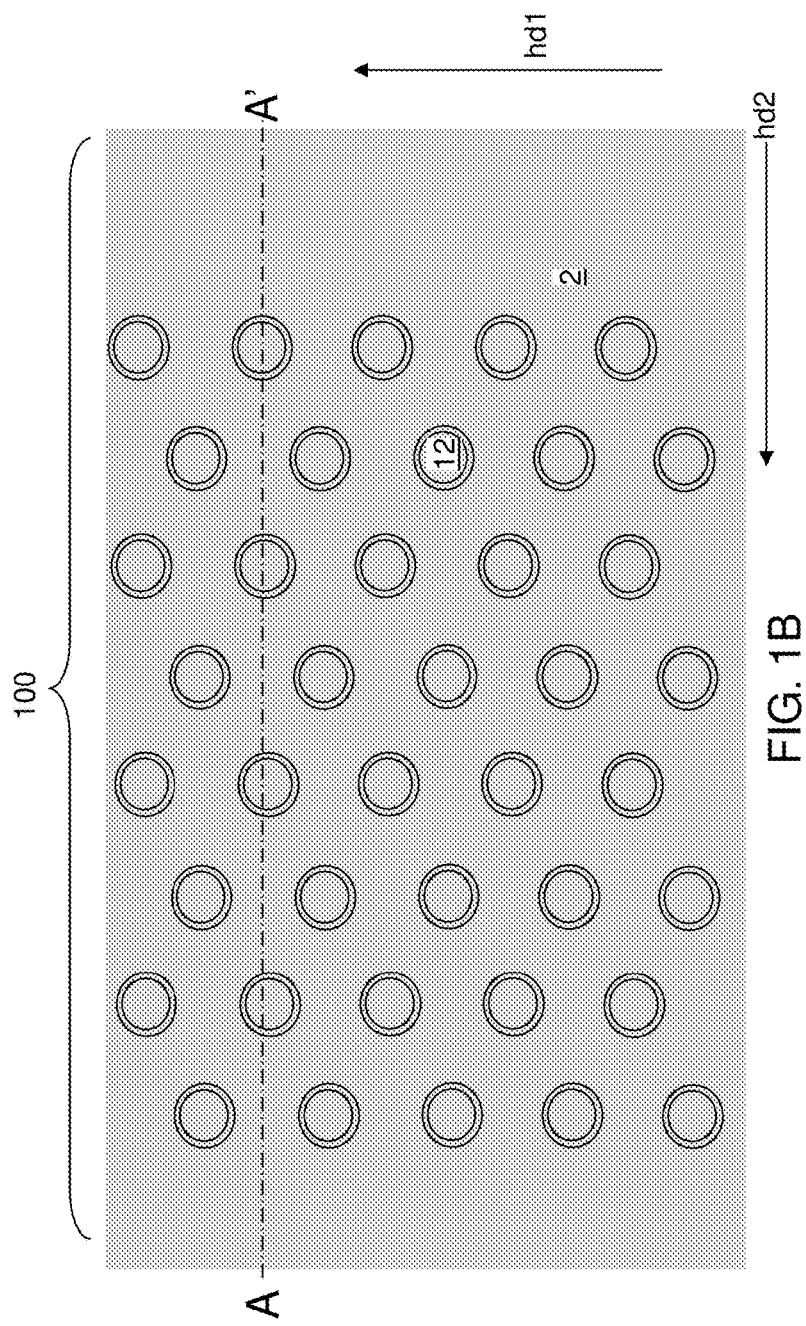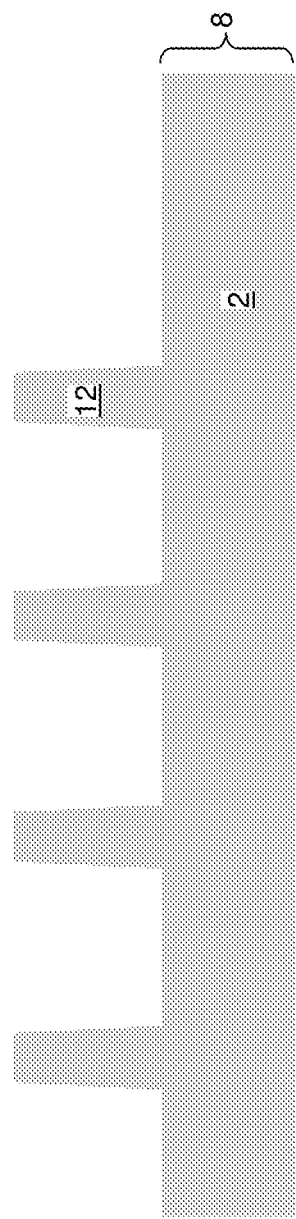

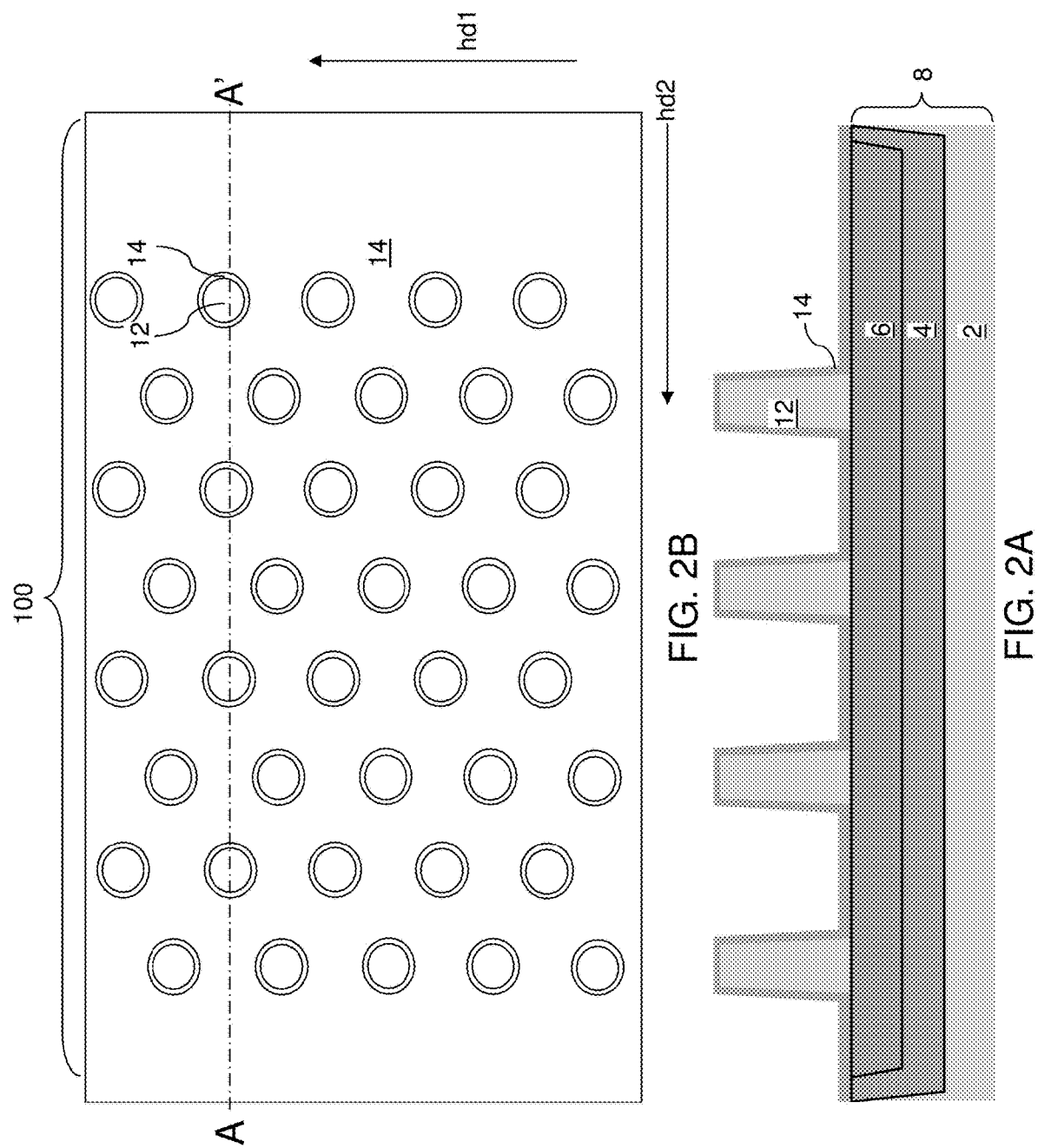

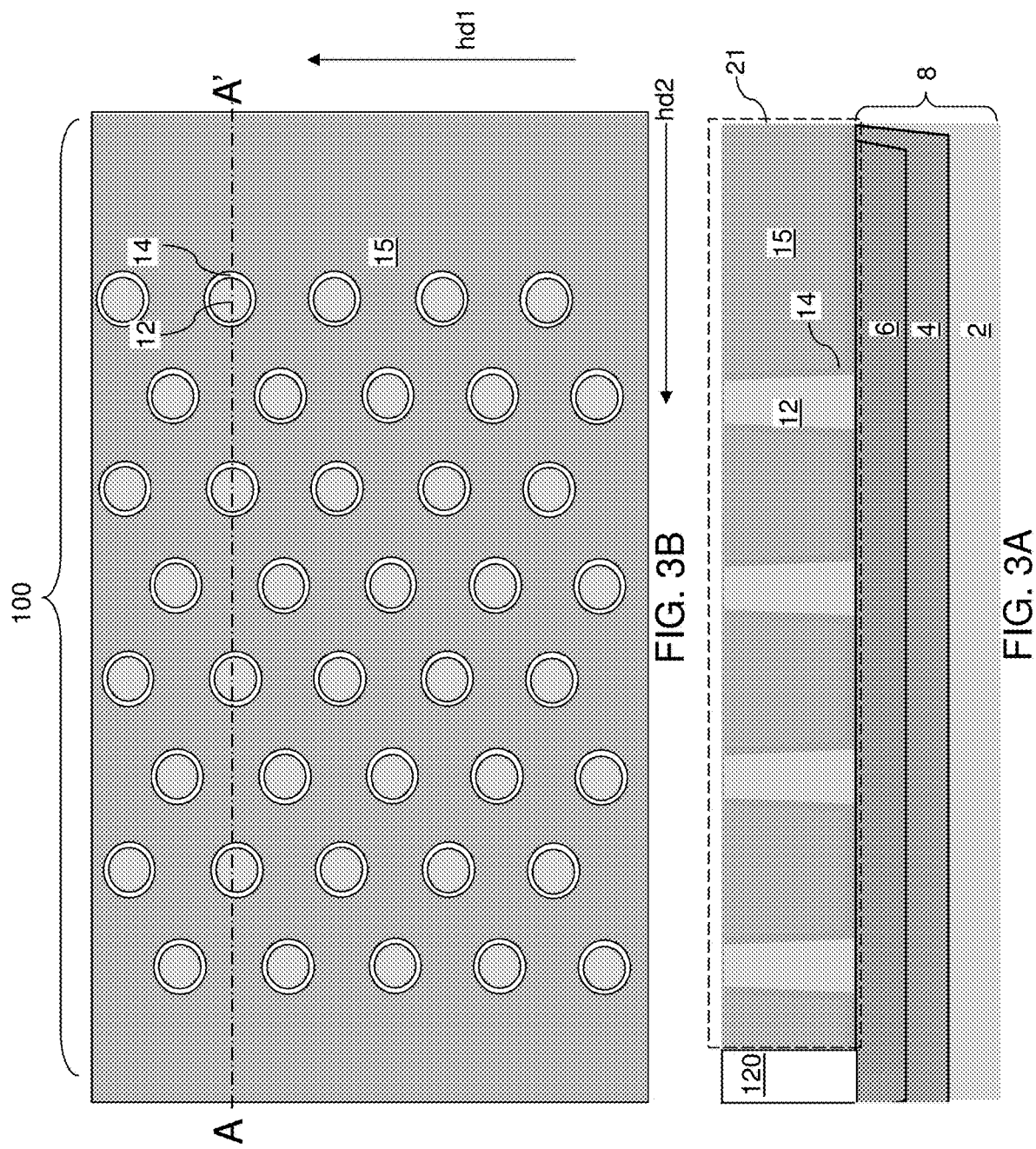

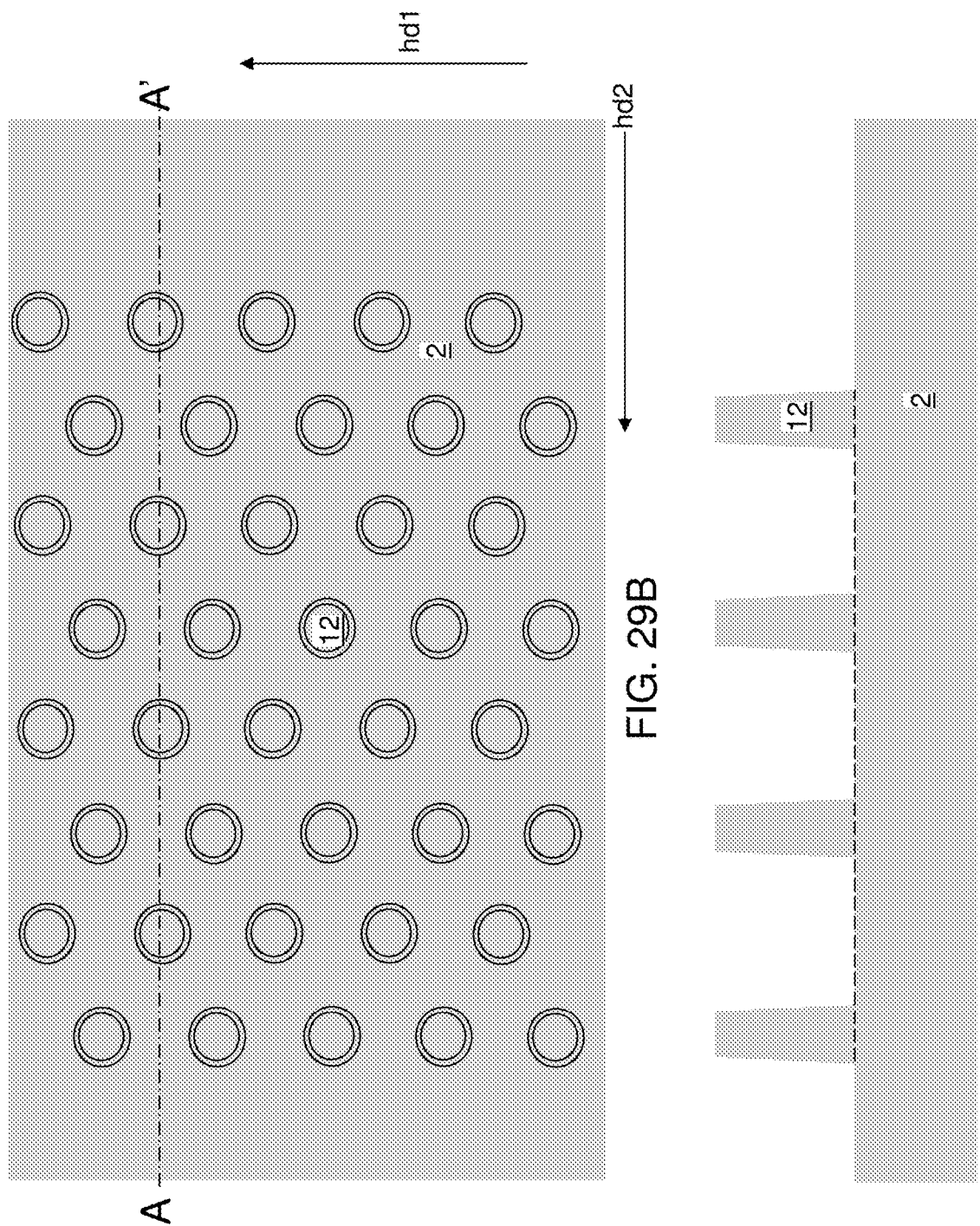

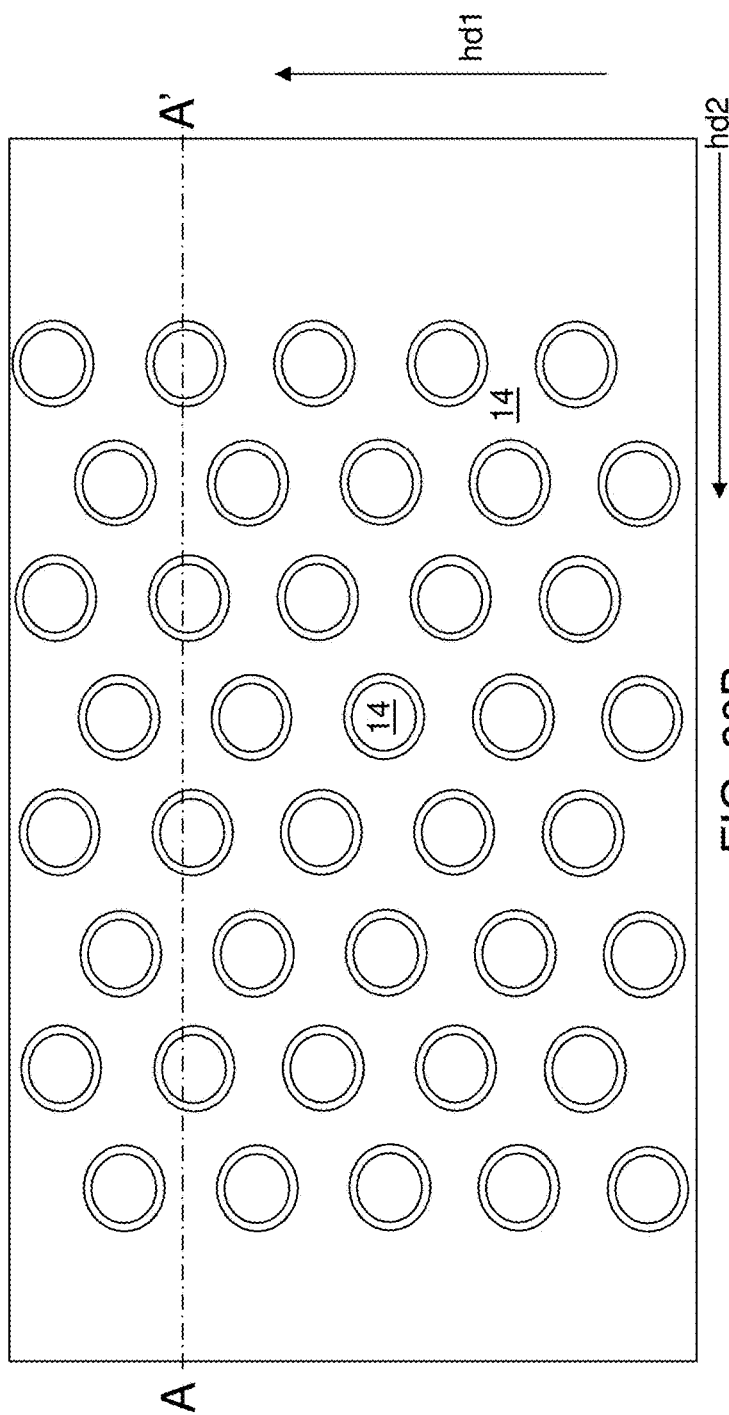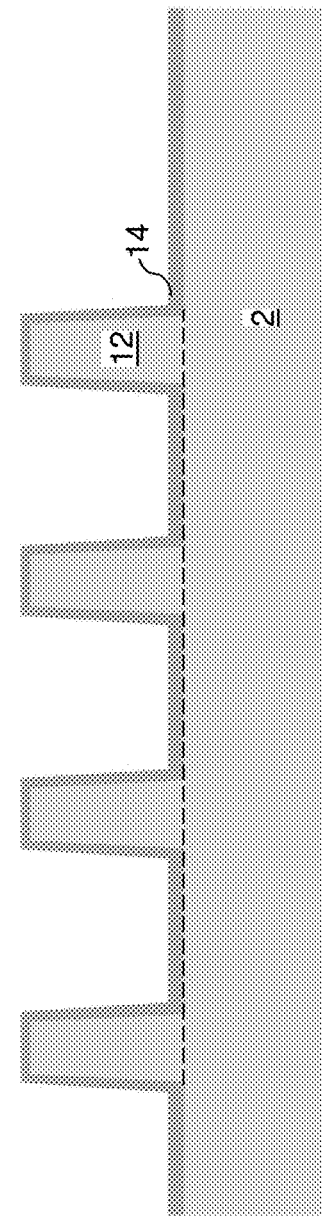
FIG. 30B
FIG. 30A

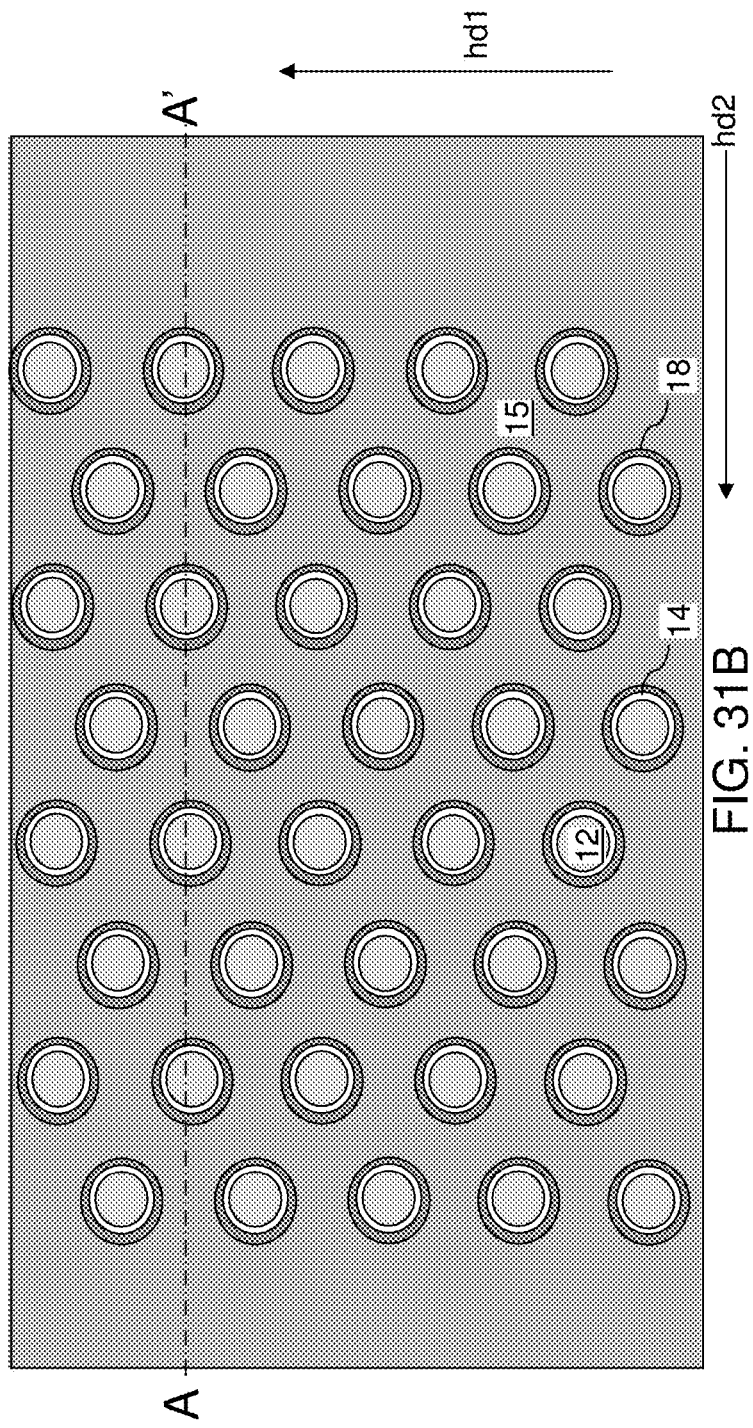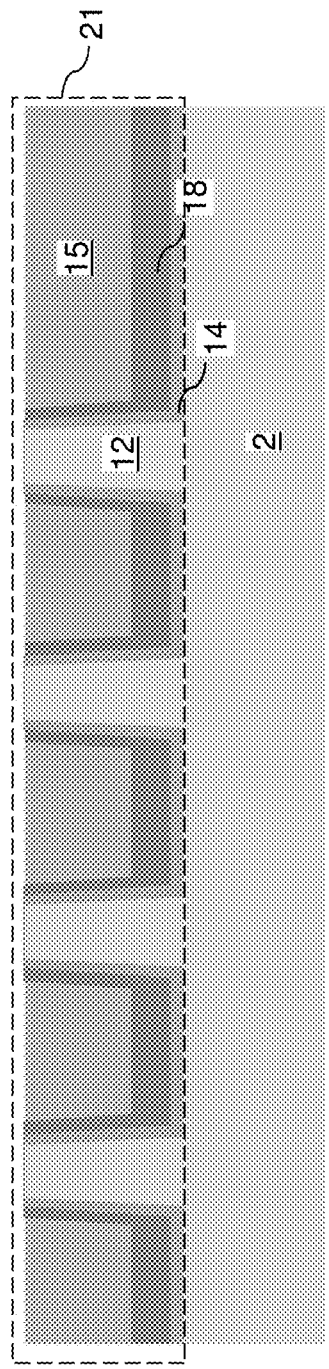
FIG. 31B
FIG. 31A

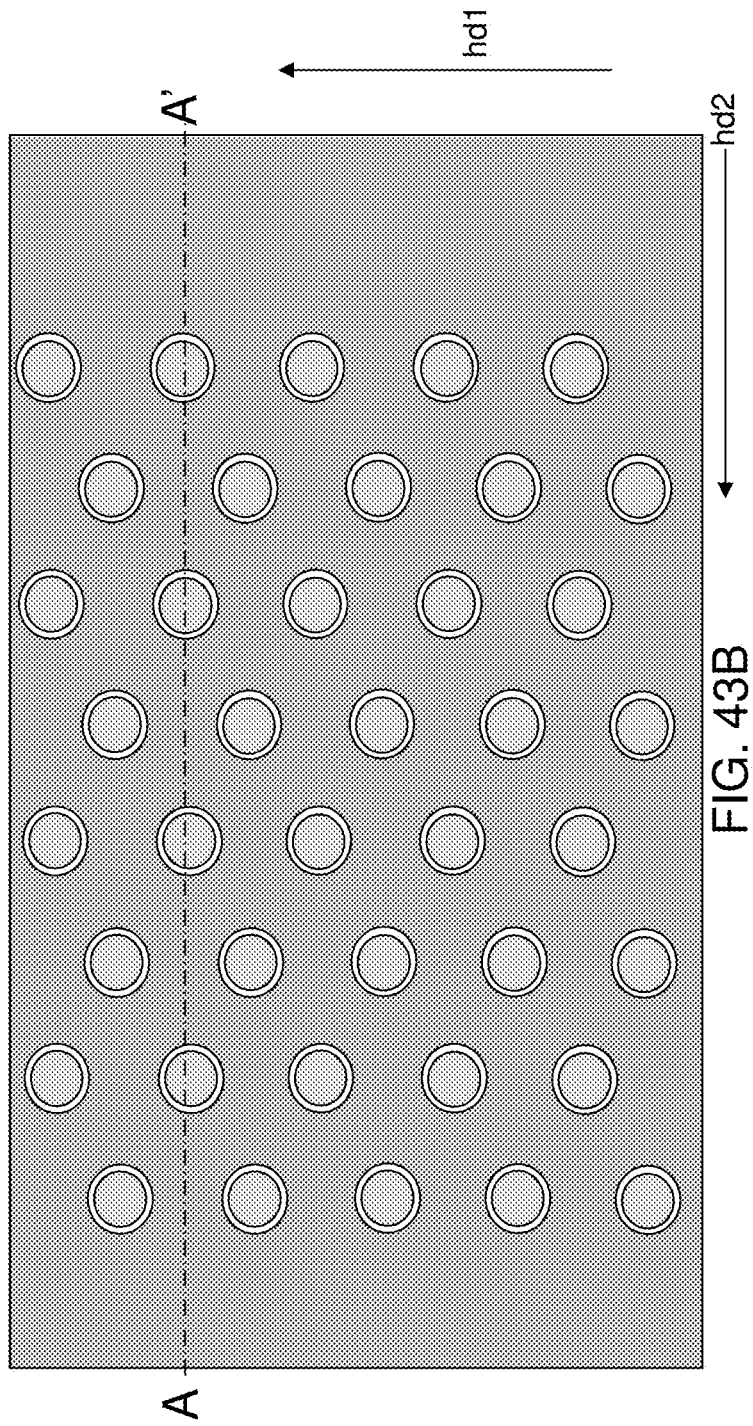
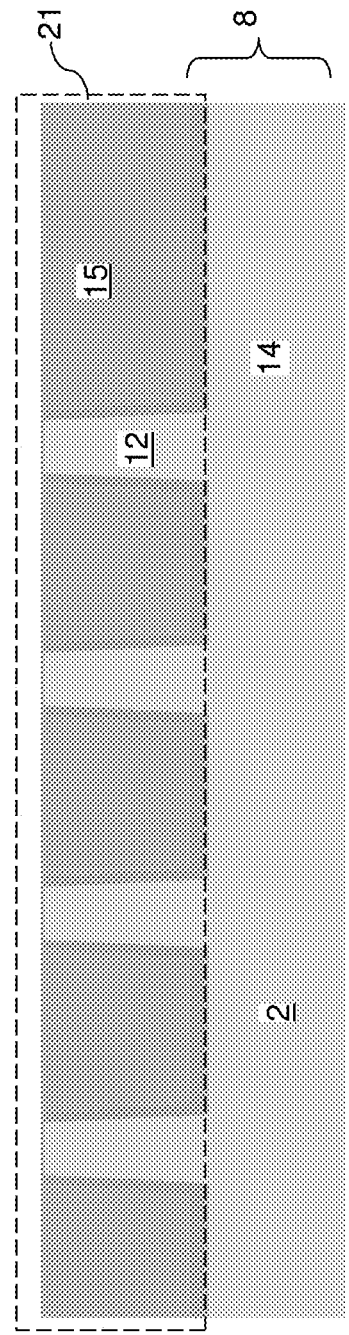
FIG. 43B
FIG. 43A

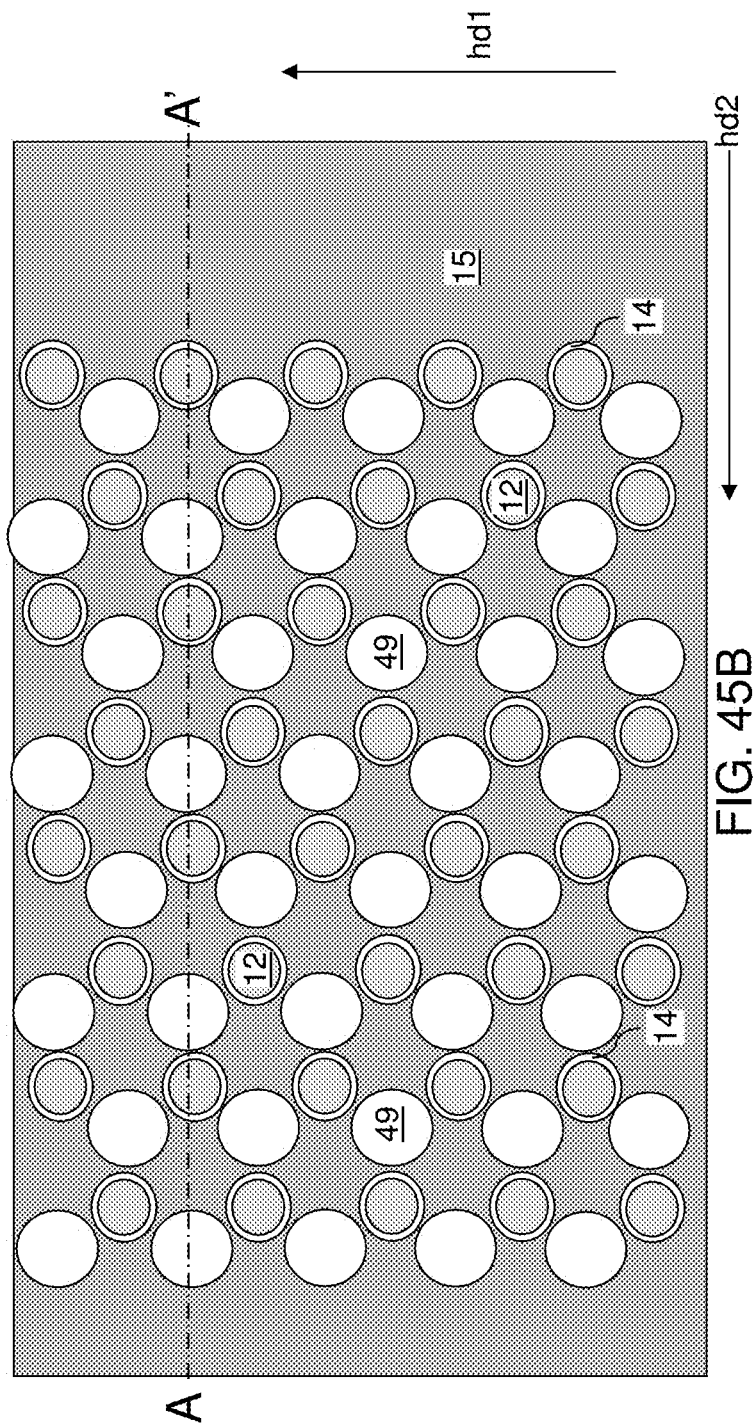

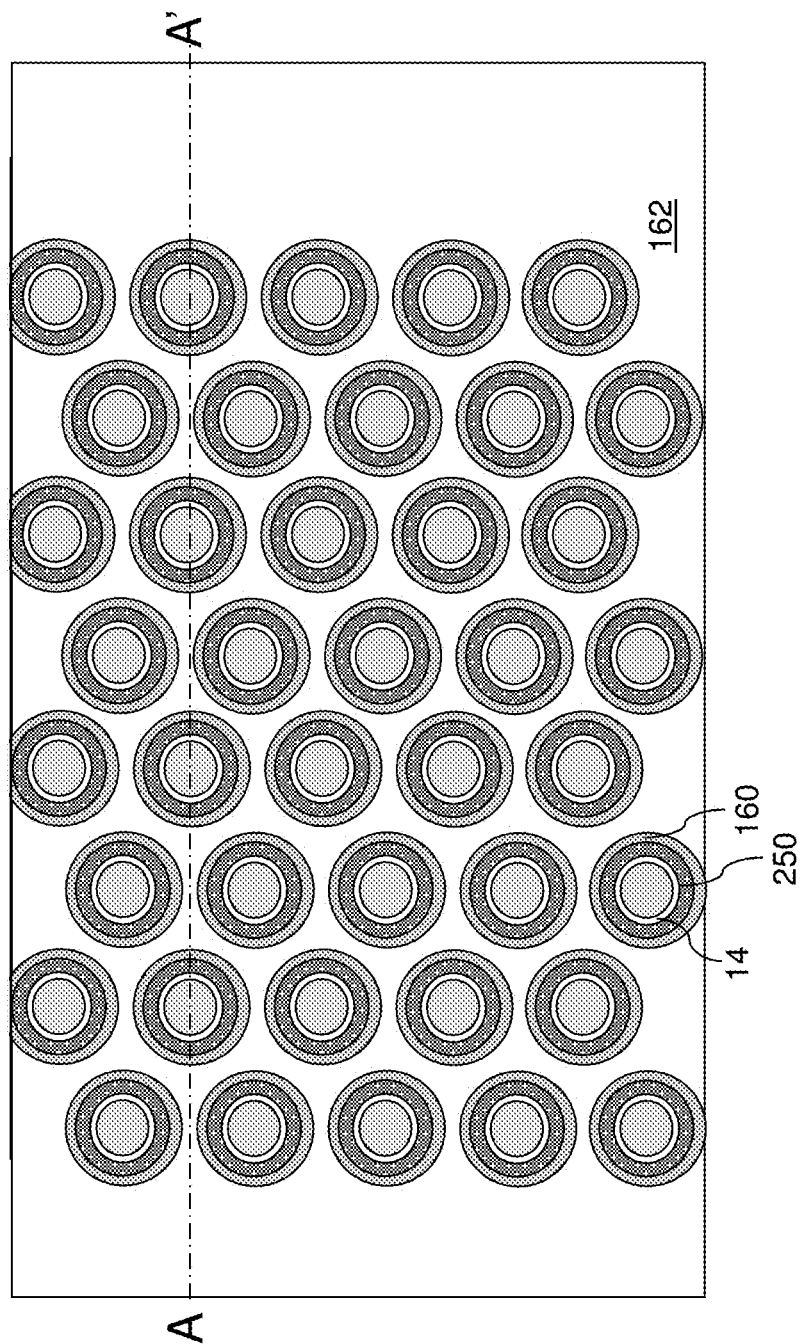

US 10,797,070 B2

THREE-DIMENSIONAL MEMORY DEVICE CONTAINING A REPLACEMENT BURIED SOURCE LINE AND METHODS OF MAKING THE SAME

FIELD

The present disclosure relates generally to the field of semiconductor devices, and particular to three-dimensional memory devices containing a replacement buried source layer and methods of manufacturing the same.

BACKGROUND

Three-dimensional memory devices including vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: semiconductor pillar structures adjoined to a top surface of a semiconductor material layer; an alternating stack of insulating layers and electrically conductive layers overlying the semiconductor pillar structures; memory stack structures vertically extending through the alternating stack, wherein each of the memory stack structures comprises a respective vertical semiconductor channel and a respective vertical stack of memory elements located at levels of the electrically conductive layers; and a source-level semiconductor material layer in contact with bottom end portions of the vertical semiconductor channels and laterally surrounding the semiconductor pillar structures.

According to another aspect of the present disclosure, a three-dimensional memory device is provided, which comprises: a substrate including a stack of a first conductivity type semiconductor layer having a doping of a first conductivity type and a second conductivity type semiconductor layer having a doping of a second conductivity type that is an opposite of the first conductivity type and providing a p-n junction at an interface with a bottom surface of the first conductivity type semiconductor layer; a source-level semiconductor material layer contacting a top surface of the first conductivity type semiconductor layer and having a doping of the first conductivity type; an alternating stack of insulating layers and electrically conductive layers overlying the semiconductor pillar structures; and memory stack structures vertically extending through the alternating stack, wherein each of the memory stack structures comprises a respective vertical semiconductor channel and a respective memory film.

According to yet another aspect of the present disclosure, a method of forming a three-dimensional memory device is provided, which comprises: forming semiconductor pillar structures protruding above a horizontal top surface of a semiconductor material layer located in a substrate; forming a source-level sacrificial layer around the semiconductor pillar structures; forming an alternating stack of insulating layers and spacer material layers over the source-level sacrificial layer and the semiconductor pillar structures, wherein the spacer material layers are formed as, or are subsequently replaced with, electrically conductive layers; forming memory stack structures including a respective vertical semiconductor channel and a respective memory film through the alternating stack; forming a source-level cavity by removing the source-level sacrificial layer while the semiconductor pillar structures provide mechanical support to the alternating stack; and forming a source-level semiconductor material layer within a volume of the source-level cavity, wherein the source-level semiconductor material layer adjoins bottom end portions of the vertical semiconductor channels and laterally surrounds the semiconductor pillar structures.

According to still another aspect of the present disclosure, a method of forming a three-dimensional memory device is provided, which comprises: forming a stack of a first conductivity type semiconductor layer having a doping of a first conductivity type and a second conductivity type semiconductor layer having a doping of a second conductivity type that is an opposite of the first conductivity type and providing a p-n junction at an interface with a bottom surface of the first conductivity type semiconductor layer in an upper portion of a substrate; forming a source-level sacrificial layer over the first conductivity type semiconductor layer; forming an alternating stack of insulating layers and spacer material layers over the source-level sacrificial layer and the semiconductor pillar structures, wherein the spacer material layers are formed as, or are subsequently replaced with, electrically conductive layers; forming memory stack structures including a respective vertical semiconductor channel and a respective memory film; forming a source-level cavity by removing the source-level sacrificial layer; and forming a source-level semiconductor material layer within a volume of the source-level cavity directly on the vertical semiconductor channels and a top surface of the first conductivity type semiconductor layer.

BRIEF DESCRIPTION OF THE DRAWINGS

FIG. 1A is a schematic vertical cross-sectional view of a first exemplary structure after formation of semiconductor pillar structures according to an embodiment of the present disclosure.

FIG. 1B is a top-down view of the first exemplary structure of FIG. 1A. The vertical plane A-A' is a plane of the vertical cross-sectional view of FIG. 1A.

FIG. 2A is a schematic vertical cross-sectional view of the first exemplary structure after formation of p-n junctions and a dielectric liner layer according to an embodiment of the present disclosure.

FIG. 2B is a top-down view of the first exemplary structure of FIG. 2A. The vertical plane A-A' is a plane of the vertical cross-sectional view of FIG. 2A.

FIG. 3A is a schematic vertical cross-sectional view of the first exemplary structure after formation of a source-level sacrificial layer according to an embodiment of the present disclosure.

FIG. 3B is a top-down view of the first exemplary structure of FIG. 3A. The vertical plane A-A' is a plane of the vertical cross-sectional view of FIG. 3A.

FIG. 29A is a schematic vertical cross-sectional view of a third exemplary structure after formation of semiconductor pillar structures according to an embodiment of the present disclosure.

FIG. 29B is a top-down view of the third exemplary structure of FIG. 29A. The vertical plane A-A' is a plane of the vertical cross-sectional view of FIG. 29A.

FIG. 30A is a schematic vertical cross-sectional view of the third exemplary structure after formation of a dielectric liner layer according to an embodiment of the present disclosure.

FIG. 30B is a top-down view of the third exemplary structure of FIG. 30A. The vertical plane A-A' is a plane of the vertical cross-sectional view of FIG. 30A.

FIG. 31A is a schematic vertical cross-sectional view of the third exemplary structure after formation of a source-level metallic layer and a source-level sacrificial layer according to an embodiment of the present disclosure.

FIG. 31B is a top-down view of the third exemplary structure of FIG. 31A. The vertical plane A-A' is a plane of the vertical cross-sectional view of FIG. 31A.

FIG. 43A is a schematic vertical cross-sectional view of the fourth exemplary structure after formation of a dielectric liner layer and a source-level sacrificial layer according to an embodiment of the present disclosure.

FIG. 43B is a top-down view of the fourth exemplary structure of FIG. 43A. The vertical plane A-A' is a plane of the vertical cross-sectional view of FIG. 43A.

FIG. 45B is a horizontal cross-sectional view of the fourth exemplary structure along the plane B-B' of FIG. 45A. The vertical plane A-A' is a plane of the vertical cross-sectional view of FIG. 45A.

FIG. 47B is a horizontal cross-sectional view of the fourth exemplary structure along the plane B-B' of FIG. 47A. The vertical plane A-A' is a plane of the vertical cross-sectional view of FIG. 47A.

DETAILED DESCRIPTION

Figure 4A:
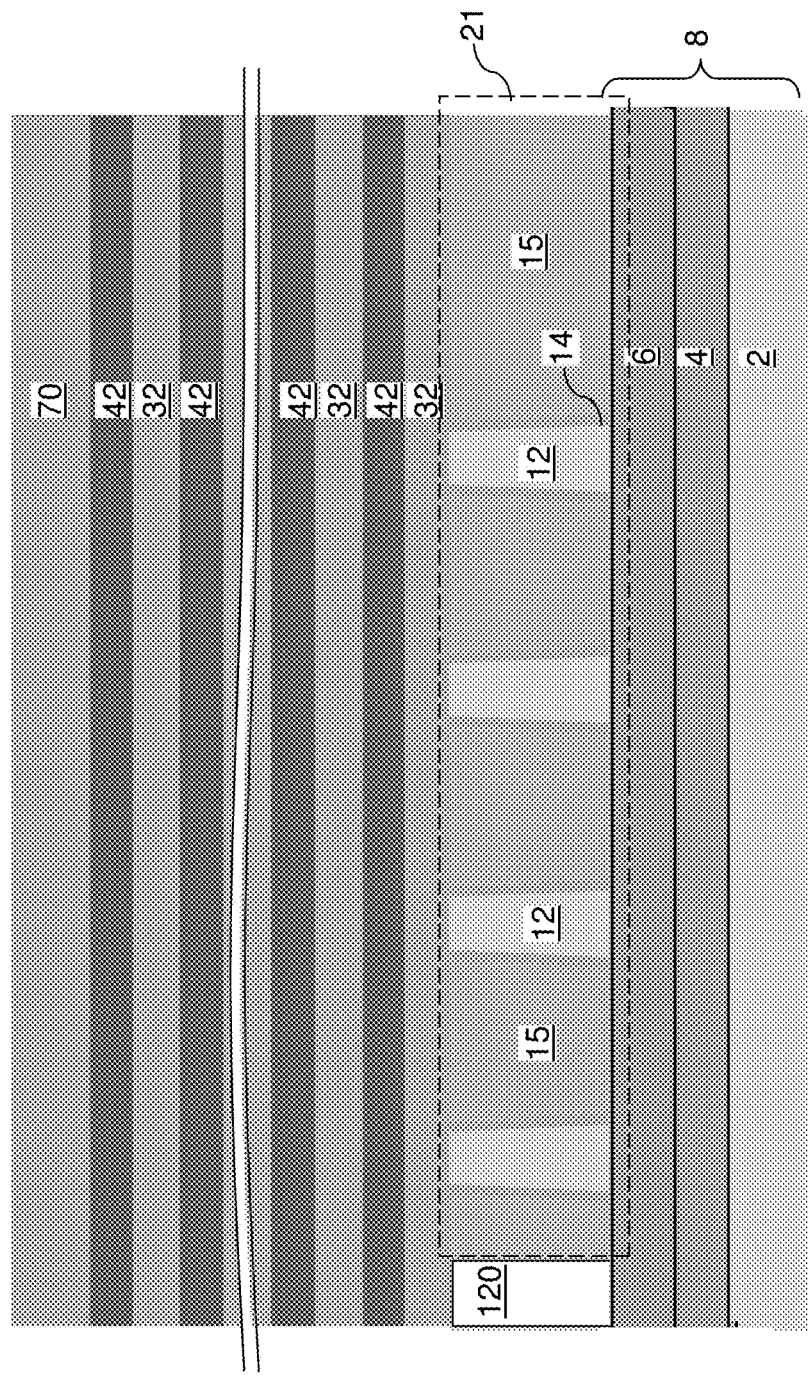
FIG. 4A is a schematic vertical cross-sectional view of the first exemplary structure after formation of an alternating stack of insulating layers and sacrificial material layers, stepped terraces, and a retro-stepped dielectric material portion according to an embodiment of the present disclosure.

Memory stack structures including a respective memory film and a respective vertical semiconductor channel are formed through an alternating stack of insulating layers and electrically conductive layers that function as word lines. Each vertical semiconductor channel is electrically connected to a common source region and a respective drain region. The electrical connection between the vertical semiconductor channels and the common source region are made through the memory films. Various embodiments of the disclosure provide inexpensive and efficient methods for providing the electrical connections between the vertical semiconductor channels and the common source region by using a replacement buried source layer, the various aspects of which are described below. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

Three-dimensional memory devices of various embodiments of the present disclosure include a monolithic three-dimensional NAND string memory device, and can be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming A page is also the smallest unit that can be selected to a read operation.

Referring to FIGS. 1A and 1B, a memory array region 100 of a first exemplary structure is illustrated, which includes an array of semiconductor pillar structures 12 formed over a top surface of a substrate semiconductor material layer 2. The array of semiconductor pillar structures 12 can be arranged as a two-dimensional periodic array that includes multiple rows of semiconductor pillar structures 12 that extend along a first horizontal direction hd1. Neighboring rows of semiconductor pillar structures 12 can be laterally spaced apart along a second horizontal direction hd2 that is perpendicular to the first horizontal direction hd1. In one embodiment, the two-dimensional periodic array of semiconductor pillar structures 12 can be arranged as a two-dimensional hexagonal periodic array.

In one embodiment, at least an upper portion (or the entirety of) the substrate semiconductor material layer 2 and the semiconductor pillar structures 12 can include a doped semiconductor material at a same material composition. For example, the substrate semiconductor material layer 2 and the semiconductor pillar structures 12 can include silicon, a silicon-germanium alloy, at least one III-V compound semiconductor material, at least one II-VI compound semiconductor material, or an organic semiconductor material. In one embodiment, the substrate semiconductor material layer 2 and the semiconductor pillar structures 12 can include a single crystalline semiconductor material. The substrate semiconductor material layer 2 and the semiconductor pillar structures 12 can include electrical dopants (p-type dopants or n-type dopants) at an atomic concentration in a range from $1.0 \times 10^{14}/cm^3$ to $1.0 \times 10^{18}/cm^3$, although lesser and greater atomic dopant concentrations can also be used. The type of doping in the substrate semiconductor material layer 2 and the semiconductor pillar structures 12 is herein referred to as a first conductivity type, which can be p-type or n-type.

The semiconductor pillar structures 12 can be formed, for example, by forming a patterned etch mask covering a periodic array of discrete circular (or elliptical) areas over an unpatterned semiconductor material layer (which may be provided as a semiconductor substrate such as a commercially available semiconductor wafer), and by anisotropically etching physically exposed areas of the unpatterned semiconductor material layer. Physically exposed surfaces of the unpatterned semiconductor material layer are vertically recessed to provide a top surface of the substrate semiconductor material layer 2, which is adjoined to the bottom periphery of each semiconductor pillar structure 12. Each semiconductor pillar structure 12 can have the shape of a cylinder having a circular or elliptical horizontal cross-sectional shape, or may have the shape of a frustum. Each semiconductor pillar structure 12 can have a planar horizontal top surface, and a sidewall surface having a closed top edge and a closed bottom edge. As used herein, a "closed" shape refers to a shape that divides a two-dimensional plane into an inner area and an outer area. The height of the semiconductor pillar structures 12 can be in a range from 30 nm to 600 nm, although lesser and greater heights can also be used. The maximum lateral dimension of the base of each semiconductor pillar structure 12 can be in a range from 20 nm to 300 nm, although lesser and greater maximum lateral dimensions can also be used. The semiconductor pillar structures 12 protruding above a horizontal top surface of the substrate semiconductor material layer 2 located in a substrate 8, which may consist of the substrate semiconductor material layer 2 or include one or more additional material layers underneath the substrate semiconductor material layer 2.

Referring to FIGS. 2A and 2B, a series connection of two p-n junctions is formed by a series of ion implantation processes. In one embodiment, a stack of a first conductivity type semiconductor layer 6 having a doping of the first conductivity type and a second conductivity type semiconductor layer 4 having a doping of a second conductivity type that is an opposite of the first conductivity type can be formed in an upper portion of the substrate 8 underneath the array of semiconductor pillar structures 12. For example, dopants of the second conductivity type can be implanted into an upper portion of the substrate semiconductor material layer 2 to convert the implanted portion of the substrate semiconductor material layer 2 into the second conductivity type semiconductor layer 4. The dose of the second conductivity type dopants is selected such that the net doping in the implanted region is of the second conductivity type. In addition, dopants of the first conductivity type may be implanted into an upper portion of the second conductivity type semiconductor layer 4 such that the net doping in the implanted region is of the first conductivity type. The region having a net doping of the first conductivity type constitutes the first conductivity type semiconductor layer 6. The first conductivity type semiconductor layer 6 can be included in the second conductivity type semiconductor layer 4, and can be vertically spaced from unimplanted portion of the second conductivity type semiconductor layer 4.

A first a p-n junction is provided at an interface between a bottom surface of the first conductivity type semiconductor layer 6 and a top surface of the second conductivity type semiconductor layer 4 in an upper portion of a substrate 8. A second p-n junction is provided at an interface between a bottom surface of the second conductivity type semiconductor layer 4 and a top surface of the remaining portion of the substrate semiconductor material layer 2. The net atomic concentration of dopants in the second conductivity type semiconductor layer 4 is the atomic concentration of second conductivity type dopants less the atomic concentration of the first conductivity type dopants in the second conductivity type semiconductor layer 4, and can be in a range from $1.0 \times 10^{14}/cm^3$ to $1.0 \times 10^{18}/cm^3$. The net atomic concentration of dopants in the first conductivity type semiconductor layer 6 is the atomic concentration of first conductivity type dopants less the atomic concentration of the second conductivity type dopants in the first conductivity type semiconductor layer 6, and can be in a range from $1.0 \times 10^{14}/cm^3$ to $1.0 \times 10^{18}/cm^3$. The semiconductor pillar structures 12 are adjoined to, and have a same doping type and a same dopant concentration as, the first conductivity type semiconductor layer 6.

A dielectric liner layer 14 is formed on a top surface of the first conductivity type semiconductor layer 6 and physically exposed surfaces of the semiconductor pillar structures 12. The dielectric liner layer 14 may be a semiconductor oxide layer that is formed by oxidation of physically exposed surface portions of the substrate 8 and the semiconductor pillar structures 12. For example, the substrate 8 and the semiconductor pillar structures 12 can include single crystalline silicon, and the dielectric liner layer 14 can include a thermal silicon oxide layer having a thickness in a range from 6 nm to 60 nm, although lesser and greater thicknesses can also be used. Alternatively, the dielectric liner layer 14 may be formed by deposition of a dielectric material. For example, the dielectric liner layer 14 may include densified TEOS oxide (i.e., silicon oxide formed by thermal decomposition of TEOS and subsequent densification), a dielectric metal oxide (such as aluminum oxide), silicon nitride, silicon oxynitride, or a combination thereof.

Referring to FIGS. 3A and 3B, dielectric isolation structures 120 may be optionally formed, for example, by deposition and patterning of a dielectric material such as silicon oxide. In one embodiment, the dielectric isolation structures 120 may be formed around each memory array region 100, i.e., around clusters of semiconductor pillar structures 12. In one embodiment, areas in which the p-n junctions extend to a top surface of the substrate 8 can be covered with the dielectric isolation structures 120. The dielectric isolation structures 120 provide electrical isolation between structures formed in the memory array region 100 and portions of the substrate semiconductor material layer 2 that protrude to the height of the top surfaces of the semiconductor pillar structures 12 outside of the memory array region 100.

A source-level sacrificial layer 15 can be deposited over the dielectric liner layer 14. The source-level sacrificial layer 15 includes a sacrificial material that can be removed selective to the material of the dielectric liner layer 14. For example, the source-level sacrificial layer 15 can include amorphous silicon, an amorphous silicon-germanium alloy, a carbon-based material such as amorphous carbon, or an organic polymer. Excess portions of the source-level sacrificial layer 15 can be removed from above the horizontal plane including top surfaces of the semiconductor pillar structures 12 by a chemical mechanical planarization (CMP) process. Portions of the dielectric liner layer 14 that overlie the horizontal plane including the top surfaces of the semiconductor pillar structures 12 can be collaterally removed during the CMP process. Top surfaces of the semiconductor pillar structures 12 are physically exposed after the CMP process. The source-level sacrificial layer 15 has a planar top surface that is coplanar with the top surfaces of the semiconductor pillar structures 12. The semiconductor pillar structures 12, the dielectric liner layer 14, and the source-level sacrificial layer 15 are collectively referred to as a pillar-level assembly 21.

Figure 4B:
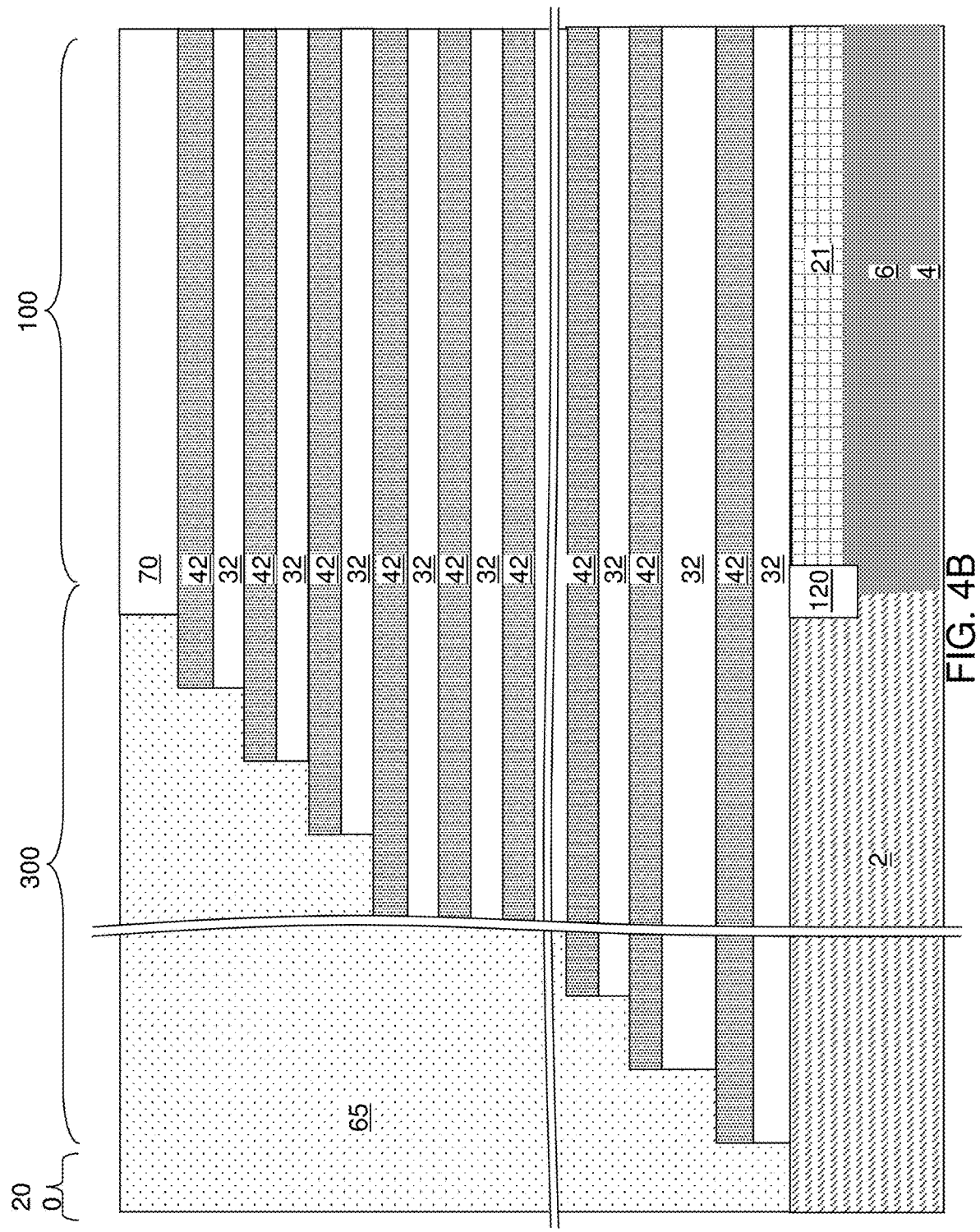
FIG. 4B is another schematic vertical cross-sectional view of the first exemplary structure of FIG. 4A.
Figure 4C:
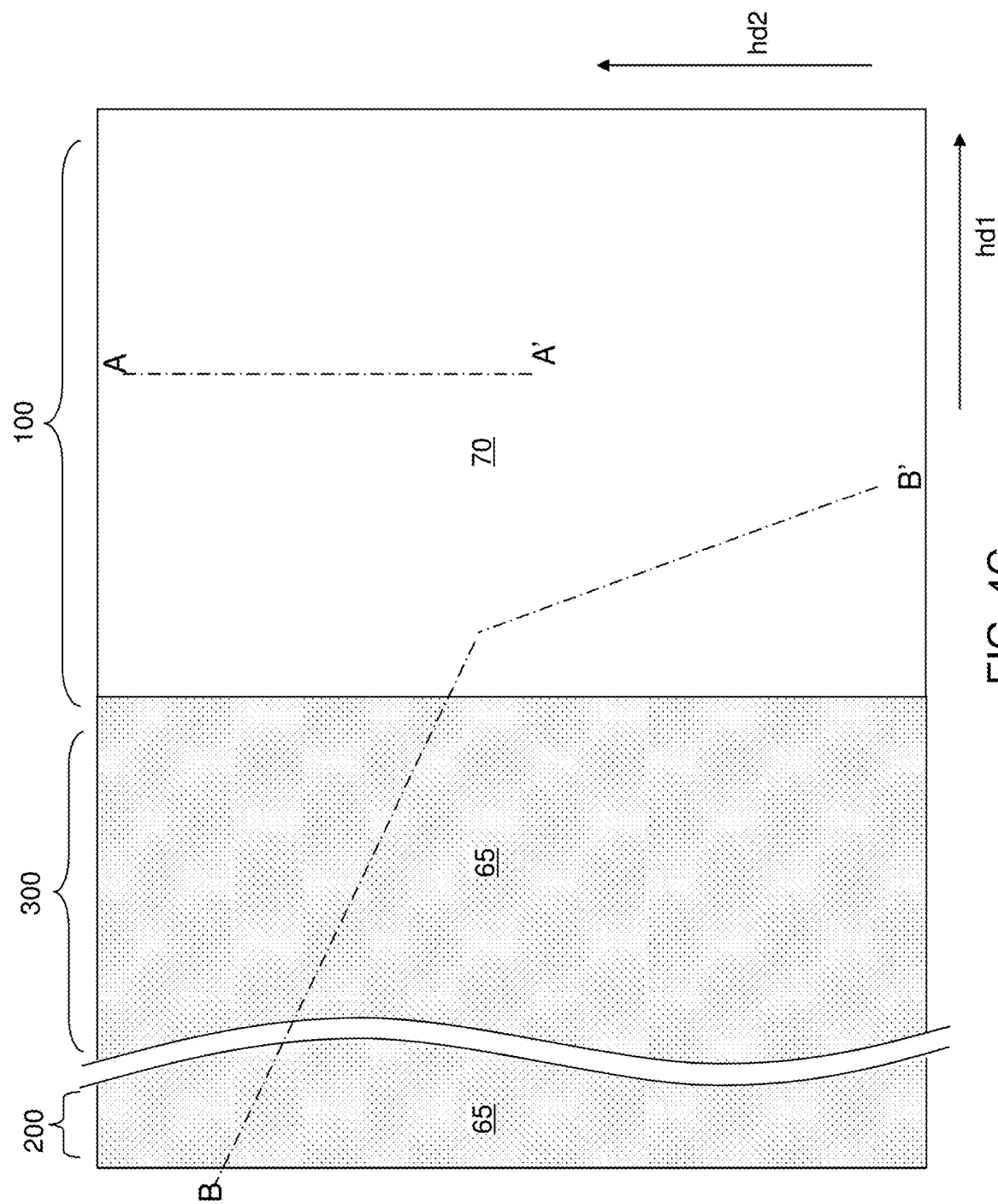
FIG. 4C is a top-down view of the first exemplary structure of FIGS. 4A and 4B. The vertical plane A-A' is a plane of the vertical cross-sectional view of FIG. 4A. The vertical plane B-B' is a plane of the vertical cross-sectional view of FIG. 4B.

Referring to FIGS. 4A-4C, a stack of an alternating plurality of first material layers (which can be insulating layers 32) and second material layers (which can be sacrificial material layer 42) is formed over the pillar-level assembly 21. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. In one embodiment, an instance of the first elements and an instance of the second elements may form a unit that is repeated with periodicity within the alternating plurality. Each first material layer includes a first material, and each second material layer includes a second material that is different from the first material. As such, the second material layers are spacer material layers that provide vertical spacing between vertically neighboring pairs of insulating layers 32. In one embodiment, each first material layer can be an insulating layer 32, and each second material layer can be a sacrificial material layer 42.

The stack of the alternating plurality of insulating layers 32 and spacer material layers (which can be sacrificial material layers 42) is herein referred to as an alternating stack (32, 42). In one embodiment, the alternating stack (32, 42) can include insulating layers 32 composed of the first material, and sacrificial material layers 42 composed of a second material different from that of insulating layers 32. The alternating stack (32, 42) is formed over the source-level sacrificial layer 15 and the semiconductor pillar structures 12. The spacer material layers may be formed as electrically conductive layers, or may be formed as sacrificial material layers 42 that are subsequently replaced with electrically conductive layers. A bottommost insulating layer 32 within the alternating stack (32, 42) can be formed directly on top surfaces of the semiconductor pillar structures 12 and directly on a top surface of the source-level sacrificial layer 15.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In one embodiment, the insulating layers 32 can include silicon oxide, and sacrificial material layers 42 can include silicon nitride layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in a staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircases can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Referring to FIGS. 5A-5D, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings and support openings. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings are formed through the insulating cap layer 70 and the entirety of the alternating stack (32, 42) in the memory array region 100. The support openings are formed through the retro-stepped dielectric material portion 65 and the portion of the alternating stack (32, 42) that underlie the stepped surfaces in the staircase region 300.

The memory openings extend through the entirety of the alternating stack (32, 42). The support openings extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings and the support openings can be substantially vertical, or can be tapered. The patterned lithographic material stack can be subsequently removed, for example, by ashing.

The memory openings can vertically extend from the top surface of the insulating cap layer 70 to at least the horizontal plane including the topmost surface of the source-level sacrificial layer 15. The support openings can vertically extend from the top surface of the retro-stepped dielectric material portion 65 to a top surface of a raised portion of the substrate semiconductor material layer 2. In one embodiment, an overetch into the source-level sacrificial layer 15 is performed after the top surface of the source-level sacrificial layer 15 is physically exposed at a bottom of each memory openings. The recessed surfaces of the source-level sacrificial layer 15 may be vertically offset from the un-recessed top surfaces of the source-level sacrificial layer 15 by a recess depth. The recess depth can be, for example, in a range from 20 nm to 400 nm, although lesser and greater recess depths can also be used. The lithographic material stack can be subsequently removed, for example, by ashing.

Each of the memory openings and the support openings may include a sidewall (or a plurality of sidewalls) that extends substantially perpendicular to the topmost surface of the substrate 8. A two-dimensional array of memory openings can be formed in the memory array region 100. A two-dimensional array of support openings can be formed in the staircase region 300. Each memory opening extends through the insulating cap layer 70, the alternating stack (32, 42), and into an upper portion of the source-level sacrificial layer 15. At this processing step, each support openings can extend through the retro-stepped dielectric material portion 65, a subset of layers in the alternating stack (32, 42), and optionally into the upper portion of the substrate semiconductor material layer 2 in the staircase region 300.

A memory film 50 can be formed within each memory opening and each support opening. Each memory film 50 can include a stack of layers including an optional blocking dielectric layer 52, a charge storage layer 54, and a tunneling dielectric layer 56. The blocking dielectric layer 52 can include a single dielectric material layer or a stack of a plurality of dielectric material layers. In one embodiment, the blocking dielectric layer 52 can include a dielectric metal oxide layer consisting essentially of a dielectric metal oxide. The thickness of the blocking dielectric layer 52 can be in a range from 6 nm to 30 nm, although lesser and greater thicknesses can also be used. The charge storage layer 54 includes a charge trapping material. The charge storage layer 54 can be a continuous layer or patterned discrete portions of a charge trapping material including a dielectric charge trapping material, which can be, for example, silicon nitride. The thickness of the charge storage layer 54 can be in a range from 6 nm to 30 nm, although lesser and greater thicknesses can also be used. The tunneling dielectric layer 56 includes at least one dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer 561, a silicon oxynitride layer 562, and a second silicon oxide layer 563, which is commonly known as an ONO stack. The thickness of the tunneling dielectric layer 56 can be in a range from 2 nm to 15 nm, although lesser and greater thicknesses can also be used.

A vertical semiconductor channel 60 can be formed in each memory opening and in each support opening on a respective one of the memory films 50. The vertical semiconductor channel 60 includes a semiconductor material having a doping of the first conductivity type. The vertical semiconductor channel 60 can include at least one elemental semiconductor material, at least one III-V compound semiconductor material, at least one II-VI compound semiconductor material, at least one organic semiconductor material, or other semiconductor materials known in the art. The thickness of each vertical semiconductor channel 60 can be in a range from 2 nm to 10 nm, although lesser and greater thicknesses can also be used.

A dielectric material can be deposited in unfilled volumes of the memory openings and support openings. Excess portions of the dielectric material overlying the insulating cap layer 70 can be removed, for example, by a recess etch. Remaining portions of the dielectric material can be recessed below the top surface of the insulating cap layer 70. Each remaining portion of the dielectric material in the memory openings and support openings constitutes a dielectric core 62.

Drain regions 63 can be formed by depositing a doped semiconductor material having a doping of the second conductivity type within each recessed region above the dielectric cores 62. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon.

Each combination of a memory film 50 and a vertical semiconductor channel 60 within a memory opening constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening is herein referred to as a memory opening fill structure 58. Each combination of a memory film 50, a vertical semiconductor channel 60, a dielectric core 62, and a drain region 63 within each support openings fills the respective support openings, and constitutes a support pillar structure 20.

Figure 6A:
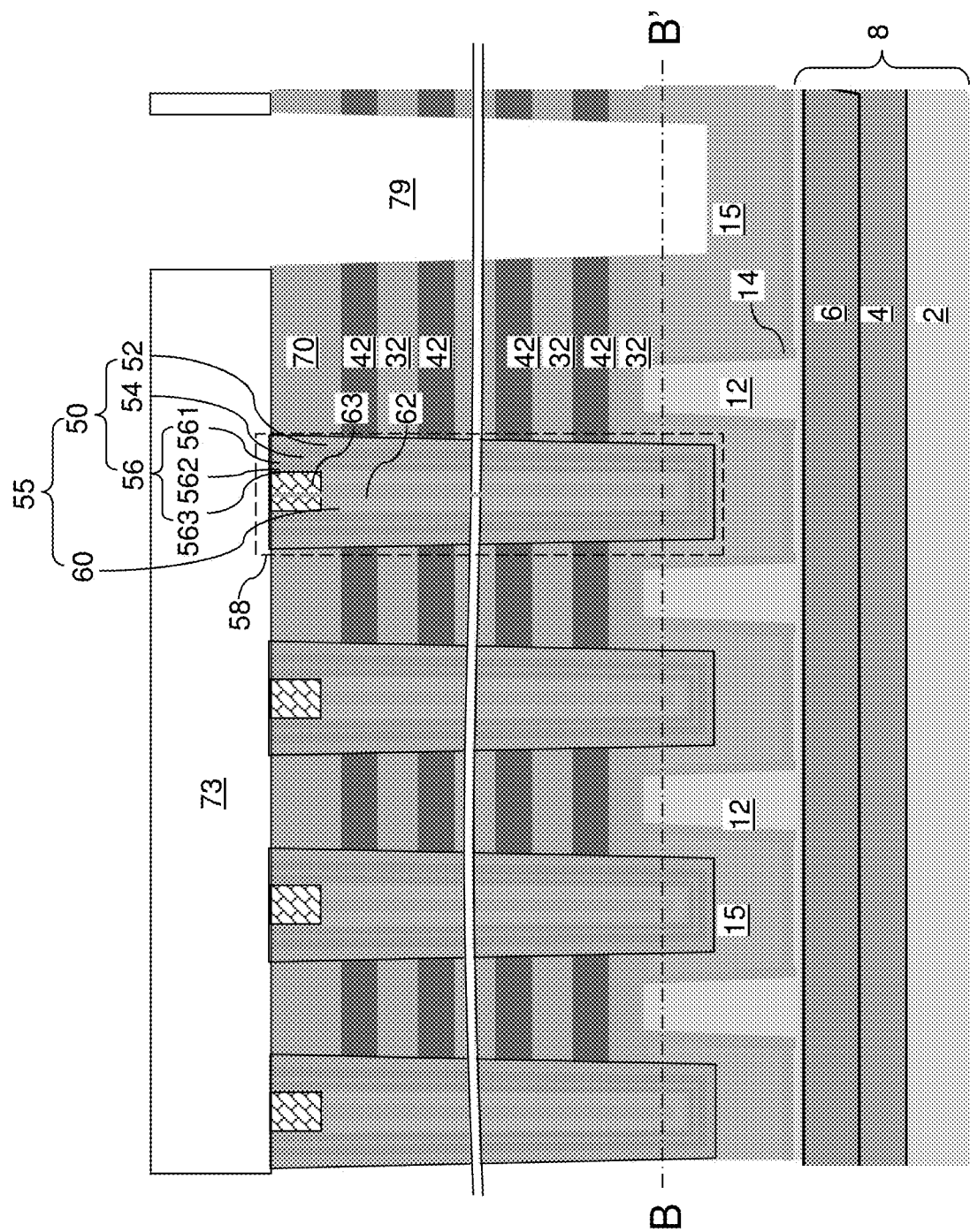
FIG. 6A is a schematic vertical cross-sectional view of the first exemplary structure after formation of a contact level dielectric layer and backside trenches according to an embodiment of the present disclosure.
Figure 6B:
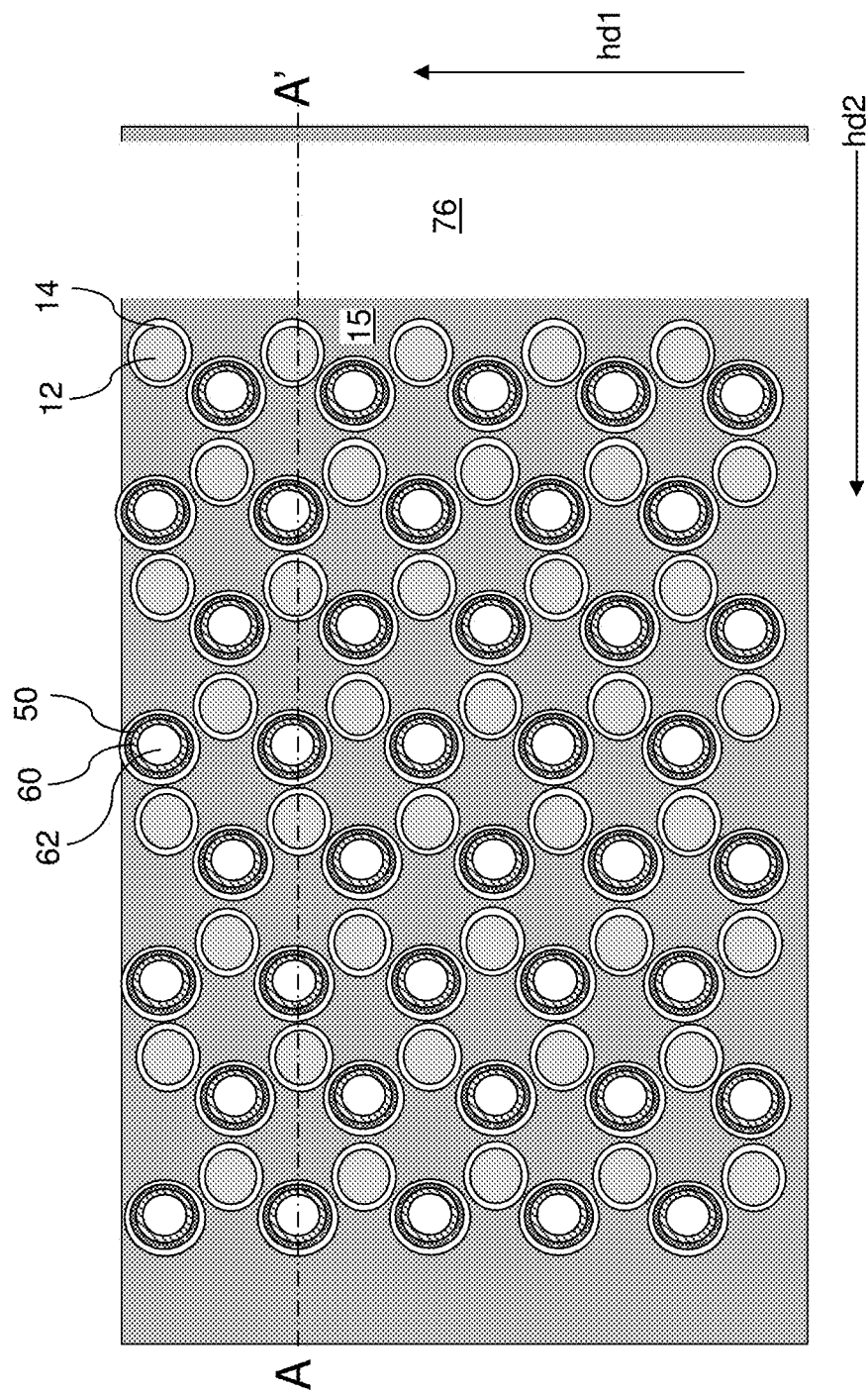
FIG. 6B is a horizontal cross-sectional view of the first exemplary structure along the horizontal plane B-B' of FIG. 6A.
Figure 6C:
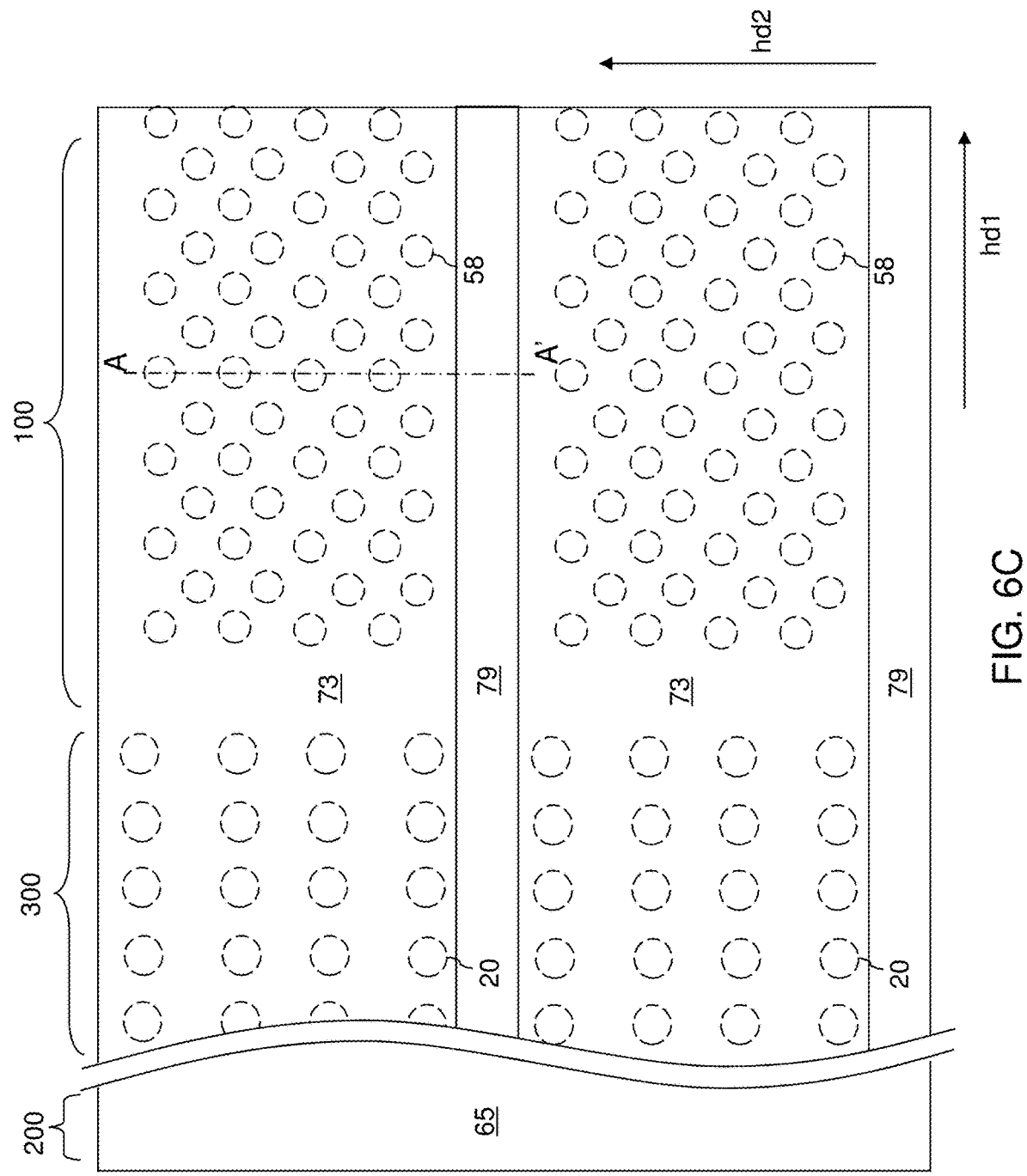
FIG. 6C is a top-down view of the first exemplary structure of FIGS. 6A and 6B. The vertical plane A-A' is a plane of the vertical cross-sectional view of FIG. 6A.

Referring to FIGS. 6A-6C, a contact level dielectric layer 73 can be formed over the insulating cap layer 70. The contact level dielectric layer 73 includes a dielectric material such as silicon oxide. The thickness of the contact level dielectric layer 73 can be in a range from 100 nm to 600 nm, although lesser and greater thicknesses can also be used.

A photoresist layer (not shown) can be applied over the contact level dielectric layer 73, and is lithographically patterned to form line-shaped openings in areas between clusters of memory stack structures 55. The pattern in the photoresist layer can be transferred through the contact level dielectric layer 73, the insulating cap layer 70, the alternating stack (32, 42) and/or the retro-stepped dielectric material portion 65 using an anisotropic etch process to form backside trenches 79. The anisotropic etch process etches through unmasked portions of the contact level dielectric layer 73, the insulating cap layer 70, the alternating stack (32, 42), and the retro-stepped dielectric material portion 65 to form the backside trenches 79. The backside trenches 79 vertically extend from the top surface of the contact level dielectric layer 73 and at least to the top surface of the source-level sacrificial layer 15, and laterally extend through the memory array region 100 and the staircase region 300. In one embodiment, the backside trenches 79 can laterally extend along the first horizontal direction hd1. The photoresist layer can be removed, for example, by ashing. Each backside trench 79 can have a uniform width that is invariant along the lengthwise direction (i.e., along the first horizontal direction hd1). The material of the source-level sacrificial layer 15 is physically exposed at the bottom of each backside trench 79.

Figure 7A:
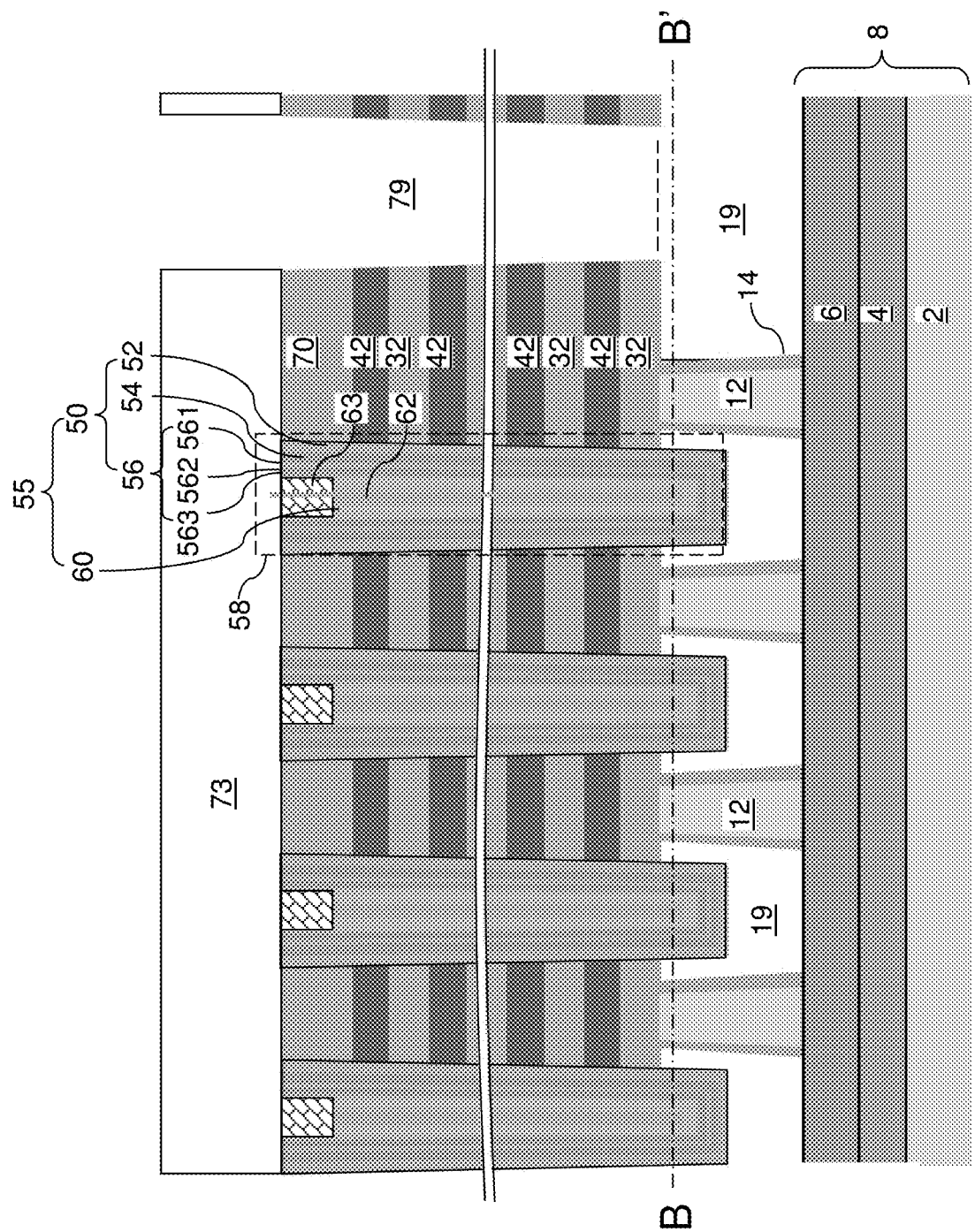
FIG. 7A is a schematic vertical cross-sectional view of the first exemplary structure after formation of a source-level cavity according to an embodiment of the present disclosure.
Figure 7B:
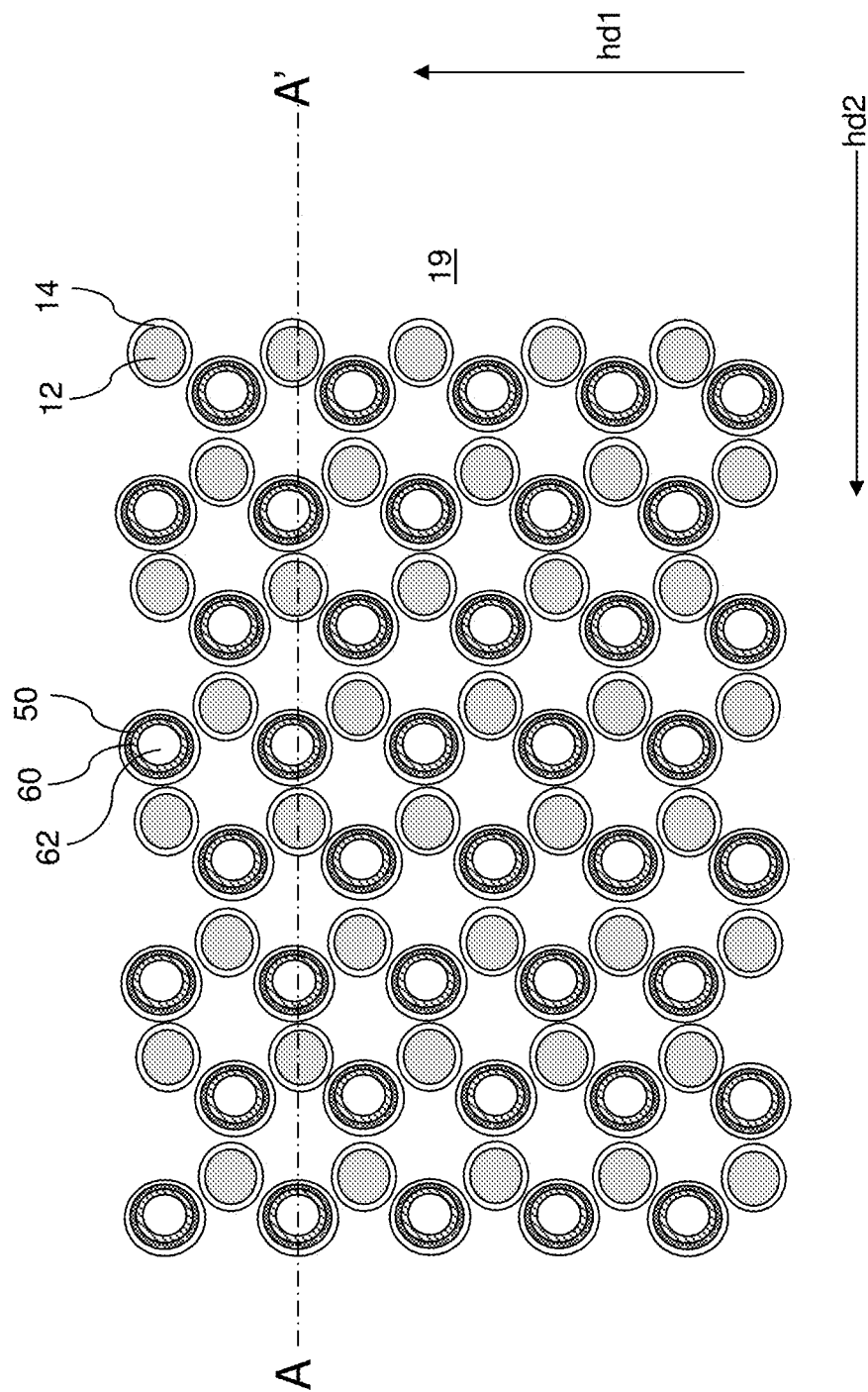
FIG. 7B is a horizontal cross-sectional view of the first exemplary structure along the horizontal plane B-B' of FIG. 7A.

Referring to FIGS. 7A and 7B, an etchant that etches the material of the source-level sacrificial layer 15 selective to the materials of the alternating stack (32, 42), the contact level dielectric layer 73, the insulating cap layer 70, the retro-stepped dielectric material portion 65, and the dielectric liner layer 14 can be introduced into the backside trenches 79 in an isotropic etch process. In one embodiment, an isotropic etchant that etches the material of the source-level sacrificial layer 15 can be introduced into the backside trenches 79 in a wet etch process. For example, if the source-level sacrificial layer 15 includes undoped amorphous silicon or an undoped amorphous silicon-germanium alloy and if the dielectric liner layer 14 includes silicon oxide, a wet etch process using hot trimethyl-2 hydroxyethyl ammonium hydroxide ("hot TMY") or tetramethyl ammonium hydroxide (TMAH) can be used to remove the source-level sacrificial layer 15 selective to the alternating stack (32, 42), the contact level dielectric layer 73, the insulating cap layer 70, the retro-stepped dielectric material portion 65, and the dielectric liner layer 14. Upon etching of the source-level sacrificial layer 15 by the isotropic etchant, a source-level cavity 19 is formed in the volume from which the source-level sacrificial layer 15 is removed. The source-level cavity 19 is formed by removing the source-level sacrificial layer 15 while the semiconductor pillar structures 12 provide mechanical support to the alternating stack (32, 42). Surfaces of the bottom portions of the memory films 50 are physically exposed to the source-level cavity 19.

Figure 8A:
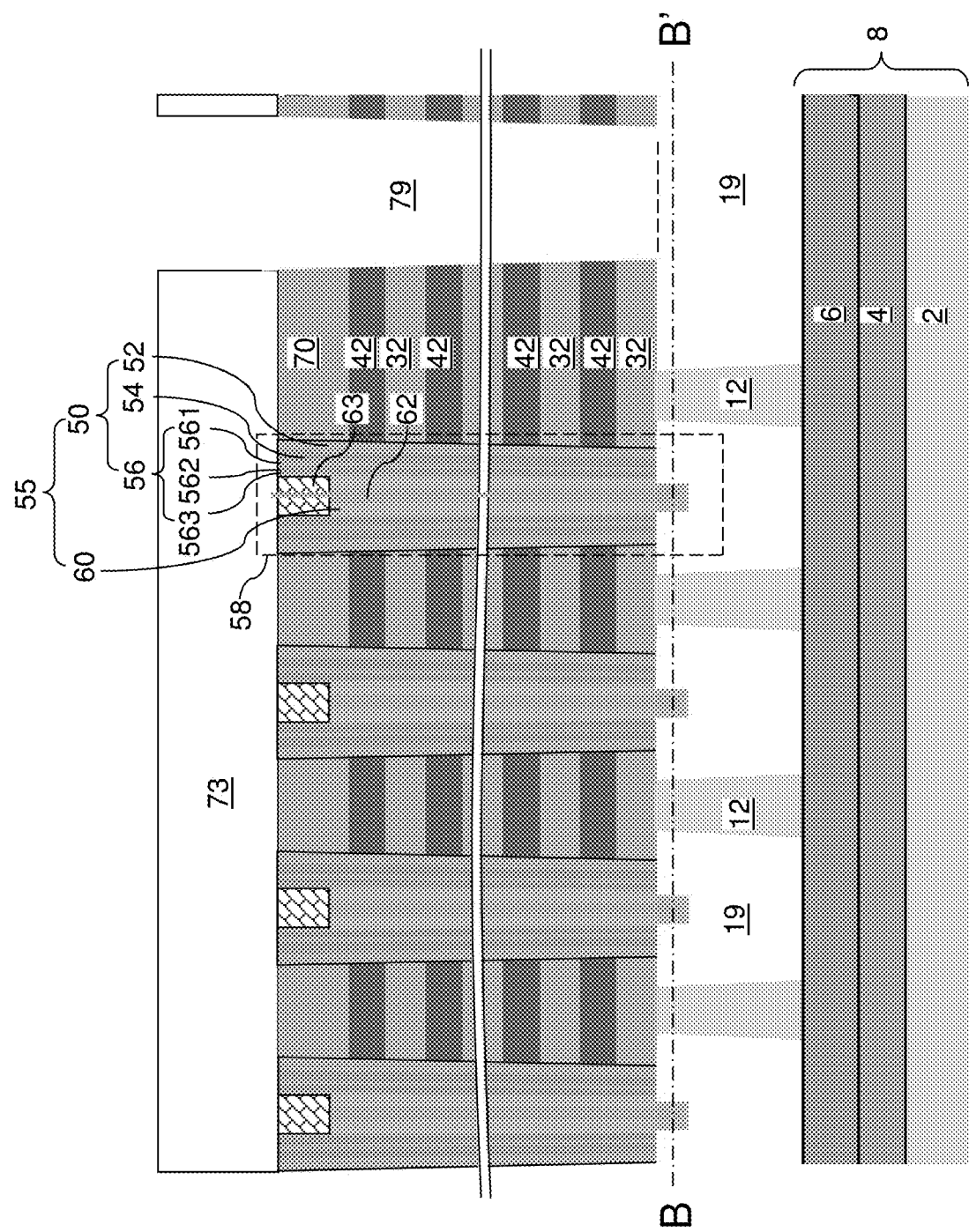
FIG. 8A is a schematic vertical cross-sectional view of the first exemplary structure after removal of physically exposed portions of the memory films and the dielectric liner layer according to an embodiment of the present disclosure.
Figure 8B:
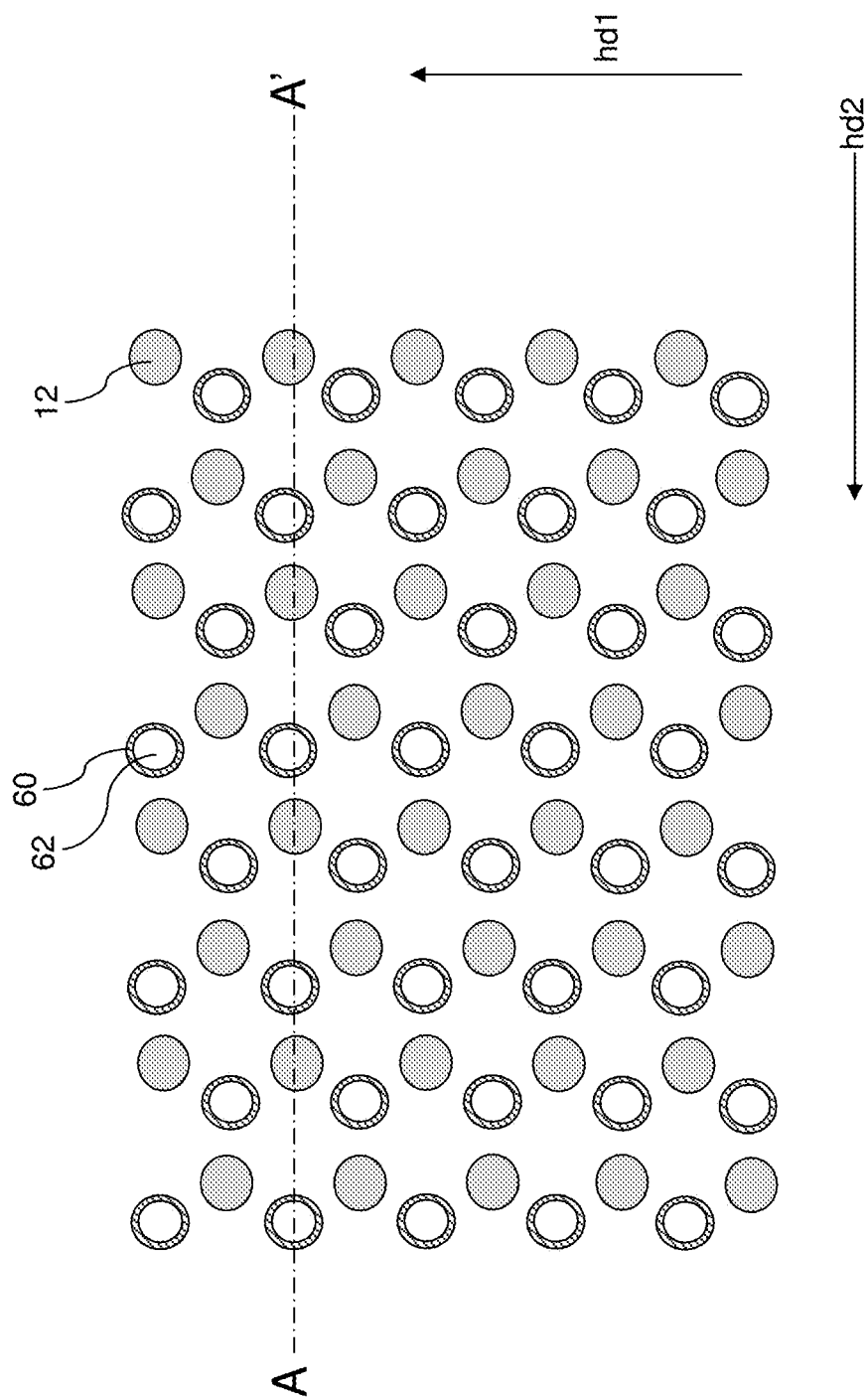
FIG. 8B is a horizontal cross-sectional view of the first exemplary structure along the horizontal plane B-B' of FIG. 8A.

Referring to FIGS. 8A and 8B, another isotropic etch process is performed, in which a sequence of isotropic etchants, such as wet etchants, is applied to the portions of the memory films 50 that are physically exposed to the source-level cavity 19. The isotropic etch process sequentially etches, from outside to inside, the various component layers of physically exposed portions of the memory films 50. The physically exposed portions of the memory films 50 include planar bottom portions and cylindrical portions of the memory films 50 that are located below the bottommost surface of the alternating stack (32, 42). A lower portion of an outer sidewall of each of the vertical semiconductor channels 60 is physically exposed by the isotropic etch process. The dielectric liner layer 14 can be collaterally removed during the isotropic etch process. For example, if the dielectric liner layer 14 includes silicon oxide, and if the tunneling dielectric layer 56 includes a layer stack of a first silicon oxide layer 561, a silicon oxynitride layer 562, and a second silicon oxide layer 563, a step of the isotropic etch process that etches the first silicon oxide layer 561 may be prolonged to etch the dielectric liner layer 14. The source-level cavity 19 is expanded in volume by removal of the physically exposed portions of the memory films 50 and the dielectric liner layer 14. A top surface of the first conductivity type semiconductor layer 6 and a bottom surface of the bottommost insulating layer 32 can be physically exposed to the source-level cavity 19. The semiconductor pillar structures 12 provide structural support to the alternating stack (32, 42) and the memory opening fill structures 58 during the isotropic etch process.

Figure 9A:
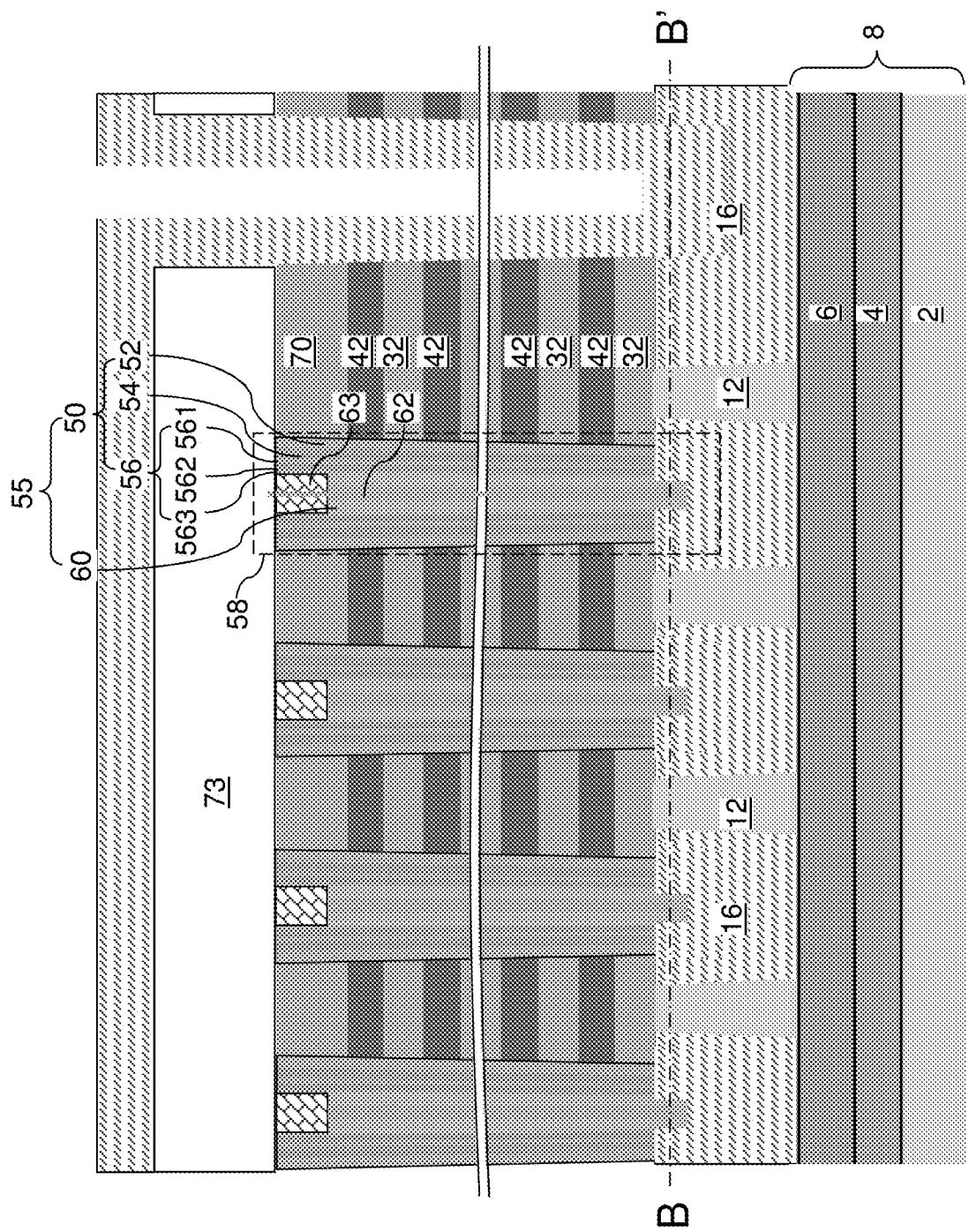
FIG. 9A is a schematic vertical cross-sectional view of the first exemplary structure after deposition of a doped semiconductor material layer according to an embodiment of the present disclosure.
Figure 9B:
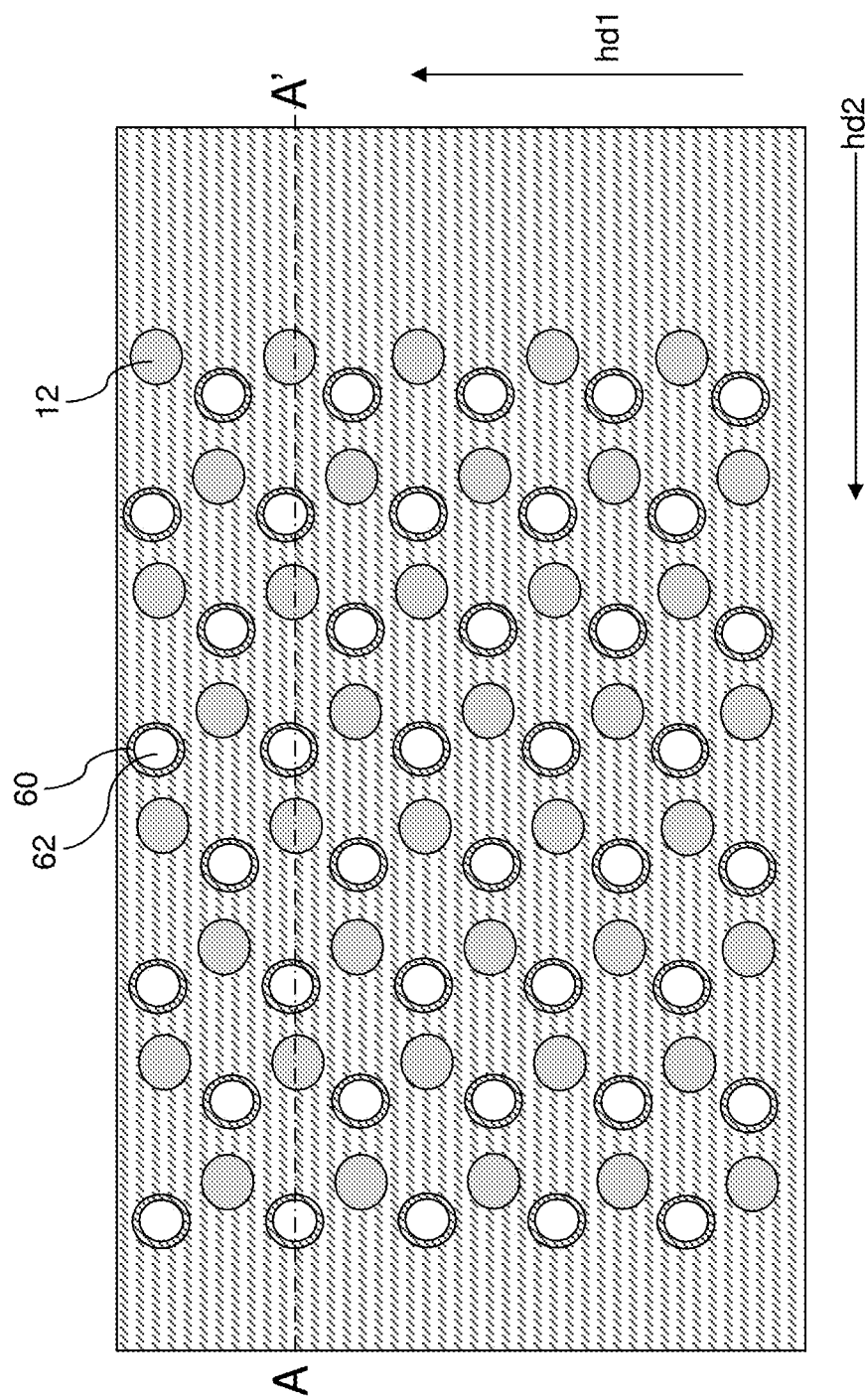
FIG. 9B is a horizontal cross-sectional view of the first exemplary structure along the horizontal plane B-B' of FIG. 9A.

Referring to FIGS. 9A and 9B, a doped semiconductor material having a doping of the first conductivity type can be deposited in the source-level cavity 19 by a selective semiconductor deposition process or by a non-selective semiconductor deposition process. A semiconductor precursor gas, such as silane, disilane, or dichlorosilane, and a dopant precursor gas can be flowed into a process chamber including the exemplary structure with an optional etchant gas such as hydrogen chloride. The deposited doped semiconductor material layer is herein referred to as a source-level semiconductor material layer 16. The source-level semiconductor material layer 16 is formed within the volume of the source-level cavity 19 and at peripheral regions of the backside trenches 79 and over the top surface of the contact level dielectric layer 73. The source-level semiconductor material layer 16 is formed by deposition of the doped semiconductor material having a doping of the first conductivity type on bottom surfaces and sidewalls of the vertical semiconductor channels 60, sidewalls of the semiconductor pillar structures 12, and a top surface of the first conductivity type semiconductor layer 6. As a consequence, the source-level semiconductor material layer 16 adjoins, and directly contacts, bottom end portions of the vertical semiconductor channels 60, and laterally surrounds the semiconductor pillar structures 12.

The source-level semiconductor material layer 16 is formed directly on the lower portion of the outer sidewall of each of the vertical semiconductor channels 60 and directly on sidewalls of the semiconductor pillar structures 12. In one embodiment, the doped semiconductor material of the source-level semiconductor material layer 16 can include doped polysilicon. The atomic concentration of dopants of the first conductivity type in the source-level semiconductor material layer 16 can be in a range from $1.0 \times 10^{14}/cm^3$ to $1.0 \times 10^{19}/cm^3$, although lesser and greater atomic concentrations can also be used. The source-level semiconductor material layer 16 is electrically isolated from the substrate semiconductor material layer 2 by a series of two p-n junctions having opposite polarities.

Figure 10:
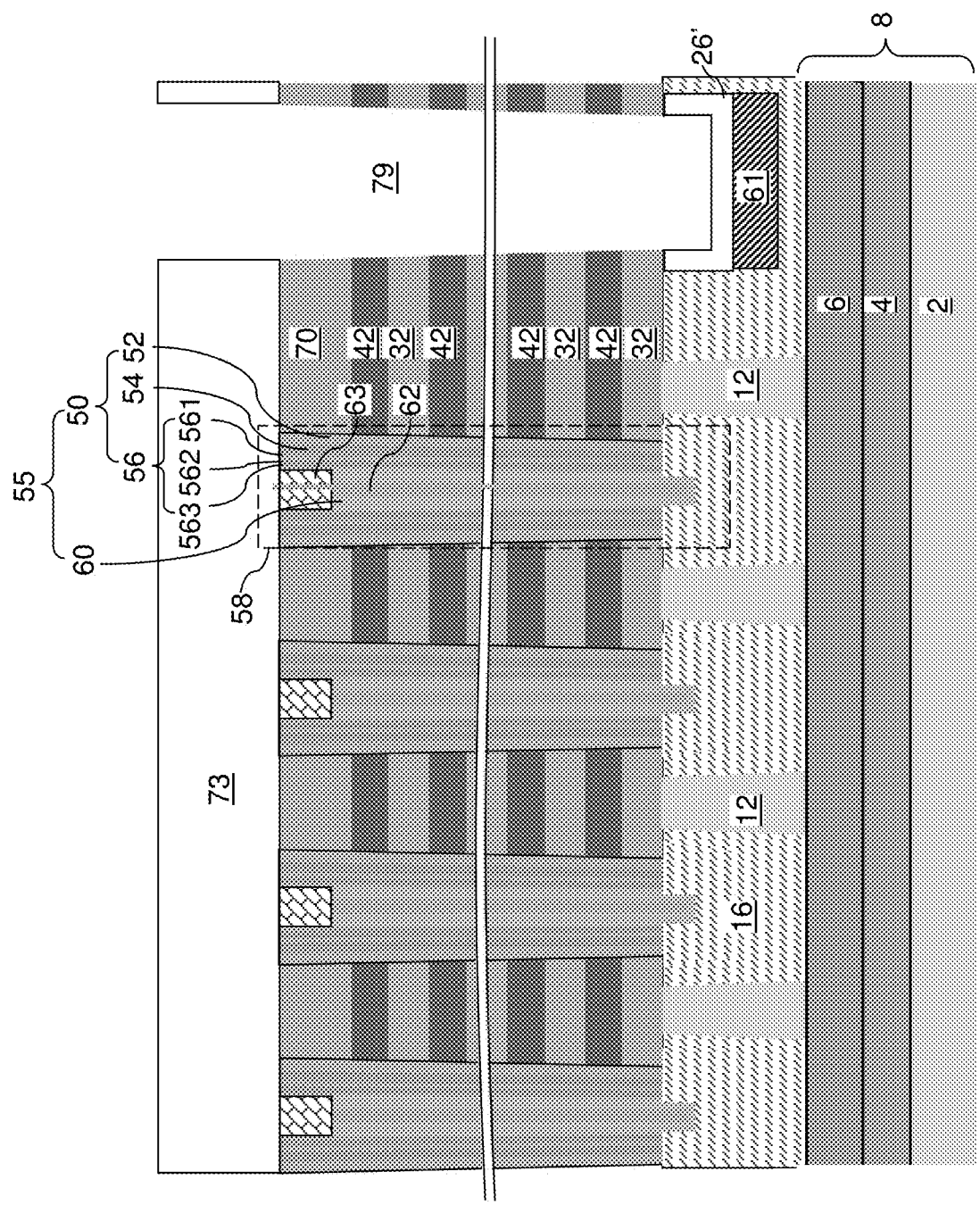
FIG. 10 is a vertical cross-sectional view of the first exemplary structure after formation of a source region and a sacrificial semiconductor oxide portion according to an embodiment of the present disclosure.

Referring to FIG. 10, portions of the source-level semiconductor material layer 16 located inside the backside trenches 79 or over the contact level dielectric layer 73 can be removed by an isotropic etch process. Remaining portions of the source-level semiconductor material layer 16 can be located entirely within a source level, which is the volume between the top surface of the first conductivity type semiconductor layer 6 and the bottom surface of the bottommost insulating layer 32 of the alternating stack (32, 42).

Dopants of the second conductivity can be implanted through the backside trenches into underlying portions of the source-level semiconductor material layer 16. Implanted portions of the source-level semiconductor material layer 16 are converted into doped semiconductor material portions having a doping of the second conductivity type, which function as source regions 61. The net dopant concentration in the source regions 61 (i.e., the atomic concentration of dopants of the second conductivity type less the atomic concentration of dopants of the first conductivity type) can be in a range from $5.0 \times 10^{19}/cm^3$ to $2.0 \times 10^{21}/cm^3$, although lesser and greater atomic concentrations can also be used. The source regions 61 may, or may not, contact a top surface of the first conductivity type semiconductor layer 6. A p-n junction is formed between each source region 61 and the source-level semiconductor material layer 16. Optionally, an oxidation process can be performed to covert physically exposed surface portions of the source-level semiconductor material layer 16 and the source regions 61 into sacrificial semiconductor oxide portions 26'. Each source region 61 can be formed at a bottom portion of a respective backside trench 79 directly on the source-level semiconductor material layer 16.

Figure 11:
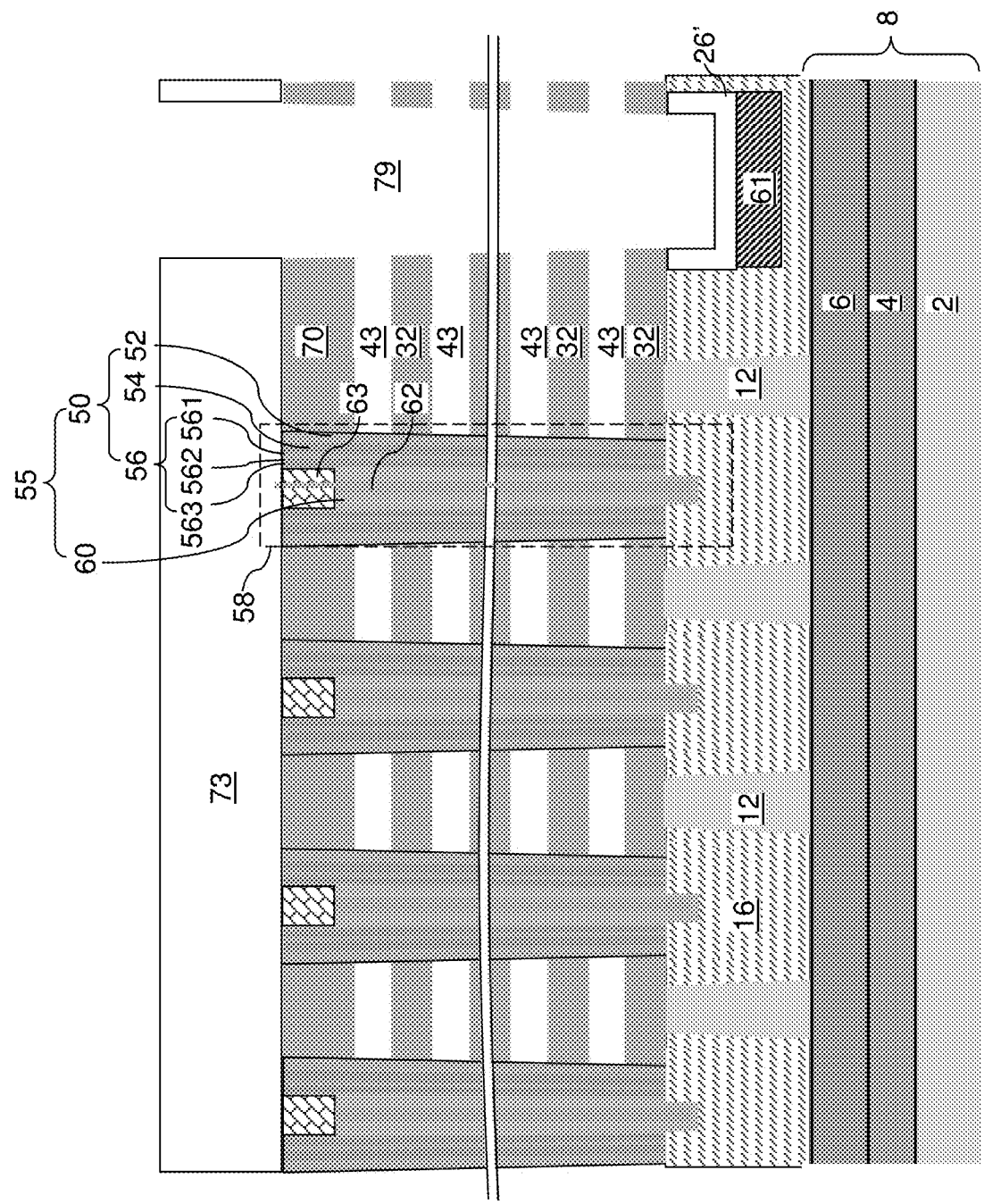
FIG. 11 is a schematic vertical cross-sectional view of the first exemplary structure after formation of backside recesses according to an embodiment of the present disclosure.

Referring to FIG. 11, an isotropic etch process can be performed, in which an etchant that selectively etches the second material of the sacrificial material layers 42 with respect to the first material of the insulating layers 32 can be introduced into the backside trenches 79. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the material of the contact level dielectric layer 73, the material of the insulating cap layer 70, the material of the sacrificial semiconductor oxide portions 26', and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Figure 12:
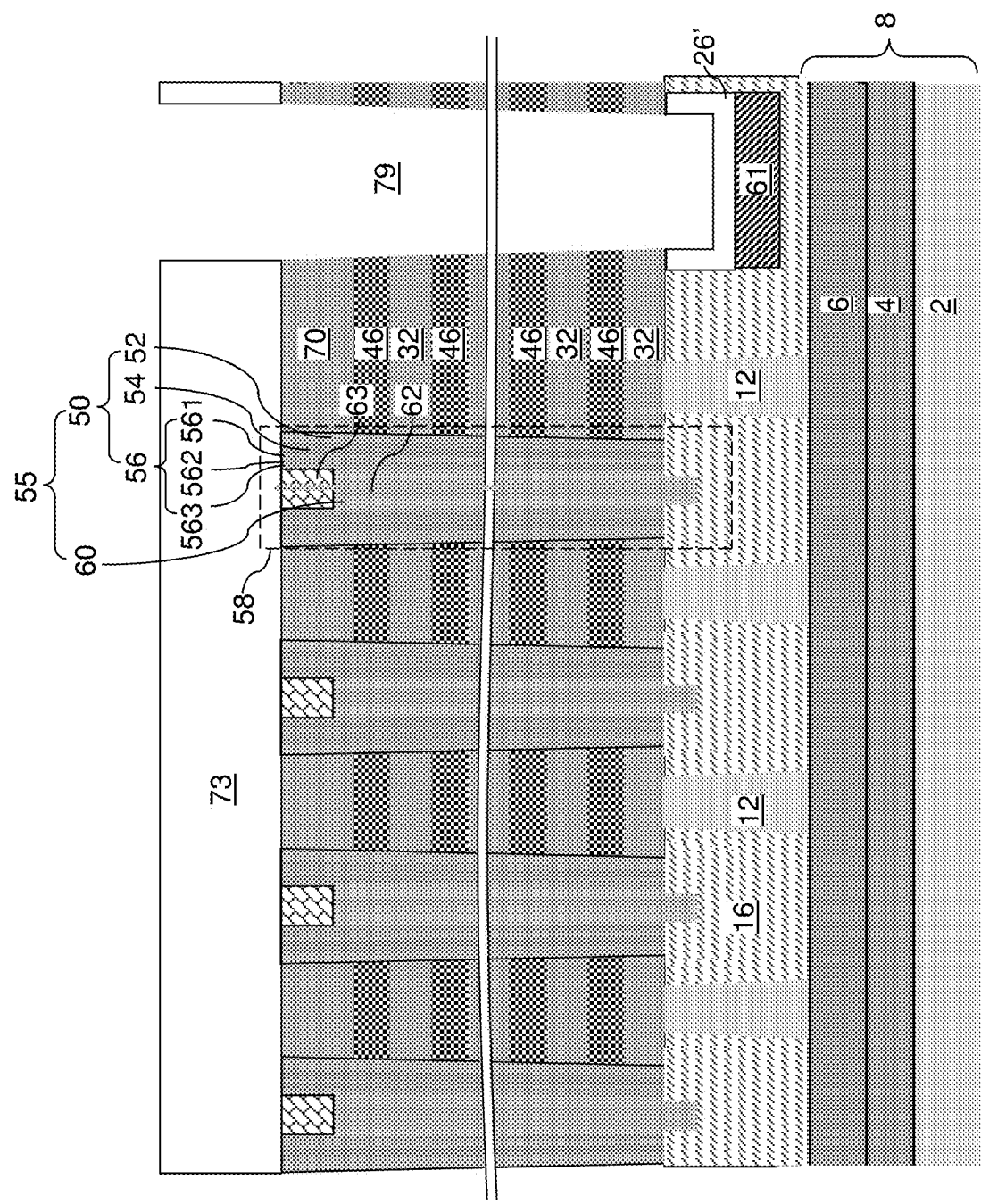
FIG. 12 is a schematic vertical cross-sectional view of the first exemplary structure after formation of electrically conductive layers according to an embodiment of the present disclosure.

Referring to FIG. 12, a backside blocking dielectric layer (not shown) can be optionally formed. The backside blocking dielectric layer, if present, comprises a dielectric material that functions as a control gate dielectric for the control gates to be subsequently formed in remaining volumes of the backside recesses 43. At least one metallic material can be deposited in the remaining volumes of the backside recesses 43 and at peripheral regions of the backside trenches 79. The at least one metallic material can include a conductive metallic nitride material such as TiN, TaN, WN, or a stack thereof, and a metal fill material such as tungsten, cobalt, ruthenium, titanium, and tantalum. For example, a combination of a TiN liner and a tungsten fill material can be deposited in the backside recesses. A plurality of electrically conductive layers 46 can be formed in the plurality of backside recesses 43, and a continuous metallic material layer can be formed on the sidewalls of each backside trench 79 and over the contact level dielectric layer 73. The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. The remaining portions of the deposited metallic material include electrically conductive layers 46 that fill the backside recesses 43. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 13:
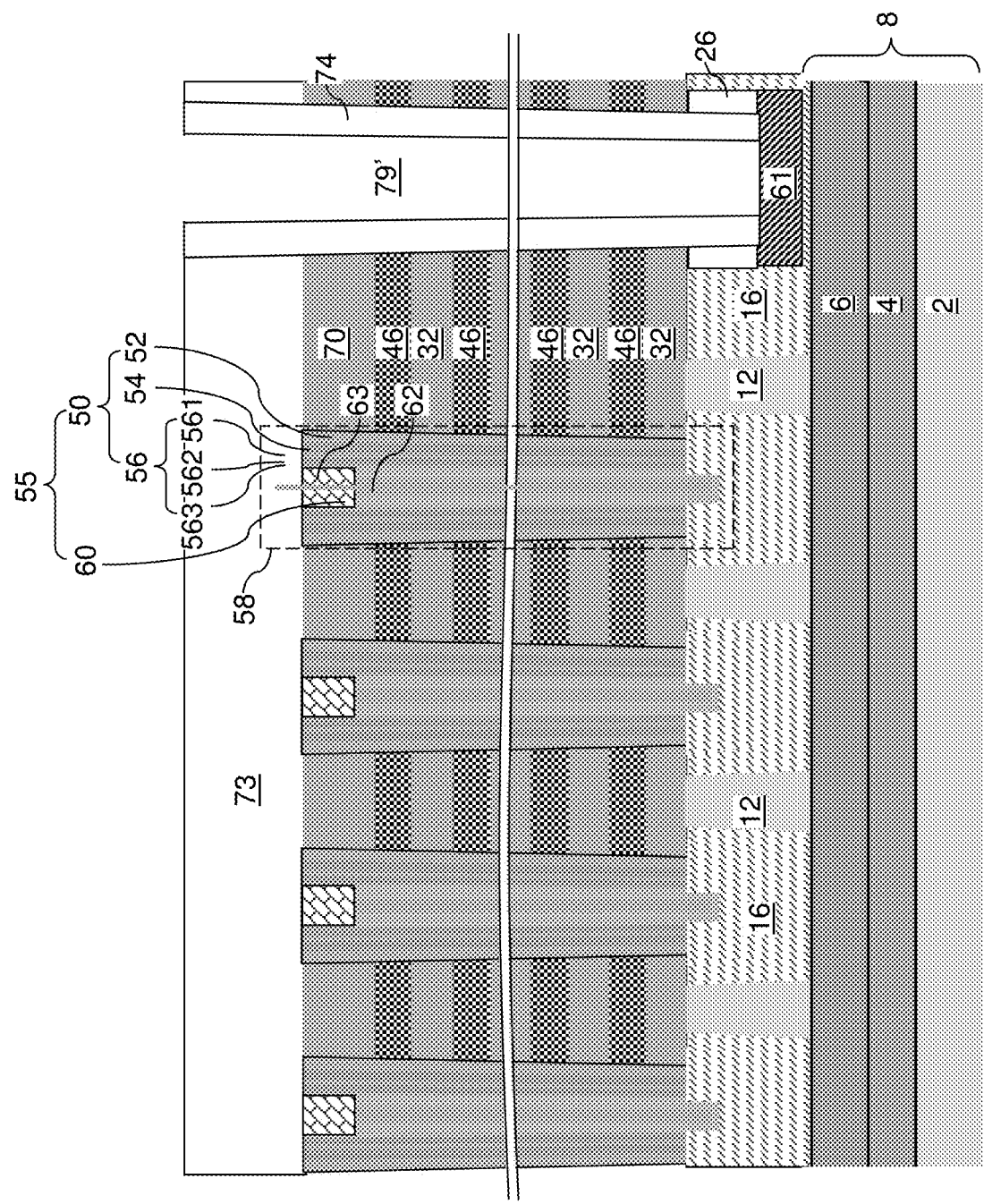
FIG. 13 is a schematic vertical cross-sectional view of the first exemplary structure after formation of an insulating spacer in the backside trench according to an embodiment of the present disclosure.

Referring to FIG. 13, an insulating material layer can be conformally deposited in the backside trenches 79 and over the contact level dielectric layer 73. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LP-CVD) or atomic layer deposition (ALD). The thickness of the insulating material layer can be in a range from 1.5 nm to 60 nm, although lesser and greater thicknesses can also be used.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A center portion of each sacrificial semiconductor oxide portion 26' may be removed during the anisotropic etch process to provide a semiconductor oxide spacer 26 having a tubular configuration and laterally surrounding a respective insulating spacer 74. Alternatively, the entirety of each sacrificial semiconductor oxide portion 26' may be removed by the anisotropic etch process. A backside cavity 79' is present within a volume surrounded by each insulating spacer 74. A top surface of a source region 61 can be physically exposed at the bottom of each backside trench 79.

Figure 14:
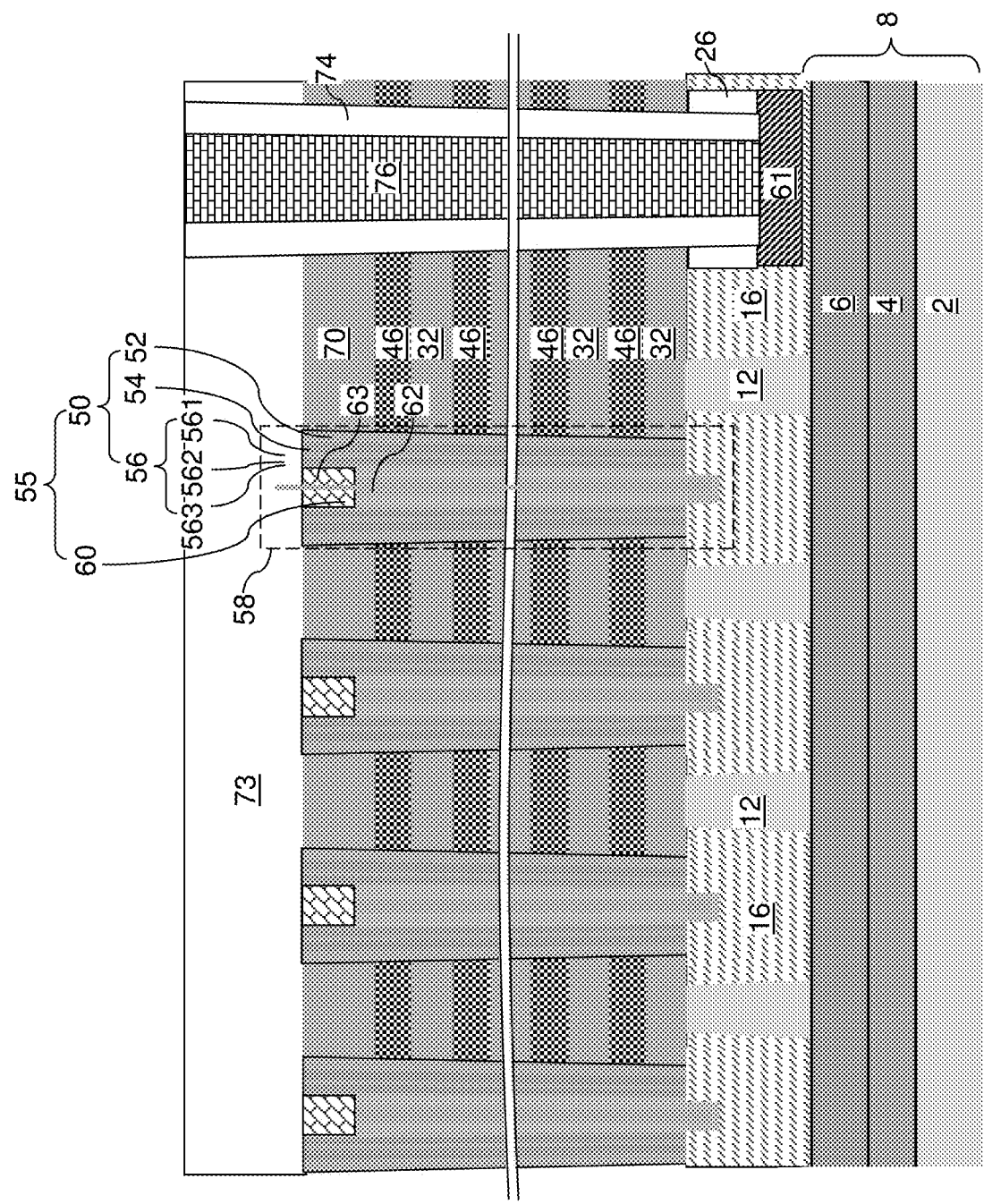
FIG. 14 is a schematic vertical cross-sectional view of the first exemplary structure after formation of a backside contact via structure according to an embodiment of the present disclosure.

Referring to FIG. 14, a backside contact via structure 76 can be formed within each backside cavity 79' directly on a respective one of the source regions 61. The contact via structures 76 can be formed by depositing at least one conductive material in the remaining unfilled volume (i.e., the backside cavity 79') of the backside trench 79. For example, the at least one conductive material can include a conductive liner including a conductive liner material such as TiN, TaN, WN, TiC, TaC, WC, an alloy thereof, or a stack thereof, and a conductive fill material portion including a metal or a metallic alloy such as W, Cu, Al, Co, Ru, Ni, an alloy thereof, or a stack thereof. The at least one conductive material can be planarized using the contact level dielectric layer 73 as a stopping layer. Each remaining continuous portion of the at least one conductive material in the backside trenches 79 constitutes a backside contact via structure 76. Each backside contact via structure 76 extends through the alternating stack (32, 46), and contacts a top surface of the source region 61.

Figure 15:
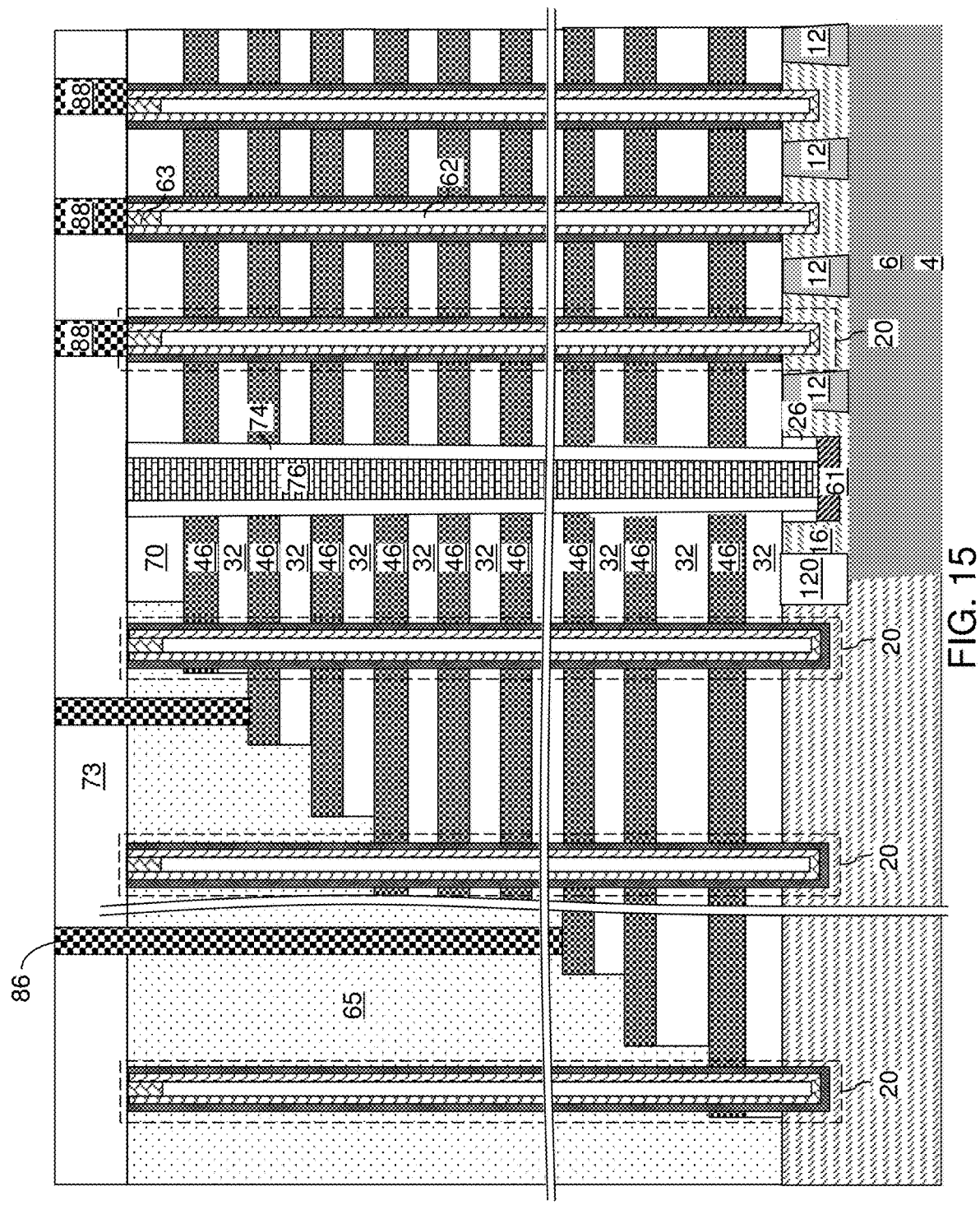
FIG. 15 is a schematic vertical cross-sectional view of the first exemplary structure after formation of various contact via structures according to an embodiment of the present disclosure.

Referring to FIG. 15, additional contact via structures (88, 86) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73 and through the retro-stepped dielectric material portion 65.

Figure 16:
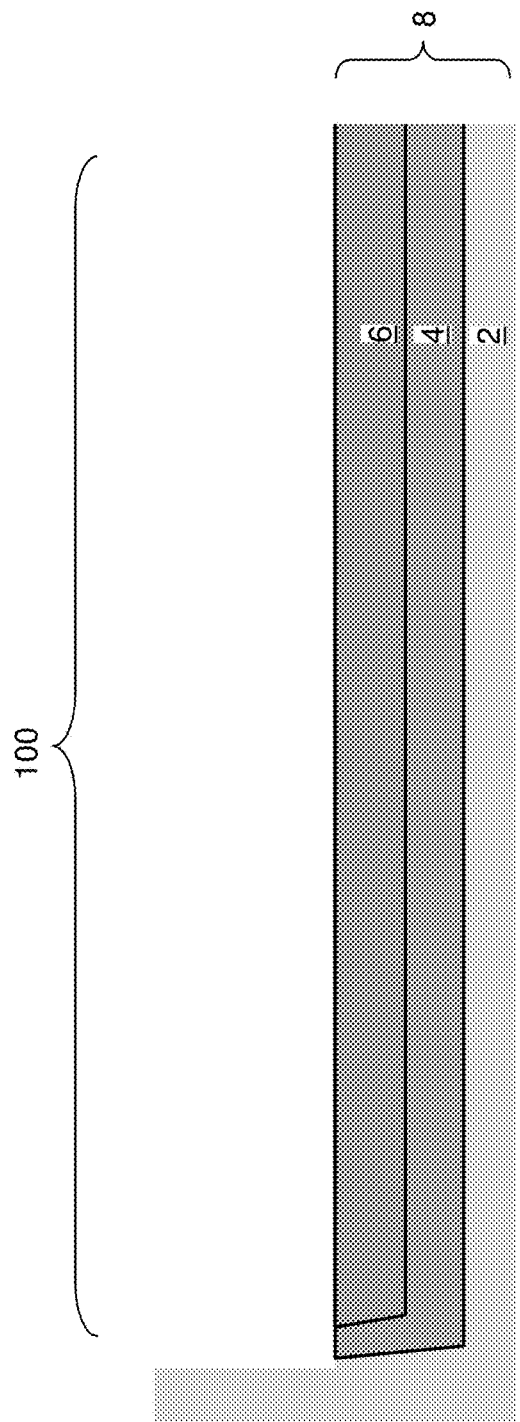
FIG. 16 is a schematic vertical cross-sectional view of a second exemplary structure after formation of p-n junctions in a substrate according to an embodiment of the present disclosure.

Referring to FIG. 16, a second exemplary structure according to a second embodiment of the present disclosure can be derived from the first exemplary structure by recessing an entire area of a memory array region 100 without forming the semiconductor pillar structures 12. Elimination of the semiconductor pillar structures 12 in the second exemplary structure can be accomplished by modifying a lithographic pattern for an etch mask layer (such as a photoresist layer) to not include discrete masked area within the memory array region 100 during the processing steps of FIGS. 1A and 1B. The processing steps of FIGS. 2A and 2B can be subsequently performed to form a series connection of p-n junctions. For example, a stack of a first conductivity type semiconductor layer 6 and a second conductivity type semiconductor layer 4 can be formed in the memory array region 100 in the same manner as in the first embodiment.

Figure 17:
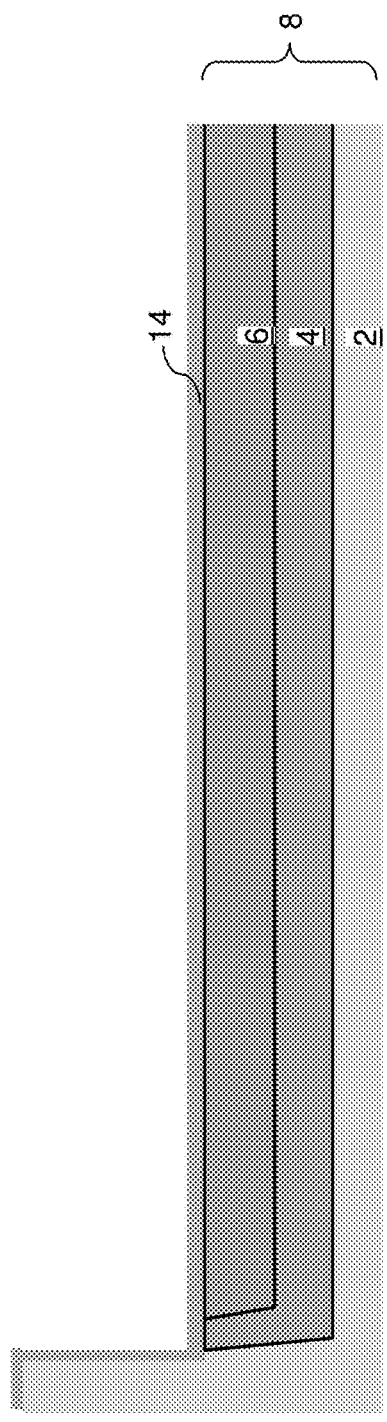
FIG. 17 is a schematic vertical cross-sectional view of the second exemplary structure after formation of a dielectric liner layer according to an embodiment of the present disclosure.

Referring to FIG. 17, a dielectric liner layer 14 can be formed in the same manner as in the first embodiment.

Figure 18B:
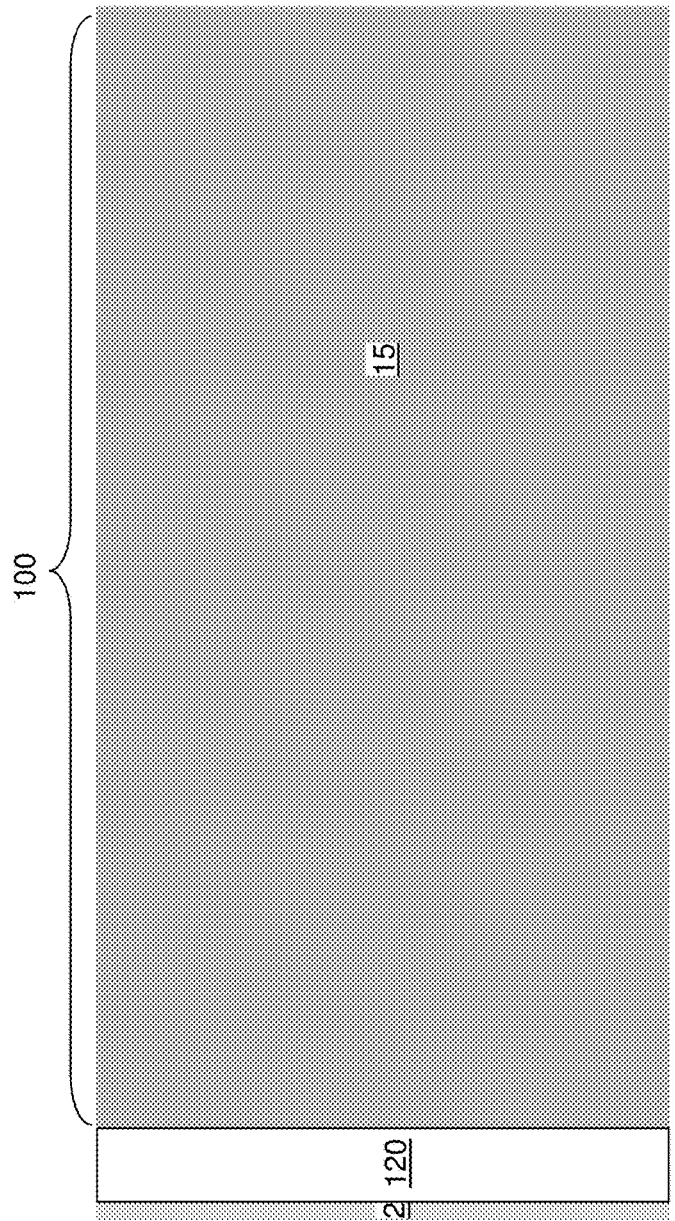
FIG. 18B is a top-down view of the second exemplary structure of FIG. 3A. The vertical plane A-A' is a plane of the vertical cross-sectional view of FIG. 3A.
Figure 18A:
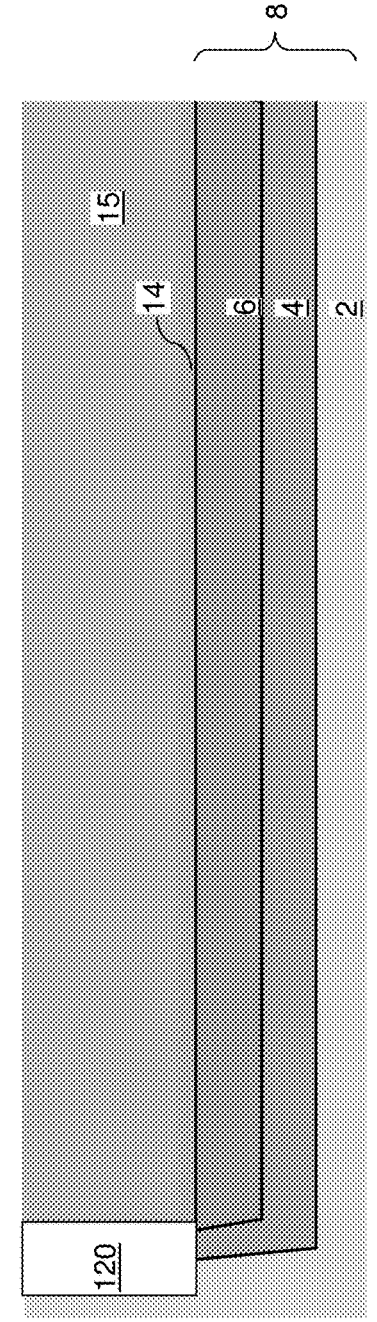
FIG. 18A is a schematic vertical cross-sectional view of the second exemplary structure after formation of a source-level sacrificial layer according to an embodiment of the present disclosure.

Referring to FIGS. 18A and 18B, a source-level sacrificial layer 15 can be deposited over the dielectric liner layer 14. The source-level sacrificial layer 15 includes a sacrificial material that can be removed selective to the material of the dielectric liner layer 14. For example, the source-level sacrificial layer 15 can include amorphous silicon, an amorphous silicon-germanium alloy, a carbon-based material such as amorphous carbon, or an organic polymer. Excess portions of the source-level sacrificial layer 15 can be removed from above the horizontal plane including top surfaces of the substrate semiconductor material layer 2 outside the memory array region 100 by a chemical mechanical planarization (CMP) process. Portions of the dielectric liner layer 14 that overlie the horizontal plane including the top surface of the portion of the substrate semiconductor material layer 2 outside the memory array region 100 can be collaterally removed during the CMP process.

Dielectric isolation structures 120 may be optionally formed, for example, by forming trenches at the boundary of the source-level sacrificial layer 15, and filling the trenches with a dielectric material such as silicon oxide. In one embodiment, the dielectric isolation structures 120 may be formed around each memory array region 100. In one embodiment, the edge of the p-n junctions can be covered with the dielectric isolation structures 120. The dielectric isolation structures 120 provides electrical isolation between structures formed in the memory array region 100 and portions of the substrate semiconductor material layer 2 that protrudes to the height of the top surface of the source-level sacrificial layer 15 outside of the memory array region 100.

Figure 19:
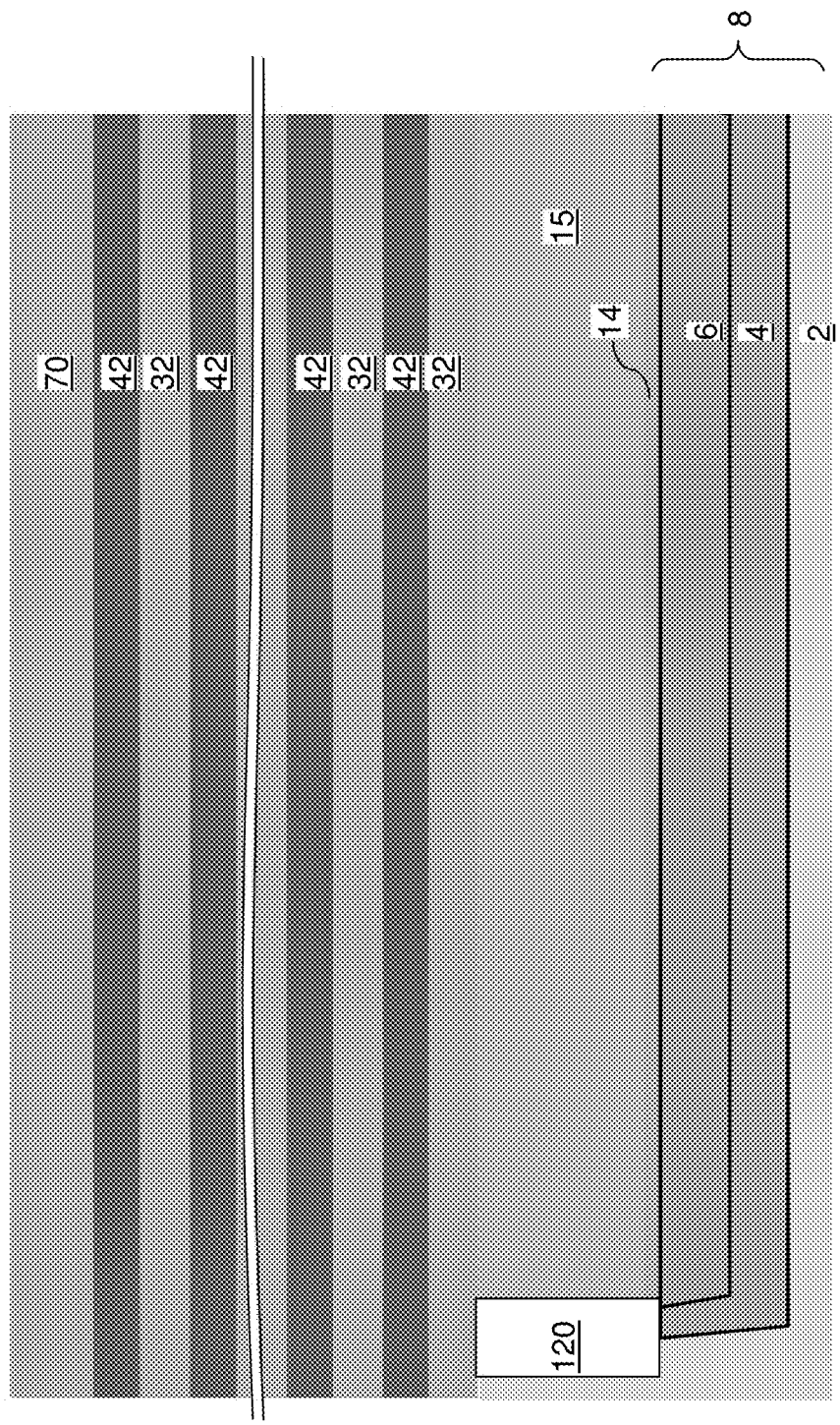
FIG. 19 is a schematic vertical cross-sectional view of the second exemplary structure after formation of an alternating stack of insulating layers and sacrificial material layers according to an embodiment of the present disclosure.

Referring to FIG. 19, the processing steps of FIGS. 4A-4C can be performed to form an alternating stack of insulating layers 32 and sacrificial material layers 42, an insulating cap layer 70, stepped surfaces of the alternating stack (32, 42) (that are formed in a staircase region 300 as illustrated in FIG. 4B), and a retro-stepped dielectric material portion 65 (as illustrated in FIG. 4B).

Figure 20:
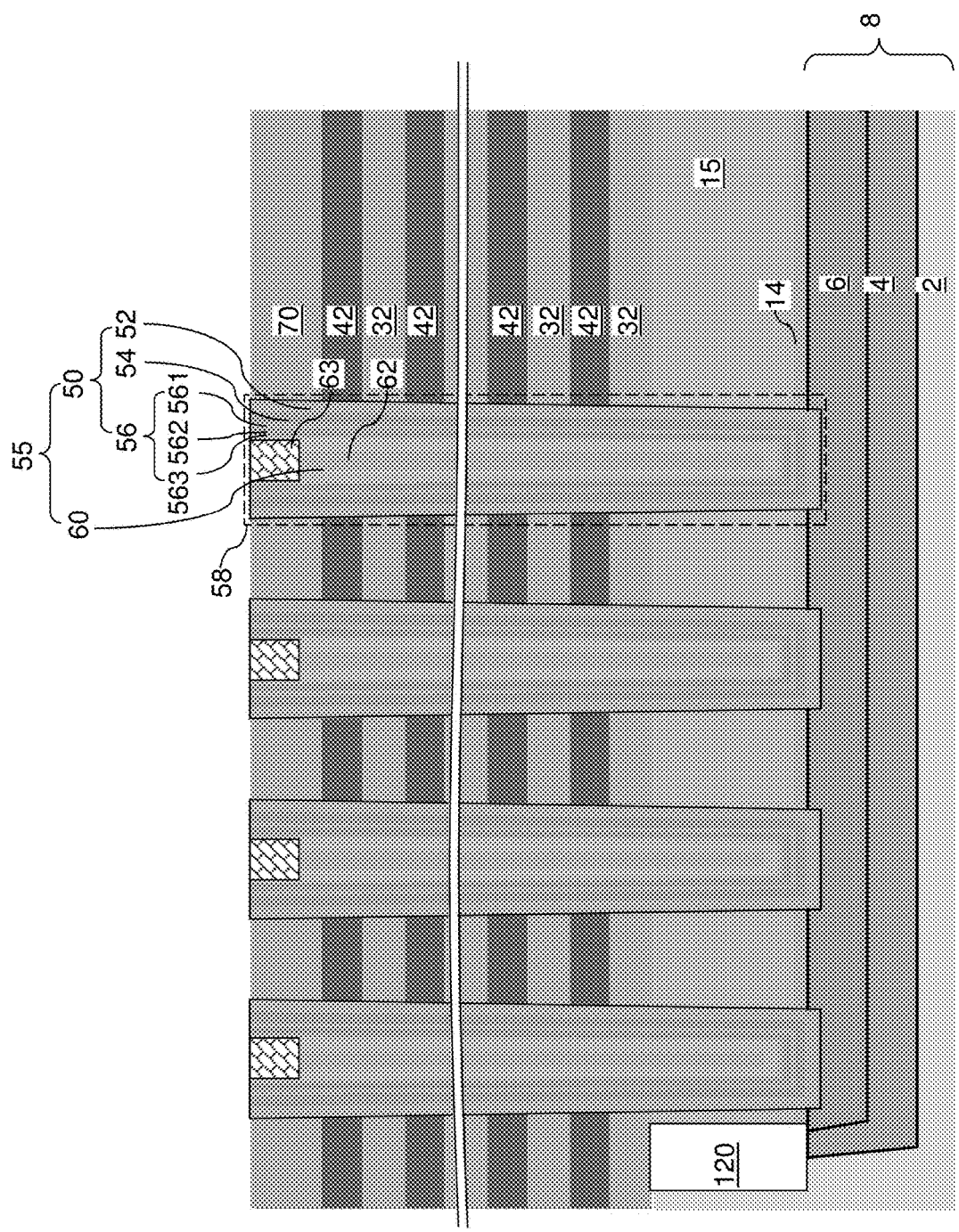
FIG. 20 is a schematic vertical cross-sectional view of the second exemplary structure after formation of memory stack structures according to an embodiment of the present disclosure.

Referring to FIG. 20, the processing steps of FIGS. 5A-5D can be performed with a modification to the depths of the memory openings and support openings. Specifically, the etch process that forms the memory openings can be modified so that the memory openings extend through the source-level sacrificial layer 15, through the dielectric liner layer 14, and into an upper portion of the first conductivity type semiconductor layer 6. The depth of recess of the memory openings into the first conductivity type semiconductor layer 6 can be greater than the thickness of the memory films 50 to be subsequently formed, and may be in a range from 10 nm to 100 nm, although lesser and greater depths of recess can also be used.

Figure 5A:
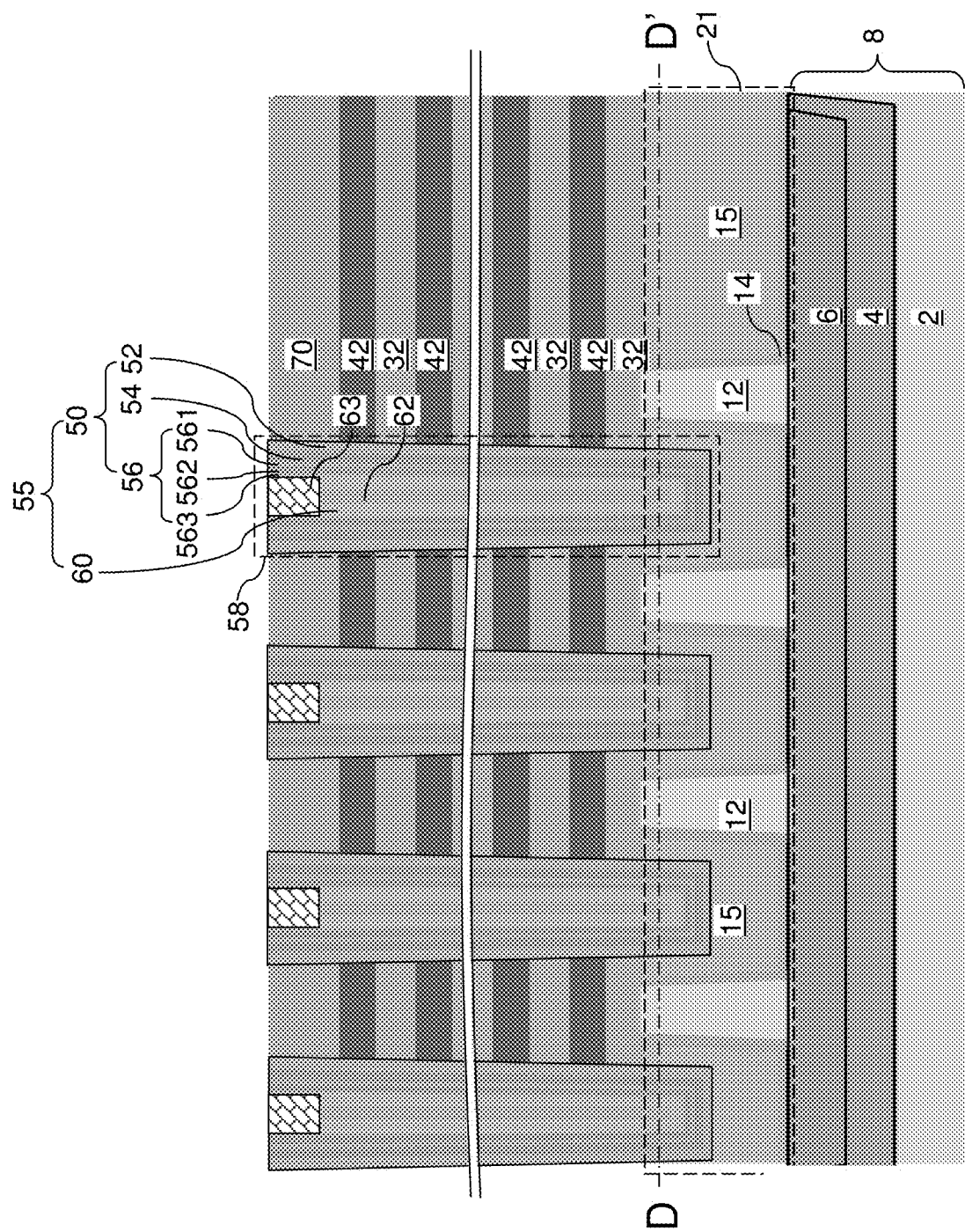
FIG. 5A is a schematic vertical cross-sectional view of the first exemplary structure after formation of memory stack structures and support pillar structures according to an embodiment of the present disclosure.
Figure 5B:
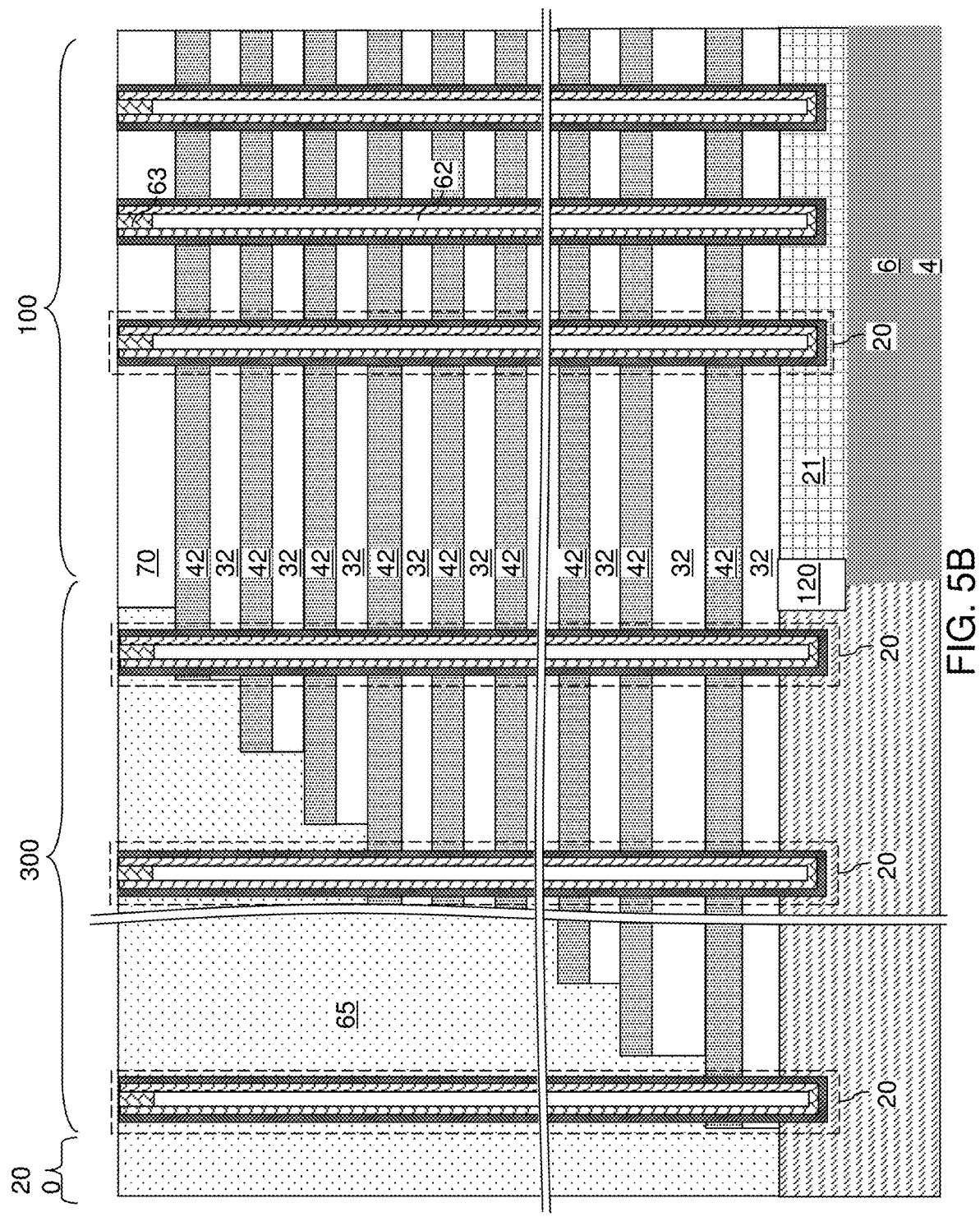
FIG. 5B is another schematic vertical cross-sectional view of the first exemplary structure of FIG. 5A.
Figure 5C:
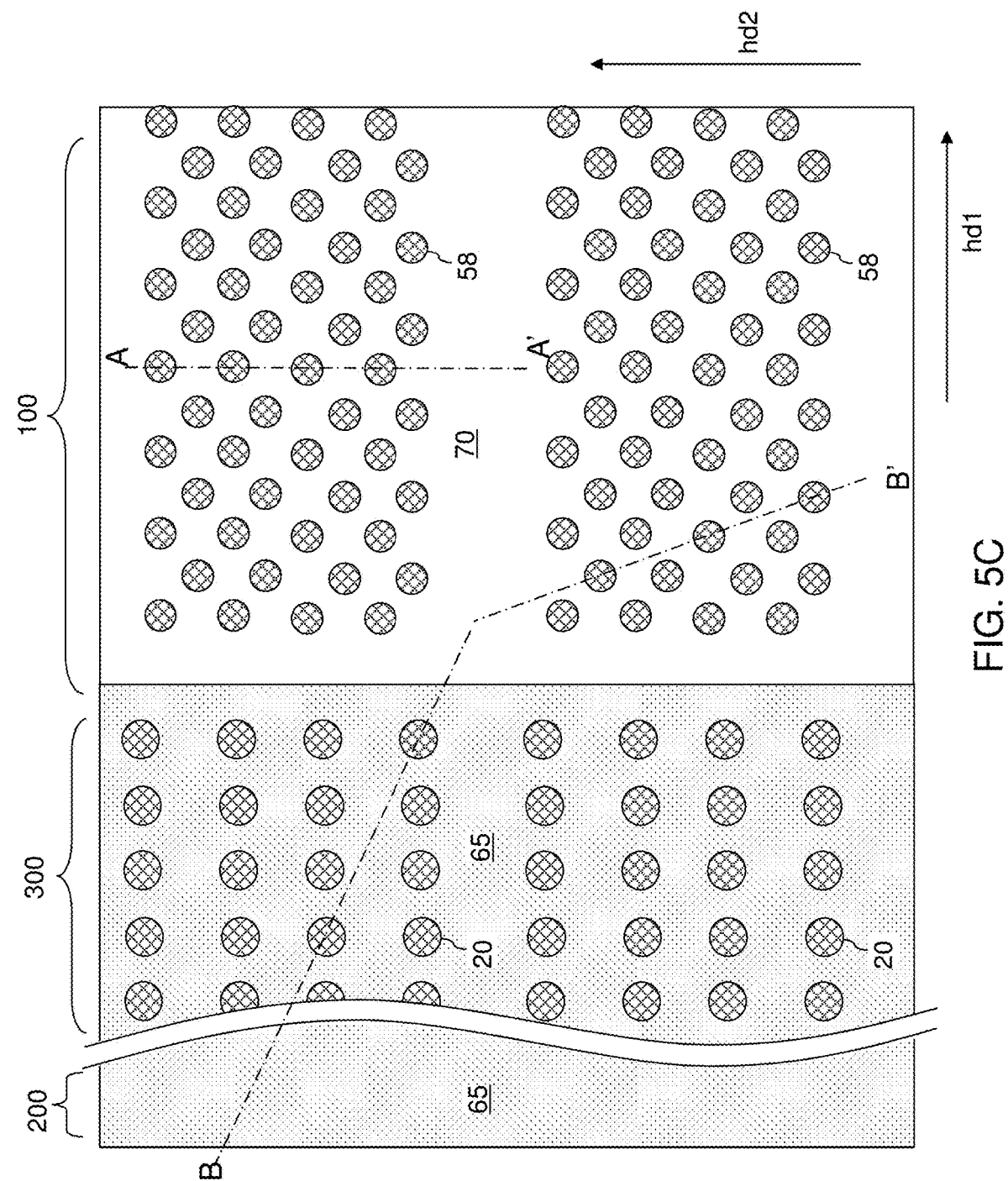
FIG. 5C is a top-down view of the first exemplary structure of FIGS. 5A and 5B. The vertical plane A-A' is a plane of the vertical cross-sectional view of FIG. 5A. The vertical plane B-B' is a plane of the vertical cross-sectional view of FIG. 5B.
Figure 5D:
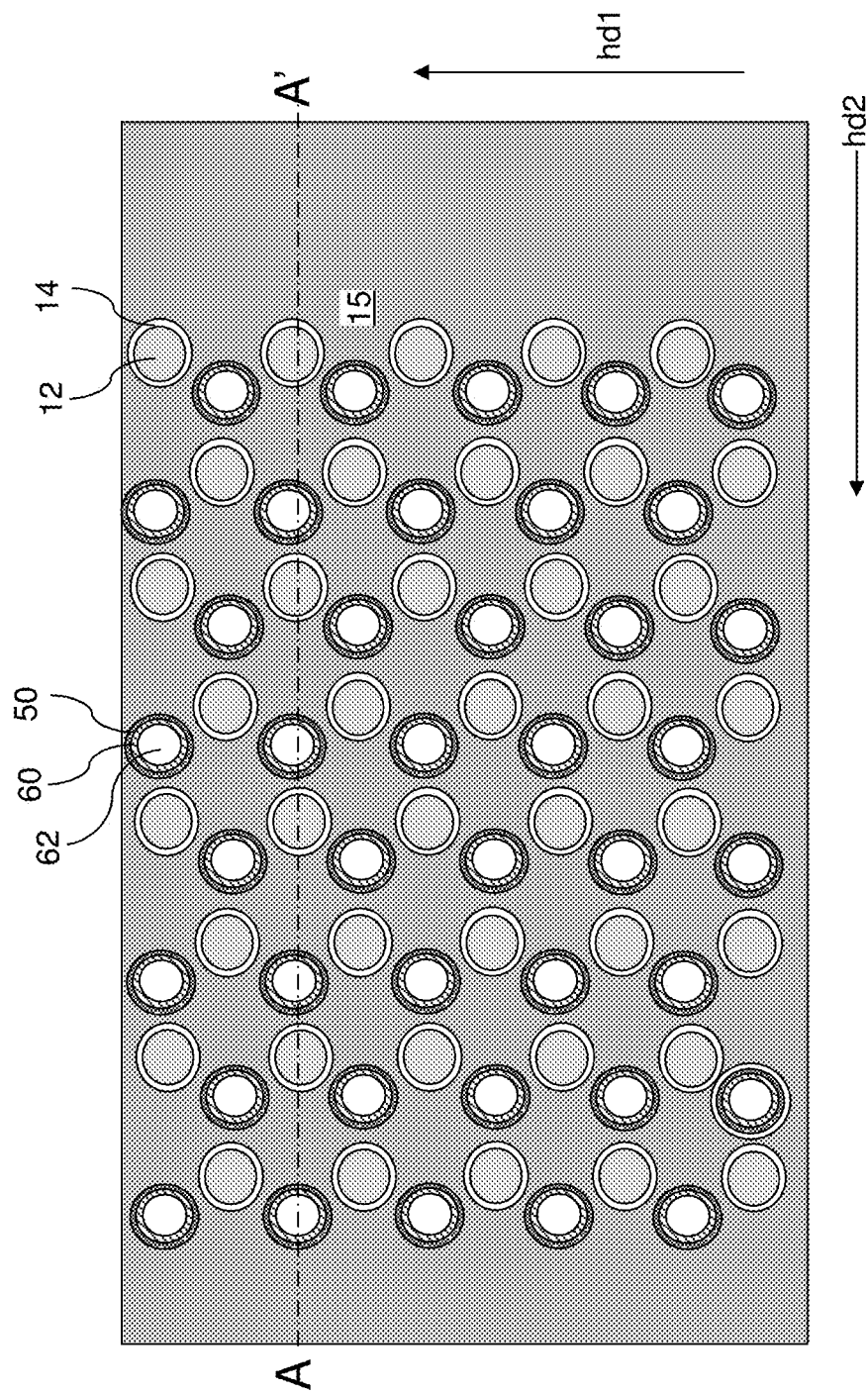
FIG. 5D is a horizontal cross-sectional view of the first exemplary structure along the horizontal plane D-D' of FIG. 5A.

A memory opening fill structure 58 is formed in each memory opening, and a support pillar structure 20 is formed in each support opening. Each memory opening fill structure 58 includes a memory stack structure 55. Each memory stack structure 55 is a combination of a vertical semiconductor channel 60, a tunneling dielectric layer 56, a plurality of memory elements comprising portions of the charge storage layer 54, and an optional blocking dielectric layer 52. Each memory opening fill structure 58 extends into, and contacts, an upper portion of the first conductivity type semiconductor layer 6. The memory opening fill structures 58 are formed in the memory array region 100, and the support pillar structures 20 are formed in the staircase region 300 as illustrated in FIG. 5C.

Figure 21:
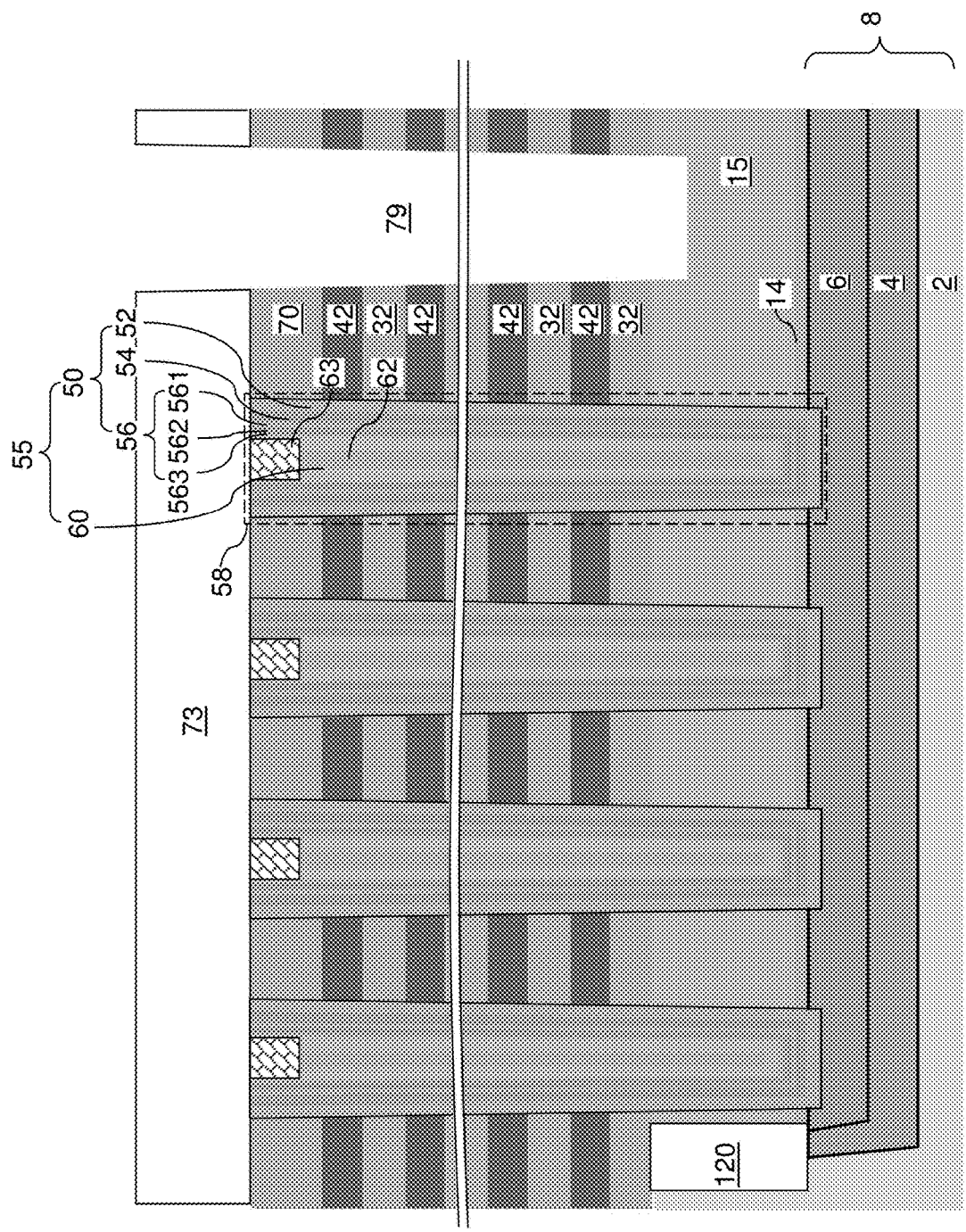
FIG. 21 is a schematic vertical cross-sectional view of the second exemplary structure after formation of backside trenches according to an embodiment of the present disclosure.

Referring to FIG. 21, the processing steps of FIGS. 6A-6C can be performed to form a contact level dielectric layer 73 and backside trenches 79. The backside trenches 79 vertically extend from the top surface of the contact level dielectric layer 73 and at least to the top surface of the source-level sacrificial layer 15, and laterally extend through the memory array region 100 and the staircase region 300 (See FIG. 6C). In one embodiment, the backside trenches 79 can laterally extend along the first horizontal direction hd1. The photoresist layer can be removed, for example, by ashing. Each backside trench 79 can have a uniform width that is invariant along the lengthwise direction (i.e., along the first horizontal direction hd1). The material of the source-level sacrificial layer 15 is physically exposed at the bottom of each backside trench 79.

Figure 22:
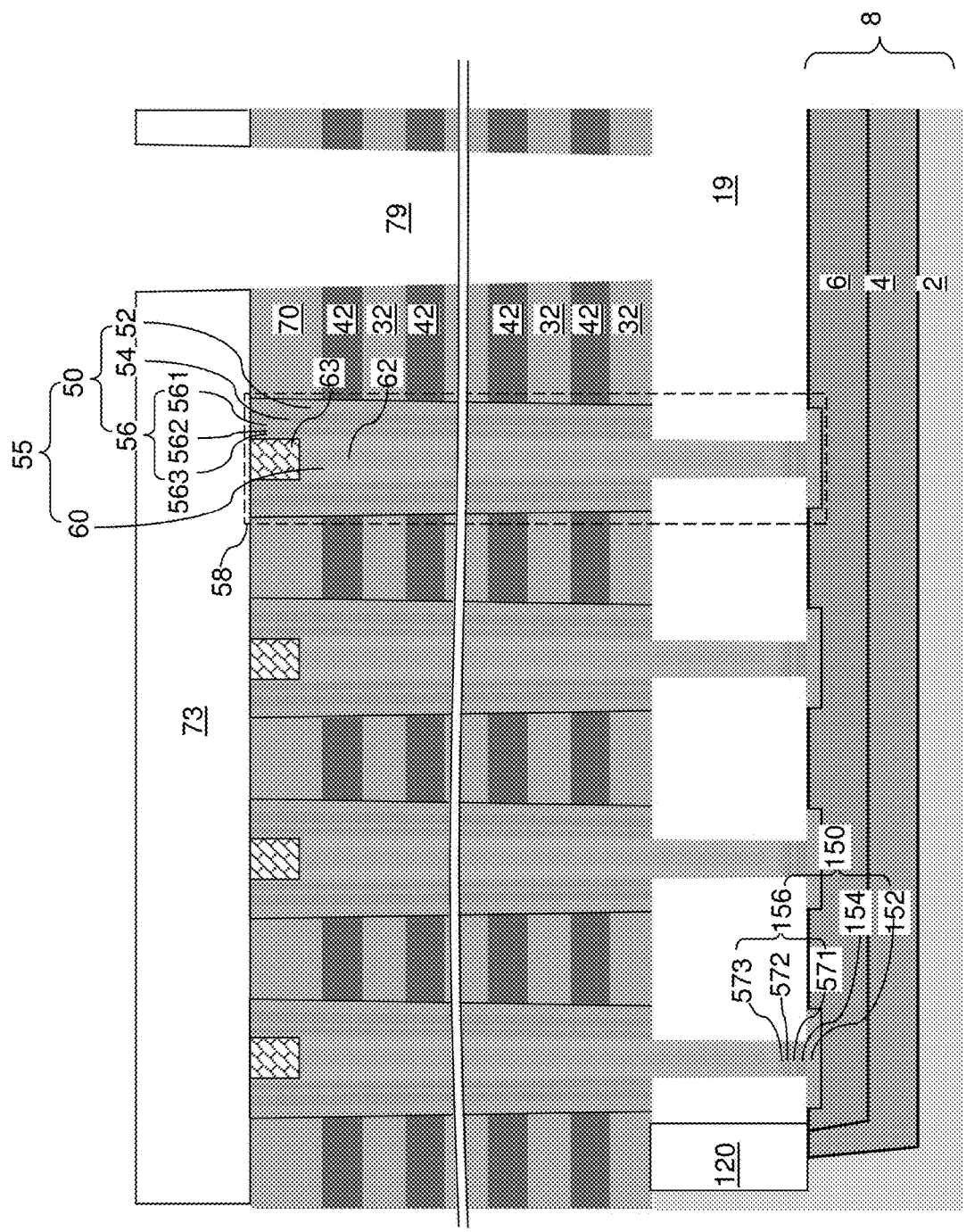
FIG. 22 is a schematic vertical cross-sectional view of the second exemplary structure after formation of a source-level cavity and removal of physically exposed portions of the memory films and the dielectric liner layer according to an embodiment of the present disclosure.

Referring to FIG. 22, the processing steps of FIGS. 7A and 7B and FIGS. 8A and 8B can be performed to form a source-level cavity 19. An isotropic etch process can be used to etch the material of the source-level sacrificial layer 15 selective to the materials of the alternating stack (32, 42), the contact level dielectric layer 73, the insulating cap layer 70, the retro-stepped dielectric material portion 65, and the dielectric liner layer 14. The isotropic etchant can be introduced into the backside trenches 79 during the isotropic etch process. The source-level cavity 19 is formed by removing the source-level sacrificial layer 15 while the semiconductor pillar structures 12 provide mechanical support to the alternating stack (32, 42). Surfaces of bottom regions of the outer sidewalls of the memory films 50 are physically exposed to the source-level cavity 19.

Another isotropic etch process is subsequently performed, in which a sequence of isotropic etchants, such as wet etchants, is applied to the portions of the memory films 50 that are physically exposed to the source-level cavity 19. The isotropic etch process sequentially etches, from outside to inside, the various component layers of physically exposed portions of the memory films 50. The physically exposed portions of the memory films 50 include cylindrical portions of the memory films 50 that are located below the bottommost surface of the alternating stack (32, 42) and above the top surface of the first conductivity type semiconductor layer 6. A lower portion of an outer sidewall of each of the vertical semiconductor channels 60 is physically exposed by the isotropic etch process. The dielectric liner layer 14 can be collaterally removed during the isotropic etch process. For example, if the dielectric liner layer 14 includes silicon oxide, and if the tunneling dielectric layer 56 includes a layer stack of a first silicon oxide layer 561, a silicon oxynitride layer 562, and a second silicon oxide layer 563, a step of the isotropic etch process that etches the first silicon oxide layer 561 may be prolonged to etch the dielectric liner layer 14. The source-level cavity 19 is expanded in volume by removal of the physically exposed portions of the memory films 50 and the dielectric liner layer 14. A top surface of the first conductivity type semiconductor layer 6 and a bottom surface of the bottommost insulating layer 32 can be physically exposed to the source-level cavity 19.

A dielectric layer stack 150 can be provided at the bottom of each vertical semiconductor channel 60. Each dielectric layer stack 150 includes a contiguous set of remaining portions of the memory films 50 after the isotropic etch process. Each dielectric layer stack 150 can include a blocking dielectric material portion 152 having a same composition and a same thickness as a blocking dielectric layer 52, a charge storage material portion 154 having a same composition and a same thickness as a charge storage layer 54, and a tunneling dielectric material portion 156 having same compositional components and have a same thickness as a tunneling dielectric layer 56. Each tunneling dielectric material portion 156 can include a first silicon oxide portion 571 having a same composition and a same thickness as a first silicon oxide layer 561, a silicon oxynitride portion 572 having a same composition and a same thickness as a silicon oxynitride layer 562, and a second silicon oxide portion 573 having a same composition and a same thickness as a second silicon oxide layer 563. Portions of the vertical semiconductor channels 60 and the dielectric cores 62 surrounded by the source-level cavity 19 and the dielectric layer stacks 150 provide structural support to the alternating stack (32, 42) during the isotropic etch process.

Figure 23:
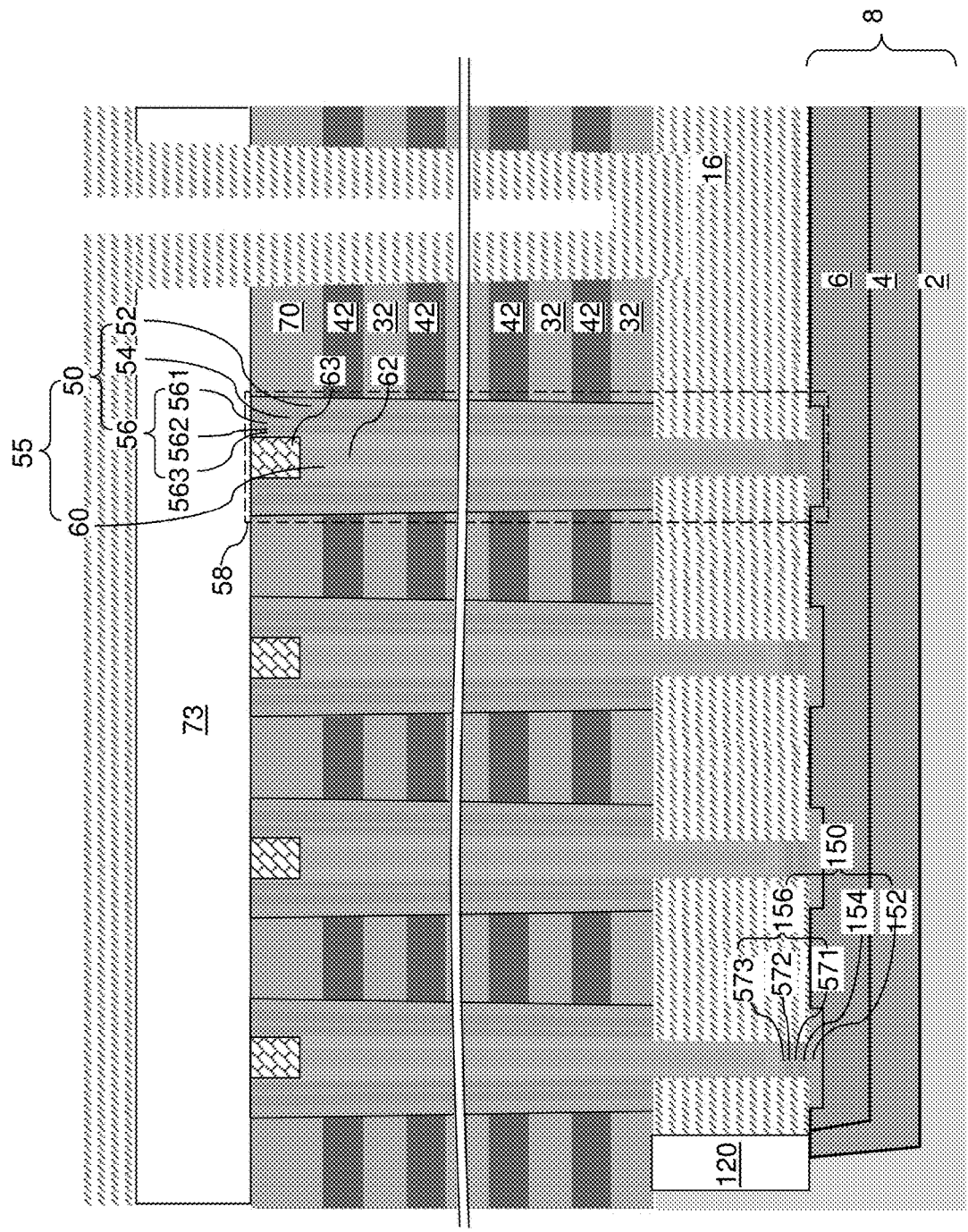
FIG. 23 is a schematic vertical cross-sectional view of the second exemplary structure after deposition of a doped semiconductor material layer according to an embodiment of the present disclosure.

Referring to FIG. 23, the processing steps of FIGS. 9A and 9B can be performed to form a source-level semiconductor material layer 16. The source-level semiconductor material layer 16 is formed within the volume of the source-level cavity 19 and at peripheral regions of the backside trenches 79 and over the top surface of the contact level dielectric layer 73. The source-level semiconductor material layer 16 is formed by deposition of the doped semiconductor material having a doping of the first conductivity type on sidewalls of the vertical semiconductor channels 60 and a top surface of the first conductivity type semiconductor layer 6. As a consequence, the source-level semiconductor material layer 16 adjoins, and directly contacts, bottom end portions of the vertical semiconductor channels 60, and laterally surrounds the semiconductor pillar structures 12.

The source-level semiconductor material layer 16 is formed directly on the lower portion of the outer sidewall of each of the vertical semiconductor channels 60. In one embodiment, the doped semiconductor material of the source-level semiconductor material layer 16 can include doped polysilicon. The atomic concentration of dopants of the first conductivity type in the source-level semiconductor material layer 16 can be in a range from $1.0 \times 10^{14}/cm^3$ to $1.0 \times 10^{19}/cm^3$, although lesser and greater atomic concentrations can also be used. The source-level semiconductor material layer 16 is electrically isolated from the substrate semiconductor material layer 2 by a series of two p-n junctions having opposite polarities.

Figure 24:
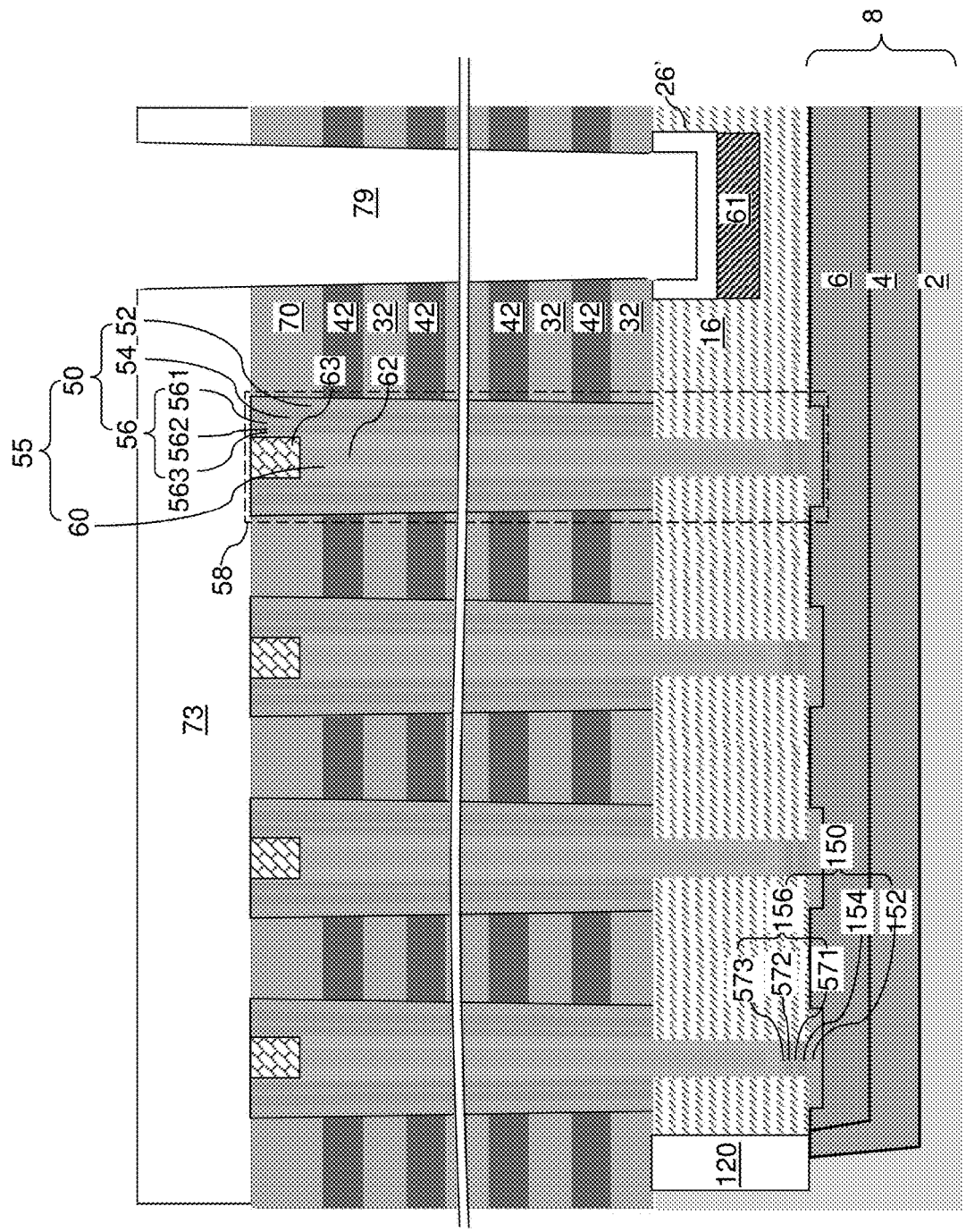
FIG. 24 is a vertical cross-sectional view of the second exemplary structure after formation of a source region and a sacrificial semiconductor oxide portion according to an embodiment of the present disclosure.

Referring to FIG. 24, the processing steps of FIG. 10 can be performed to remove portions of the source-level semiconductor material layer 16 located inside the backside trenches 79 or over the contact level dielectric layer 73 by an isotropic etch process. Remaining portions of the source-level semiconductor material layer 16 can be located entirely within a source level, which is the volume between the top surface of the first conductivity type semiconductor layer 6 and the bottom surface of the bottommost insulating layer 32 of the alternating stack (32, 42).

Dopants of the second conductivity can be implanted through the backside trenches into underlying portions of the source-level semiconductor material layer 16. Implanted portions of the source-level semiconductor material layer 16 are converted into doped semiconductor material portions having a doping of the second conductivity type, which function as source regions 61. The net dopant concentration in the source regions 61 (i.e., the atomic concentration of dopants of the second conductivity type less the atomic concentration of dopants of the first conductivity type) can be in a range from $5.0 \times 10^{19}/cm^3$ to $2.0 \times 10^{21}/cm^3$, although lesser and greater atomic concentrations can also be used. The source regions 61 may, or may not, contact a top surface of the first conductivity type semiconductor layer 6. A p-n junction is formed between each source region 61 and the source-level semiconductor material layer 16. Optionally, an oxidation process can be performed to covert physically exposed surface portions of the source-level semiconductor material layer 16 and the source regions 61 into sacrificial semiconductor oxide portions 26'. Each source region 61 can be formed at a bottom portion of a respective backside trench 79 directly on the source-level semiconductor material layer 16.

Figure 25:
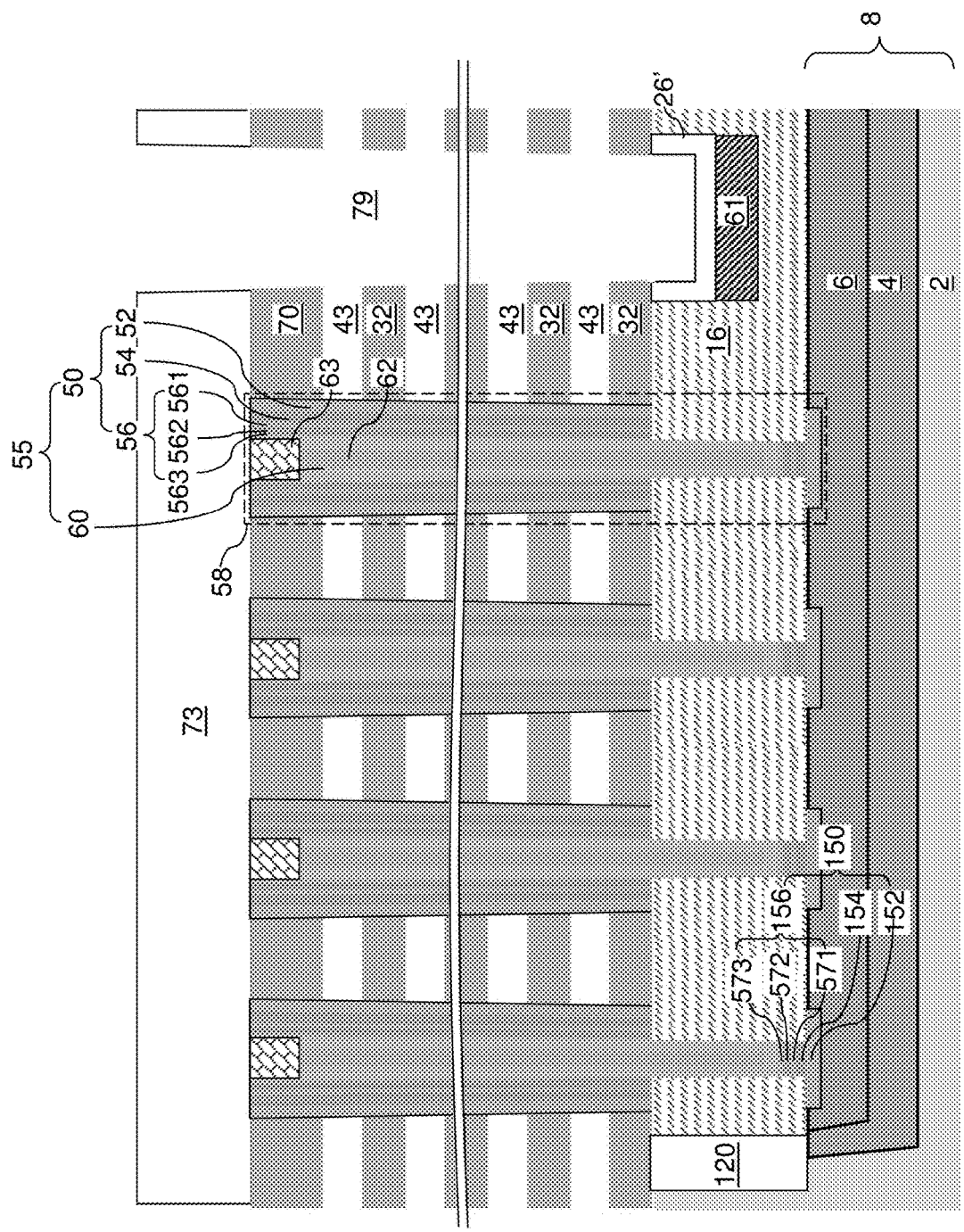
FIG. 25 is a schematic vertical cross-sectional view of the second exemplary structure after formation of backside recesses according to an embodiment of the present disclosure.

Referring to FIG. 25, the processing steps of FIG. 11 can be performed to remove the sacrificial material layers 42 selective to the insulating layers 32, and to form backside recesses 43 in the volumes from which the sacrificial material layers 42 are removed. A backside recess 43 can be vertically bounded by a top surface of an underlying insulating layer 32 and a bottom surface of an overlying insulating layer 32. In one embodiment, each backside recess 43 can have a uniform height throughout.

Figure 26:
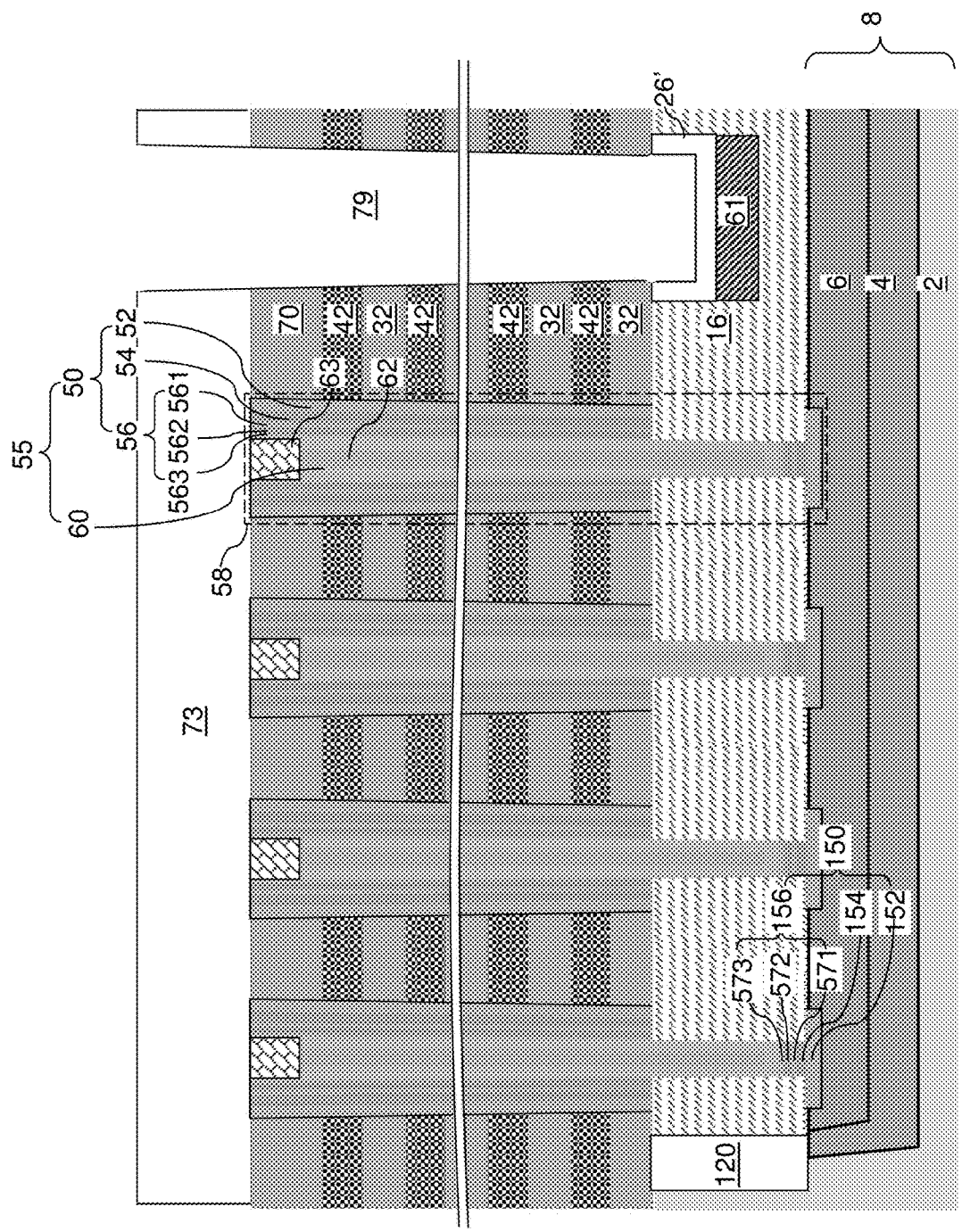
FIG. 26 is a schematic vertical cross-sectional view of the second exemplary structure after formation of electrically conductive layers according to an embodiment of the present disclosure.

Referring to FIG. 26, the processing steps of FIG. 12 can be performed to form electrically conductive layers 46 in the backside trenches. The sacrificial material layers 42 are replaced with the electrically conductive layers 46. Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55.

Figure 27:
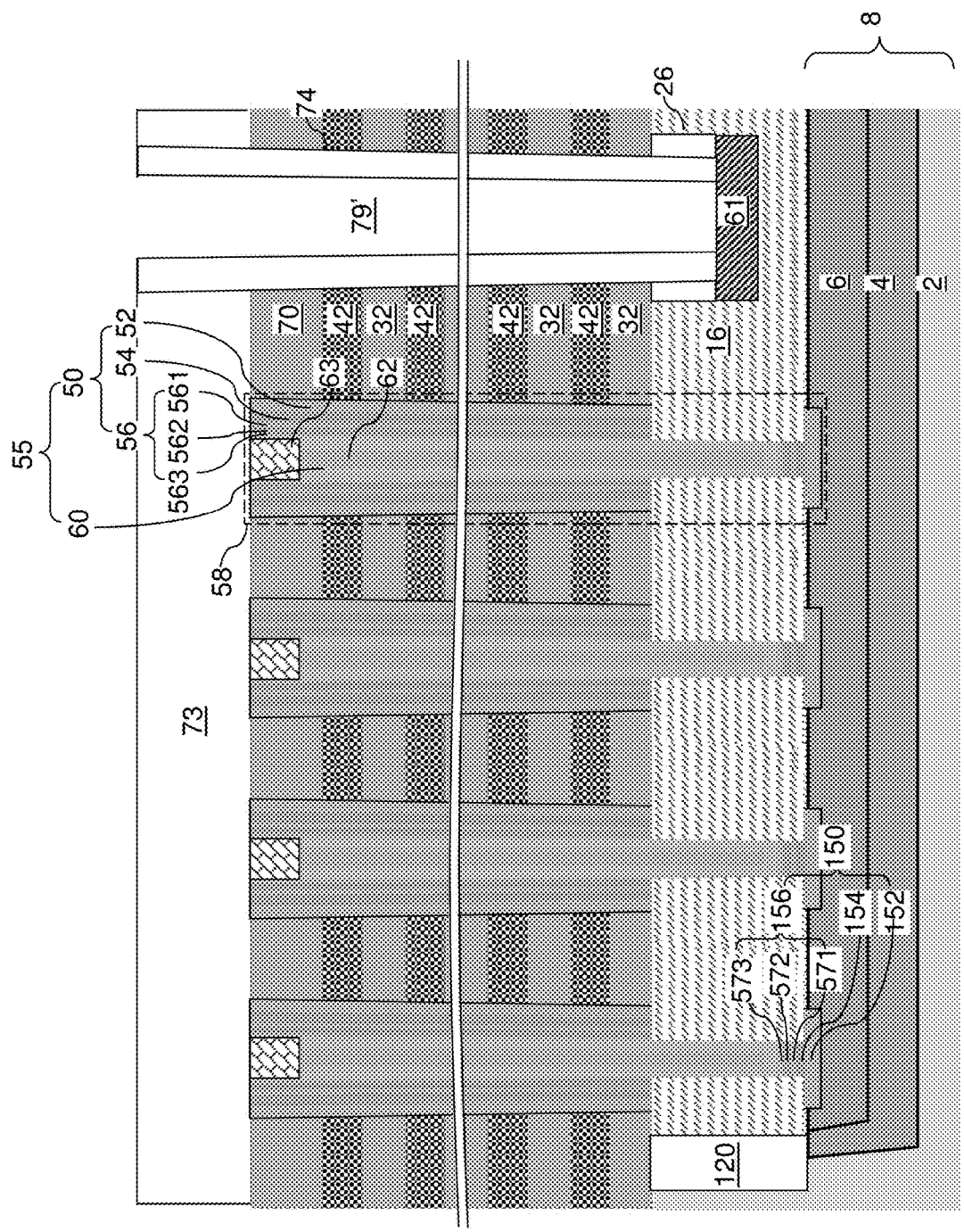
FIG. 27 is a schematic vertical cross-sectional view of the second exemplary structure after formation of an insulating spacer in the backside trench according to an embodiment of the present disclosure.

Referring to FIG. 27, the processing steps of FIG. 13 can be performed to form an insulating spacer 74 within each backside trench 79. A center portion of each sacrificial semiconductor oxide portion 26' may be removed during the anisotropic etch process to provide a semiconductor oxide spacer 26 having a tubular configuration and laterally surrounding a respective insulating spacer 74. Alternatively, the entirety of each sacrificial semiconductor oxide portion 26' may be removed by the anisotropic etch process. A backside cavity 79' is present within a volume surrounded by each insulating spacer 74. A top surface of a source region 61 can be physically exposed at the bottom of each backside trench 79.

Figure 28:
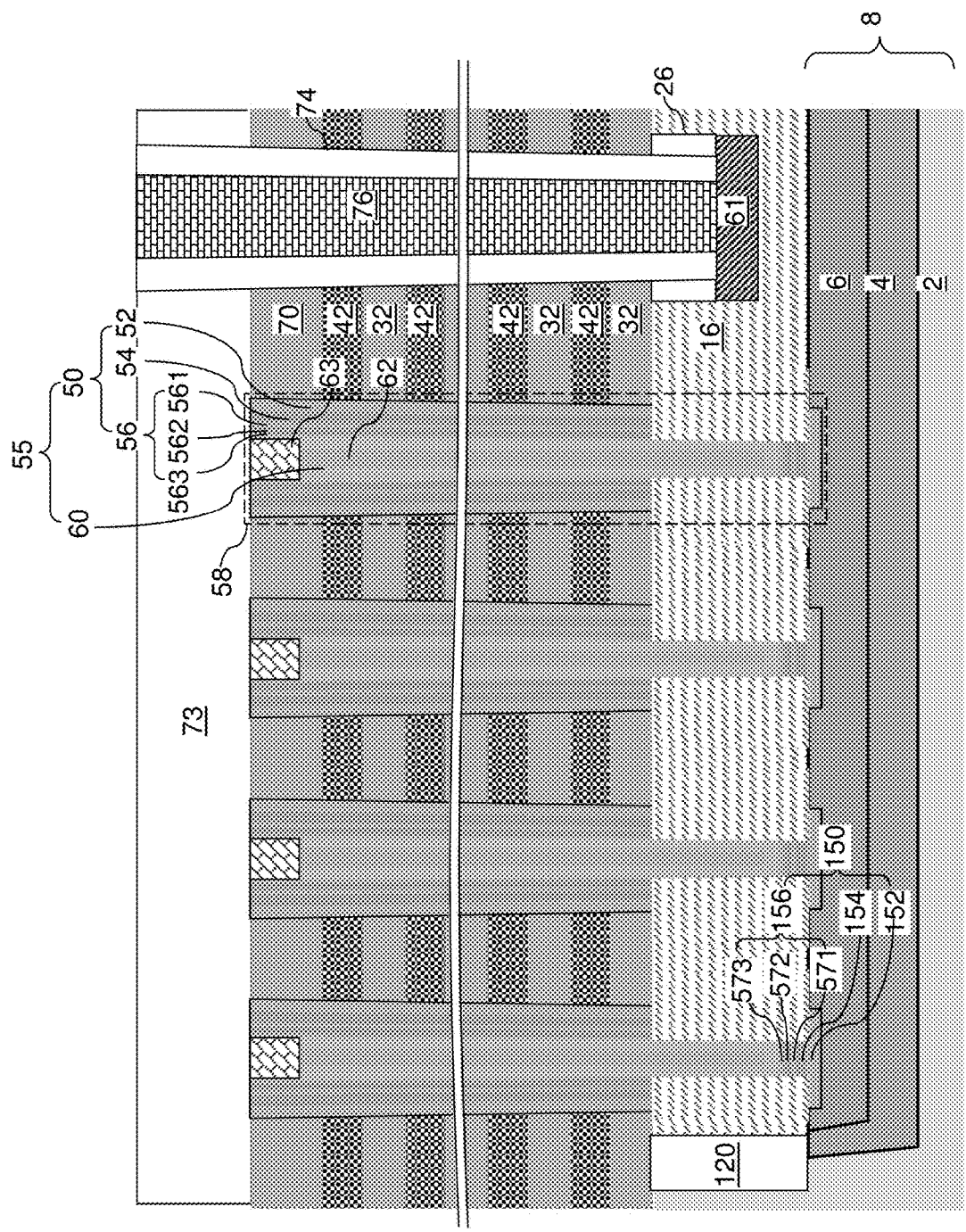
FIG. 28 is a schematic vertical cross-sectional view of the second exemplary structure after formation of a backside contact via structure according to an embodiment of the present disclosure.

Referring to FIG. 28, the processing steps of FIG. 14 can be performed to form a backside contact via structure 76 within each backside cavity 79' directly on a respective one of the source regions 61. Each backside contact via structure 76 extends through the alternating stack (32, 46), and contacts a top surface of the source region 61. Subsequently, the processing steps of FIG. 15 can be performed to form additional contact via structures (88, 86) through the contact level dielectric layer 73, and optionally through the retro-stepped dielectric material portion 65. The additional contact via structures (88, 85) can include drain contact via structures 88 and word line contact via structures 86 as illustrated in FIG. 15.

Referring to FIGS. 29A and 29B, a third exemplary structure according to a third embodiment of the present disclosure is shown, which can be the same as the first exemplary structure illustrated in FIGS. 1A and 1B.

Referring to FIGS. 30A and 30B, a dielectric liner layer 14 is formed on a top surface of the substrate semiconductor material layer 2. The dielectric liner layer 14 may be a semiconductor oxide layer that is formed by oxidation of physically exposed surface portions of the substrate semiconductor material layer 2. For example, the substrate semiconductor material layer 2 can include single crystalline silicon, and the dielectric liner layer 14 can include a thermal silicon oxide layer having a thickness in a range from 6 nm to 60 nm, although lesser and greater thicknesses can also be used. Alternatively, the dielectric liner layer 14 may be formed by deposition of a dielectric material. For example, the dielectric liner layer 14 may include densified TEOS oxide (i.e., silicon oxide formed by thermal decomposition of TEOS and subsequent densification), a dielectric metal oxide (such as aluminum oxide), silicon nitride, silicon oxynitride, or a combination thereof.

Referring to FIGS. 31A and 31B, a source-level metallic layer 18 can be deposited as a continuous material layer on the dielectric liner layer 14. The source-level metallic layer 18 includes at least one metallic material such as a conductive metallic nitride (such as TiN, TaN, or WN), an elemental metal (such as W, Mo, Ti, Ni), a metallic alloy, or a metal silicide material. The at least one metallic material can be deposited by an isotropic deposition process or an anisotropic deposition process. The thickness of horizontal portions of the source-level metallic layer 18 can be in a range from 5 nm to 100 nm, although lesser and greater thicknesses can also be used. The source-level metallic layer 18 is electrically isolated from the substrate semiconductor material layer 2 by the dielectric liner layer 14.

A source-level sacrificial layer 15 is formed on the source-level metallic layer 18. The source-level sacrificial layer 15 can have the same material composition as in the first and second embodiments, and may be formed by the same methods as in the first and second embodiments. Excess portions of the source-level sacrificial layer 15 can be removed from above the horizontal plane including top surfaces of the semiconductor pillar structures 12 by a chemical mechanical planarization (CMP) process. Portions of the dielectric liner layer 14 and the source-level metallic layer 18 that overlie the horizontal plane including the top surfaces of the semiconductor pillar structures 12 can be collaterally removed during the CMP process. Top surfaces of the semiconductor pillar structures 12 and annular top surfaces of remaining portions of the source-level metallic layer 18 can be physically exposed after the CMP process. The source-level sacrificial layer 15 has a planar top surface that is coplanar with the top surfaces of the semiconductor pillar structures 12. The semiconductor pillar structures 12, the dielectric liner layer 14, the source-level metallic layer 18, and the source-level sacrificial layer 15 are collectively referred to as a pillar-level assembly 21.

Figure 32:
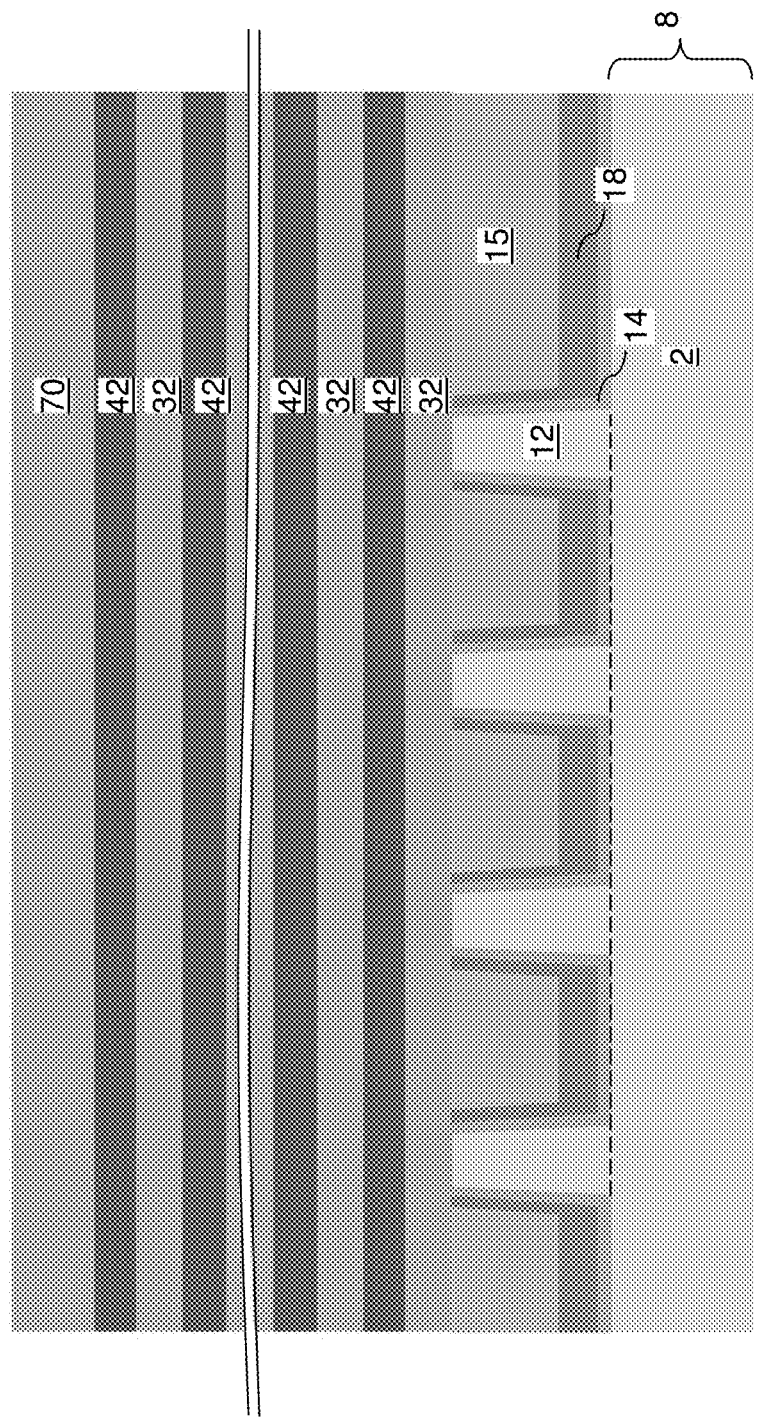
FIG. 32 is a schematic vertical cross-sectional view of the third exemplary structure after formation of an alternating stack of insulating layers and sacrificial material layers according to an embodiment of the present disclosure.

Referring to FIG. 32, the processing steps of FIGS. 4A-4C can be performed to form an alternating stack of insulating layers 32 and sacrificial material layers 42, an insulating cap layer 70, stepped surfaces of the alternating stack (32, 42) (that are formed in a staircase region 300 as illustrated in FIG. 4B), and a retro-stepped dielectric material portion 65 (as illustrated in FIG. 4B). The bottommost insulating layer 32 of the alternating stack (32, 42) can be formed on the top surfaces of the semiconductor pillar structures 12, the dielectric liner layer 14, the source-level metallic layer 18, and the source-level sacrificial layer 15 and a top surface of an unrecessed portion of the substrate semiconductor material layer 2.

Figure 33:
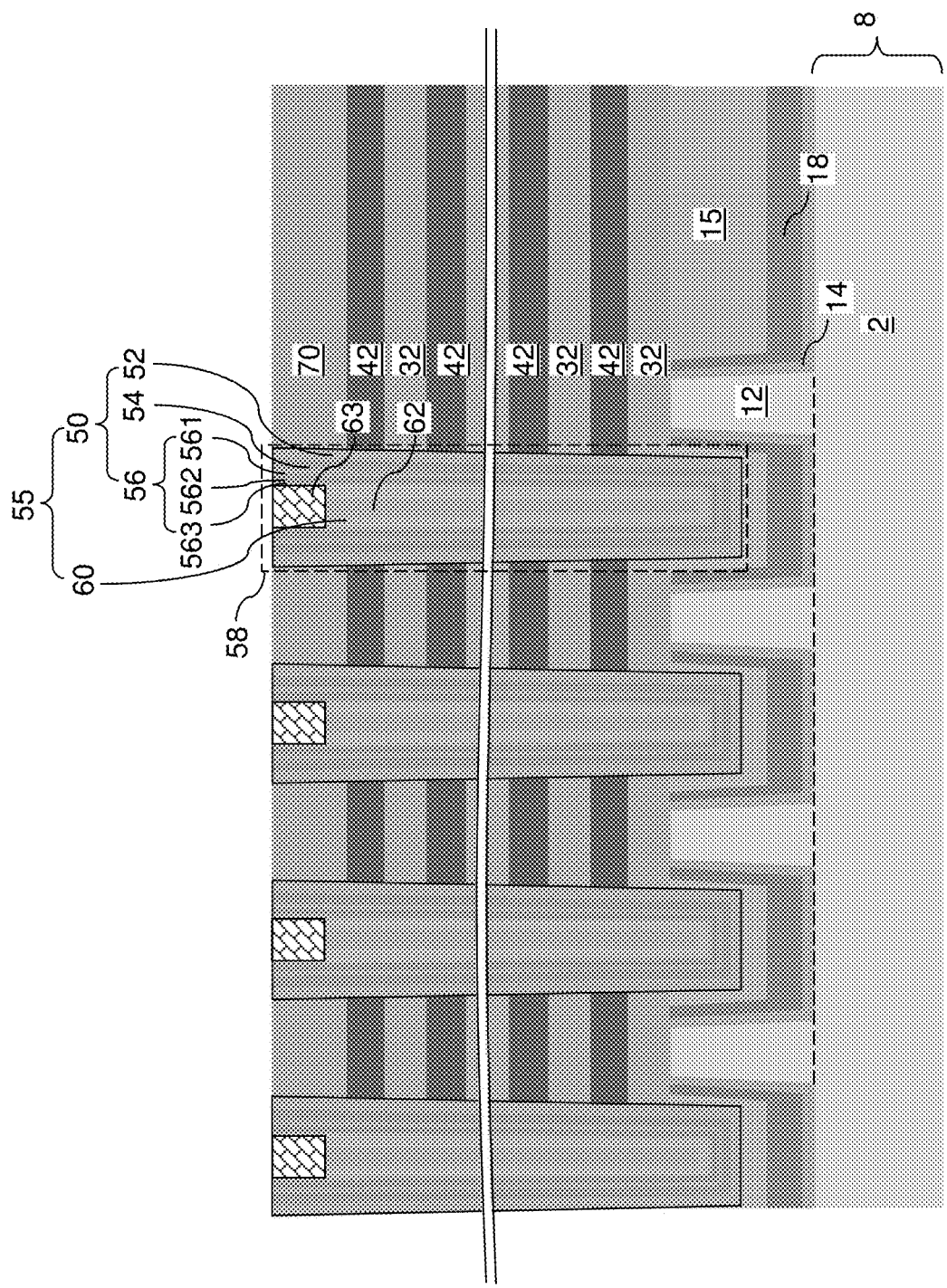
FIG. 33 is a schematic vertical cross-sectional view of the third exemplary structure after formation of memory stack structures according to an embodiment of the present disclosure.

Referring to FIG. 33, the processing steps of FIGS. 5A-5D can be performed to form memory openings and support openings. Surfaces of the source-level sacrificial layer 15 can be exposed at the bottom of each memory opening. Each memory opening can be laterally and vertically spaced from the source-level metallic layer 18 by a remaining portion of the source-level sacrificial layer 15. Each support opening can extend into surface regions of unrecessed portions of the substrate semiconductor material layer 2 in the staircase region 300.

A memory opening fill structure 58 is formed in each memory opening, and a support pillar structure 20 is formed in each support opening. Each memory opening fill structure 58 includes a memory stack structure 55. Each memory stack structure 55 is a combination of a vertical semiconductor channel 60, a tunneling dielectric layer 56, a plurality of memory elements comprising portions of the charge storage layer 54, and an optional blocking dielectric layer 52. Each memory opening fill structure 58 extends into, and contacts, an upper portion of the first conductivity type semiconductor layer 6. The memory opening fill structures 58 are formed in the memory array region 100, and the support pillar structures 20 are formed in the staircase region 300 as illustrated in FIG. 5C.

Figure 34:
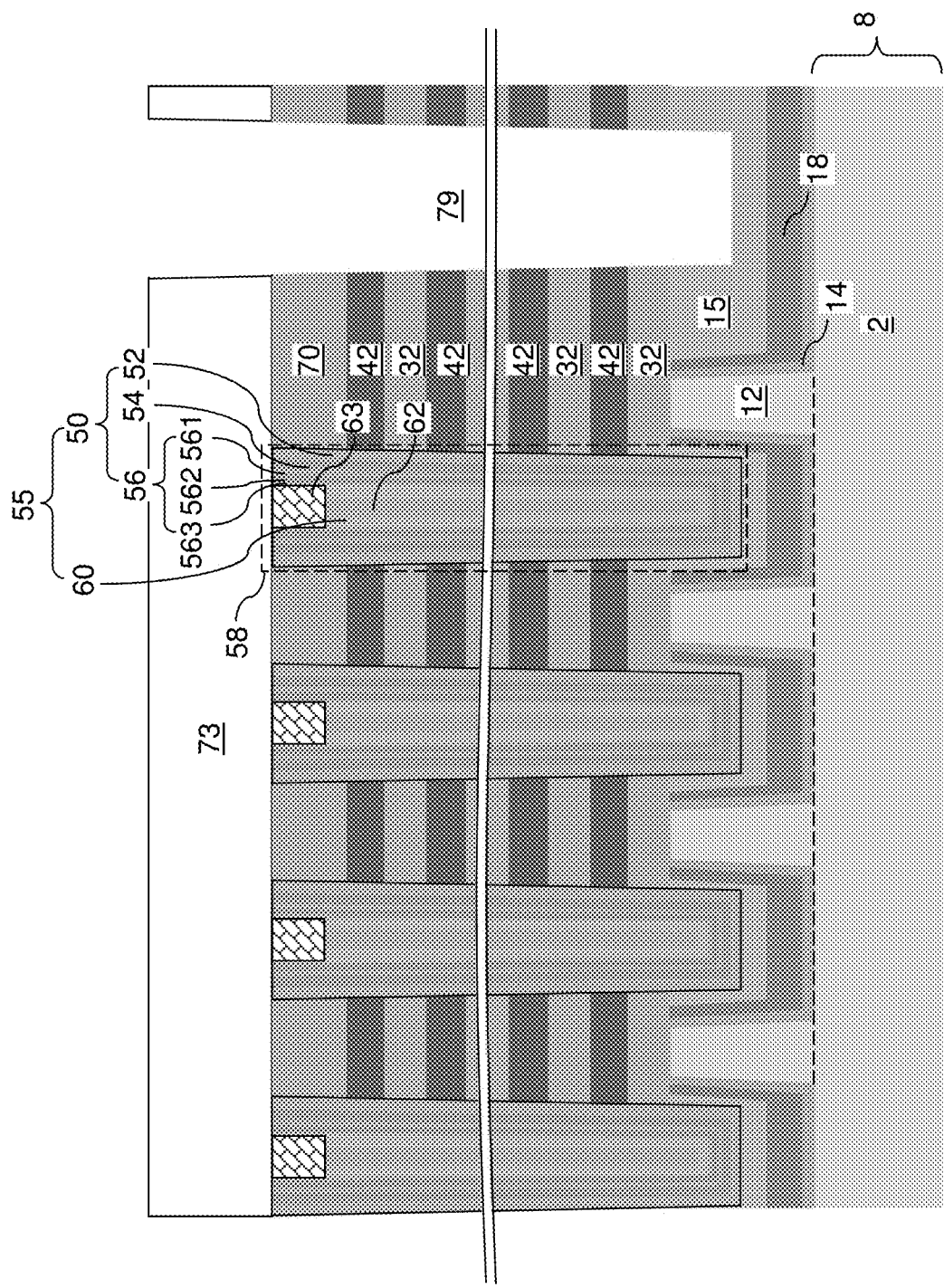
FIG. 34 is a schematic vertical cross-sectional view of the third exemplary structure after formation of backside trenches according to an embodiment of the present disclosure.

Referring to FIG. 34, the processing steps of FIGS. 6A-6C can be performed to form a contact level dielectric layer 73 and backside trenches 79. The backside trenches 79 vertically extend from the top surface of the contact level dielectric layer 73 and at least to the top surface of the source-level sacrificial layer 15, and laterally extend through the memory array region 100 and the staircase region 300 (See FIG. 6C). In one embodiment, the backside trenches 79 can laterally extend along the first horizontal direction hd1. The photoresist layer can be removed, for example, by ashing. Each backside trench 79 can have a uniform width that is invariant along the lengthwise direction (i.e., along the first horizontal direction hd1). The material of the source-level sacrificial layer 15 is physically exposed at the bottom of each backside trench 79.

Figure 35:
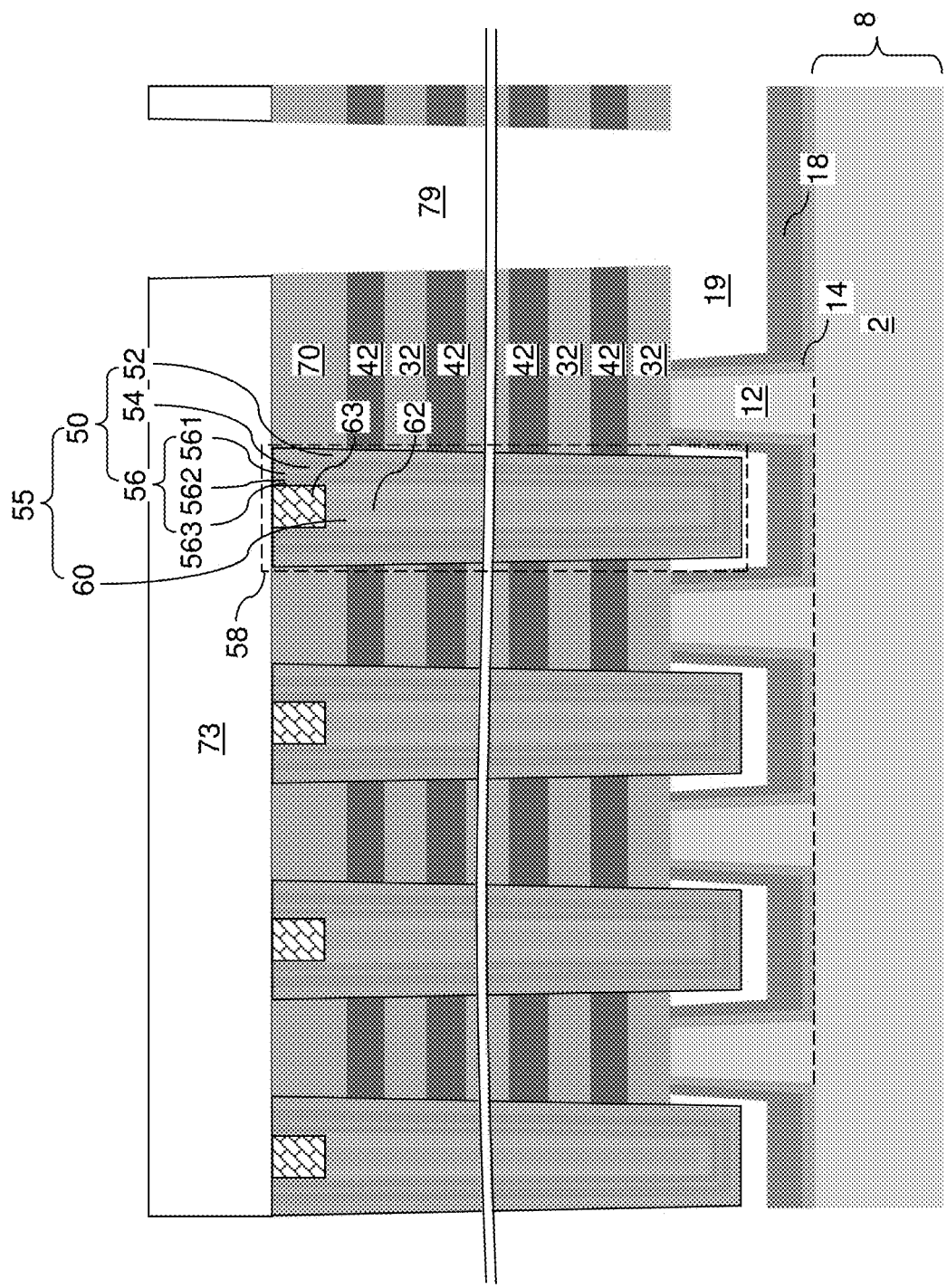
FIG. 35 is a schematic vertical cross-sectional view of the third exemplary structure after formation of a source-level cavity according to an embodiment of the present disclosure.

Referring to FIG. 35, the processing steps of FIGS. 7A and 7B can be performed to form a source-level cavity 19. An isotropic etch process can be used to etch the material of the source-level sacrificial layer 15 selective to the materials of the alternating stack (32, 42), the contact level dielectric layer 73, the insulating cap layer 70, the retro-stepped dielectric material portion 65, and the source-level metallic layer 18. The isotropic etchant can be introduced into the backside trenches 79 during the isotropic etch process. The source-level cavity 19 is formed by removing the source-level sacrificial layer 15 while the semiconductor pillar structures 12 provide mechanical support to the alternating stack (32, 42). Surfaces of bottom regions of the outer sidewalls of the memory films 50 are physically exposed to the source-level cavity 19.

Figure 36:
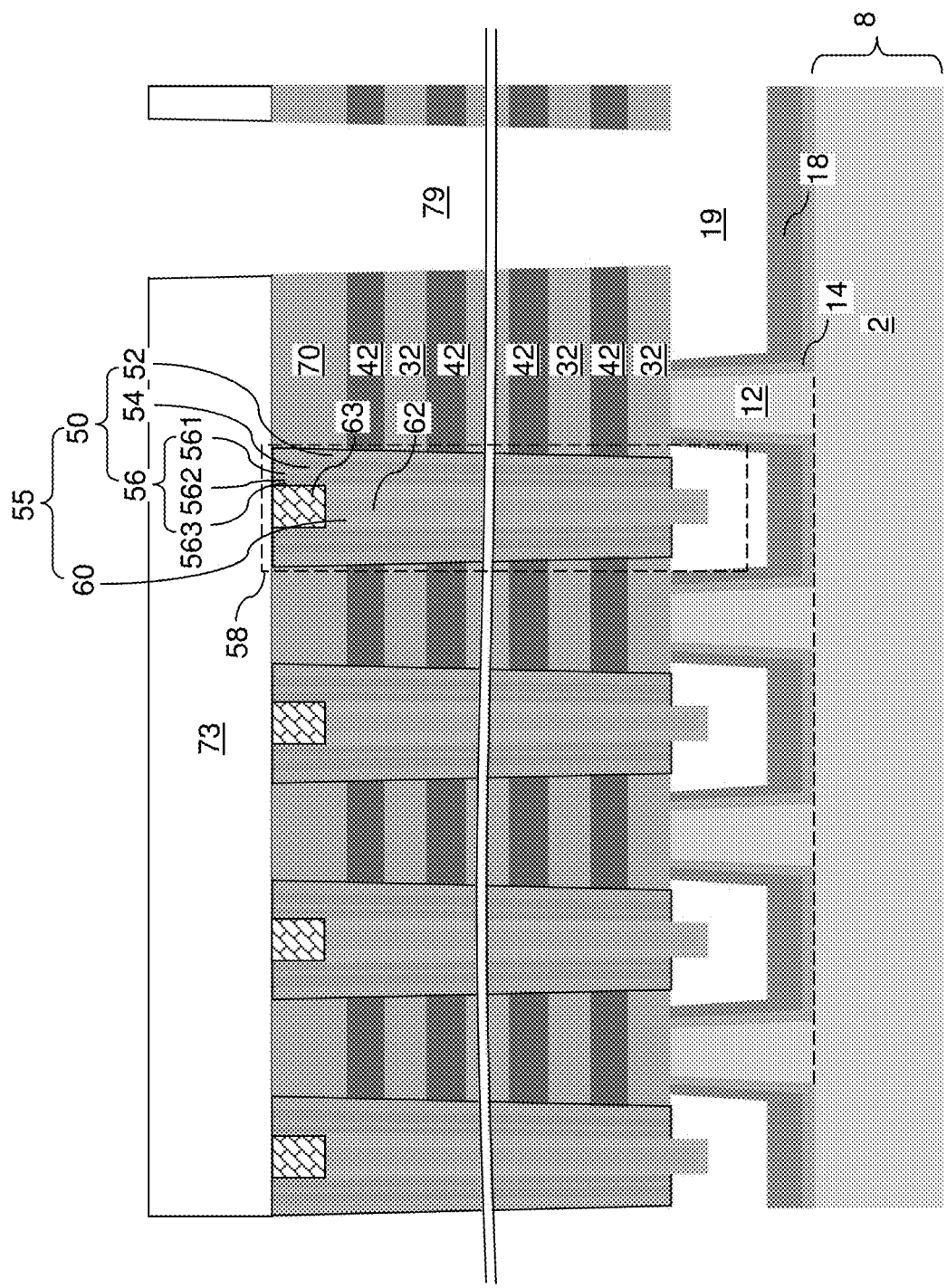
FIG. 36 is a schematic vertical cross-sectional view of the third exemplary structure after removal of physically exposed portions of the memory films and the dielectric liner layer according to an embodiment of the present disclosure.

Referring to FIG. 36, the processing steps of FIGS. 8A and 8B can be performed to etch physically exposed portions of the memory films 50. A sequence of isotropic etchants, such as wet etchants, is applied to sequentially etch, from outside to inside, the various component layers of physically exposed portions of the memory films 50. The physically exposed portions of the memory films 50 include bottom portions and cylindrical portions of the memory films 50 that are located below the bottommost surface of the alternating stack (32, 42) and above the source-level metallic layer 18. A bottom surface and a lower portion of an outer sidewall of each of the vertical semiconductor channels 60 are physically exposed by the isotropic etch process. The source-level cavity 19 is expanded in volume by removal of the physically exposed portions of the memory films 50. A top surface and sidewalls of the source-level metallic layer 18 and a bottom surface of the bottommost insulating layer 32 can be physically exposed to the source-level cavity 19.

Figure 37:
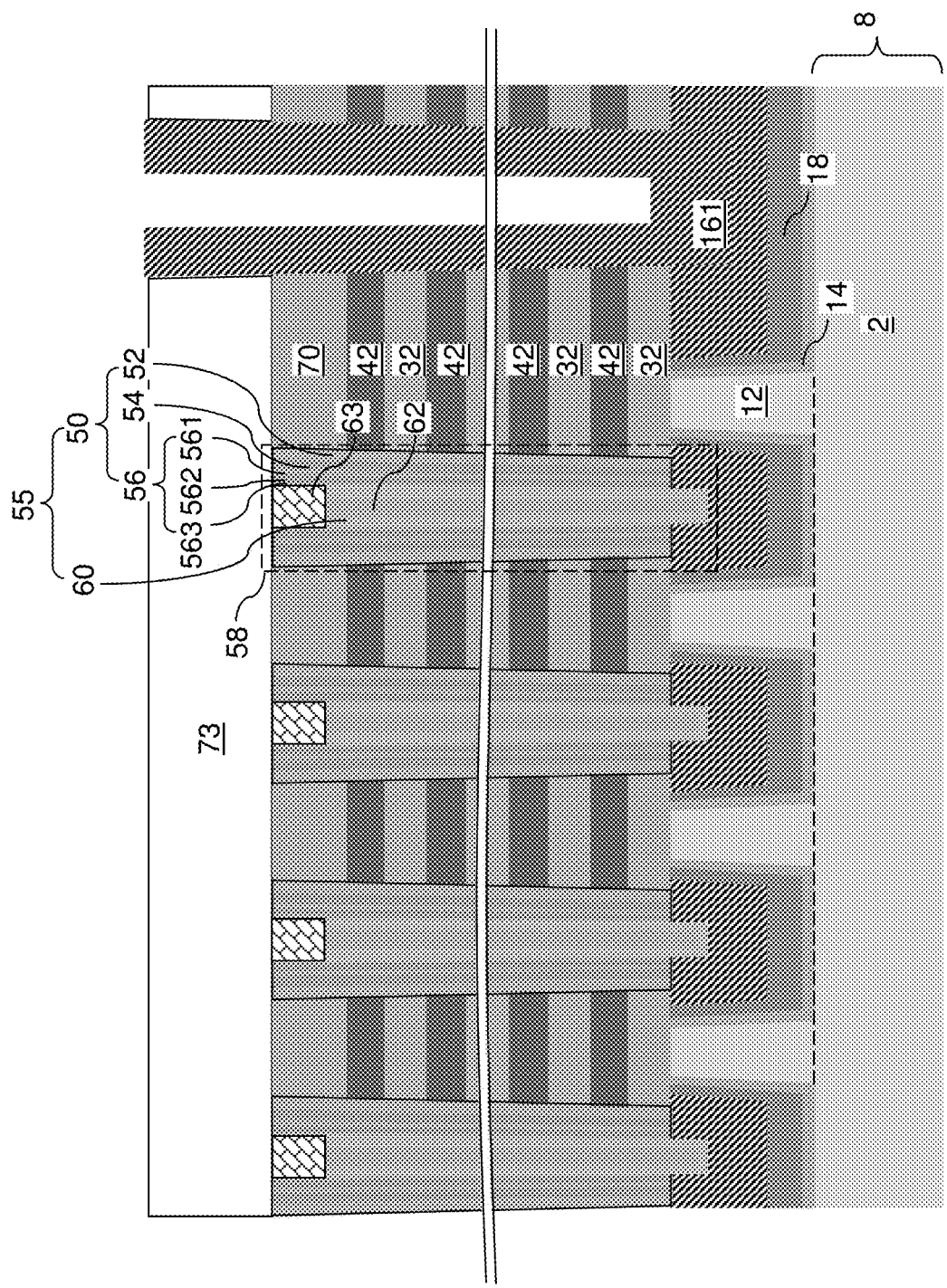
FIG. 37 is a schematic vertical cross-sectional view of the third exemplary structure after deposition of a doped semiconductor material layer according to an embodiment of the present disclosure.

Referring to FIG. 37, a doped semiconductor material having a doping of the second conductivity type can be deposited in the source-level cavity 19 by a selective semiconductor deposition process or by a non-selective semiconductor deposition process. A semiconductor precursor gas, such as silane, disilane or dichlorosilane, and a dopant precursor gas can be flowed into a process chamber including the exemplary structure with an optional etchant gas such as hydrogen chloride. The deposited doped semiconductor material layer is herein referred to as a source-level semiconductor material layer 161. The source-level semiconductor material layer 161 is formed within the volume of the source-level cavity 19 and at peripheral regions of the backside trenches 79 and over the top surface of the contact level dielectric layer 73. The source-level semiconductor material layer 161 is formed by deposition of the doped semiconductor material having a doping of the second conductivity type on bottom surfaces and sidewalls of the vertical semiconductor channels 60. As such, the source-level semiconductor material layer 161 functions as a common source region for a plurality of vertical semiconductor channels 60. A p-n junction is formed at each interface between a vertical semiconductor channel 60 and the source-level semiconductor material layer 161. The source-level metallic layer 18 provides a high-conductivity parallel conductive path for the source-level semiconductor material layer 161. The combination of the source-level semiconductor material layer 161 and the source-level metallic layer 18 are electrically isolated from the substrate semiconductor material layer 2 and the semiconductor pillar structures 12 by the dielectric liner layer 14. The source-level semiconductor material layer 161 adjoins, and directly contacts, bottom end portions of the vertical semiconductor channels 60, and laterally surrounds the semiconductor pillar structures 12.

The source-level semiconductor material layer 161 is formed directly on the lower portion of the outer sidewall of each of the vertical semiconductor channels 60. In one embodiment, the doped semiconductor material of the source-level semiconductor material layer 161 can include doped polysilicon. The atomic concentration of dopants of the second conductivity type in the source-level semiconductor material layer 161 can be in a range from $5.0 \times 10^{19}/cm^3$ to $2.0 \times 10^{21}/cm^3$, although lesser and greater atomic concentrations can also be used.

Figure 38:
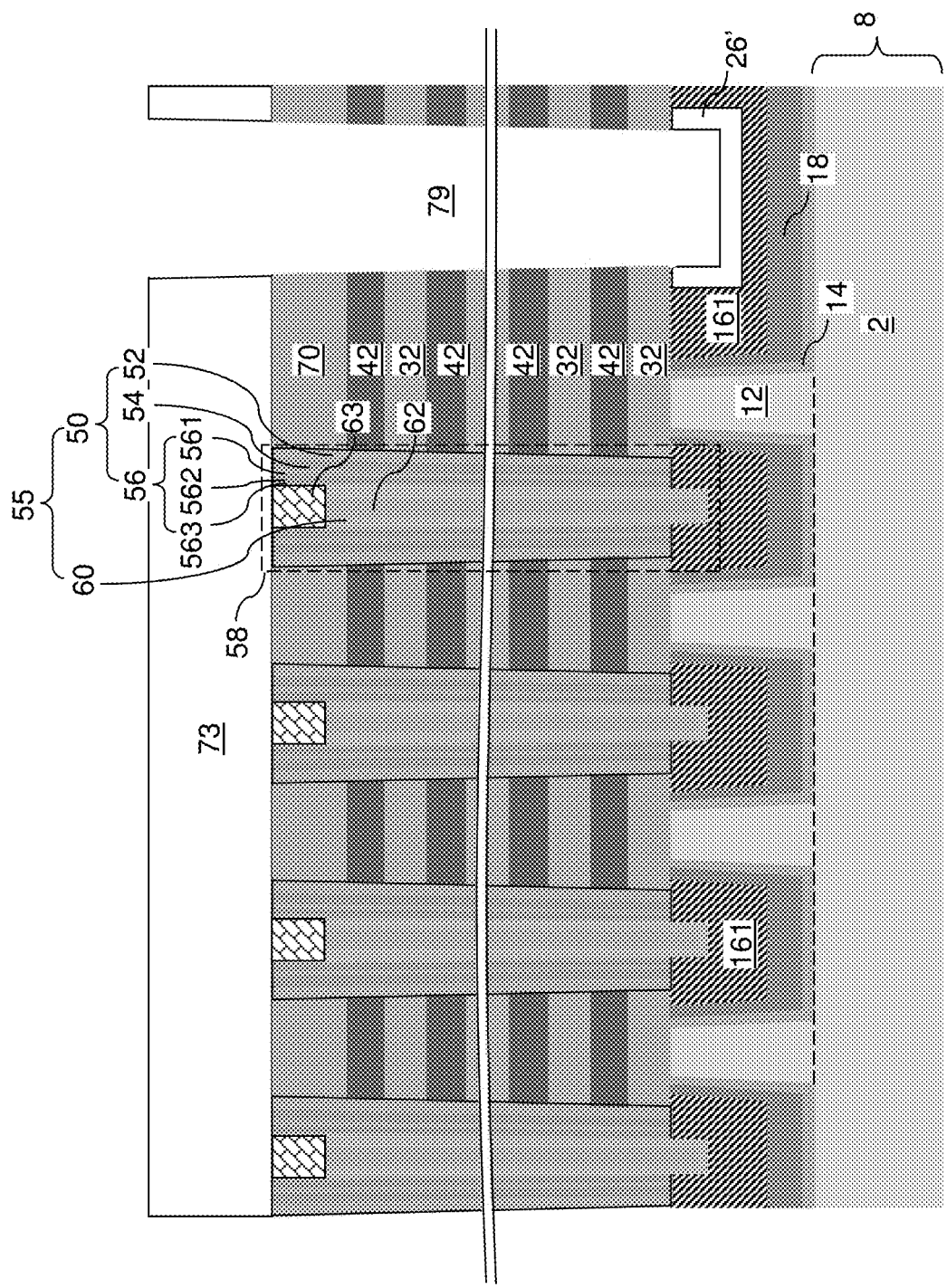
FIG. 38 is a vertical cross-sectional view of the third exemplary structure after formation of a source region and a sacrificial semiconductor oxide portion according to an embodiment of the present disclosure.

Referring to FIG. 38, portions of the source-level semiconductor material layer 161 located inside the backside trenches 79 or over the contact level dielectric layer 73 can be removed by an isotropic etch process. Remaining portions of the source-level semiconductor material layer 161 can be located entirely within a source level, which is the volume between the top surface of the substrate semiconductor material layer 2 in the memory array region and the bottom surface of the bottommost insulating layer 32 of the alternating stack (32, 42). Optionally, an oxidation process can be performed to covert physically exposed surface portions of the source-level semiconductor material layer 161 into sacrificial semiconductor oxide portions 26'.

Figure 39:
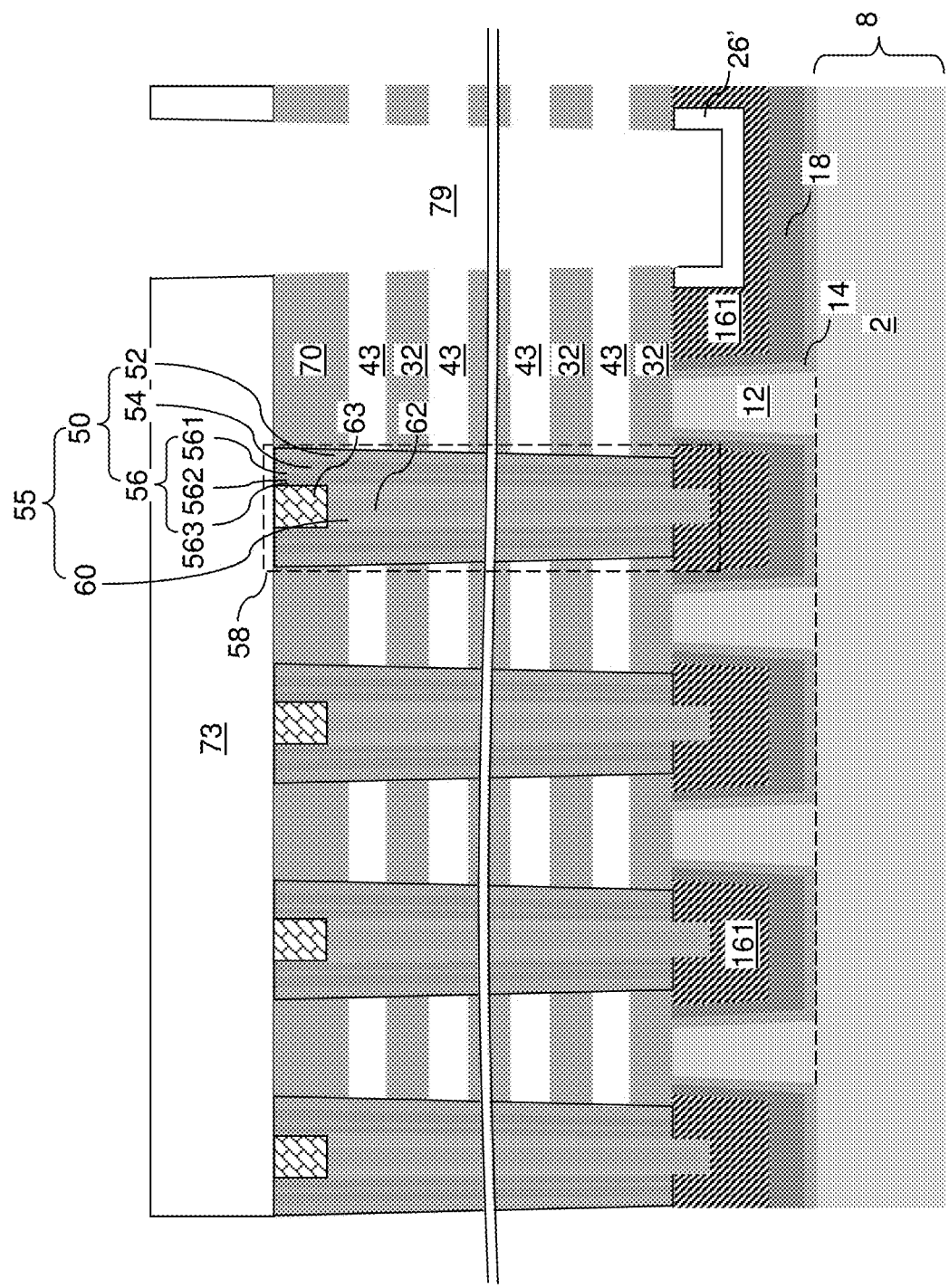
FIG. 39 is a schematic vertical cross-sectional view of the third exemplary structure after formation of backside recesses according to an embodiment of the present disclosure.

Referring to FIG. 39, the processing steps of FIG. 11 can be performed to remove the sacrificial material layers 42 selective to the insulating layers 32, and to form backside recesses 43 in the volumes from which the sacrificial material layers 42 are removed. A backside recess 43 can be vertically bounded by a top surface of an underlying insulating layer 32 and a bottom surface of an overlying insulating layer 32. In one embodiment, each backside recess 43 can have a uniform height throughout.

Figure 40:
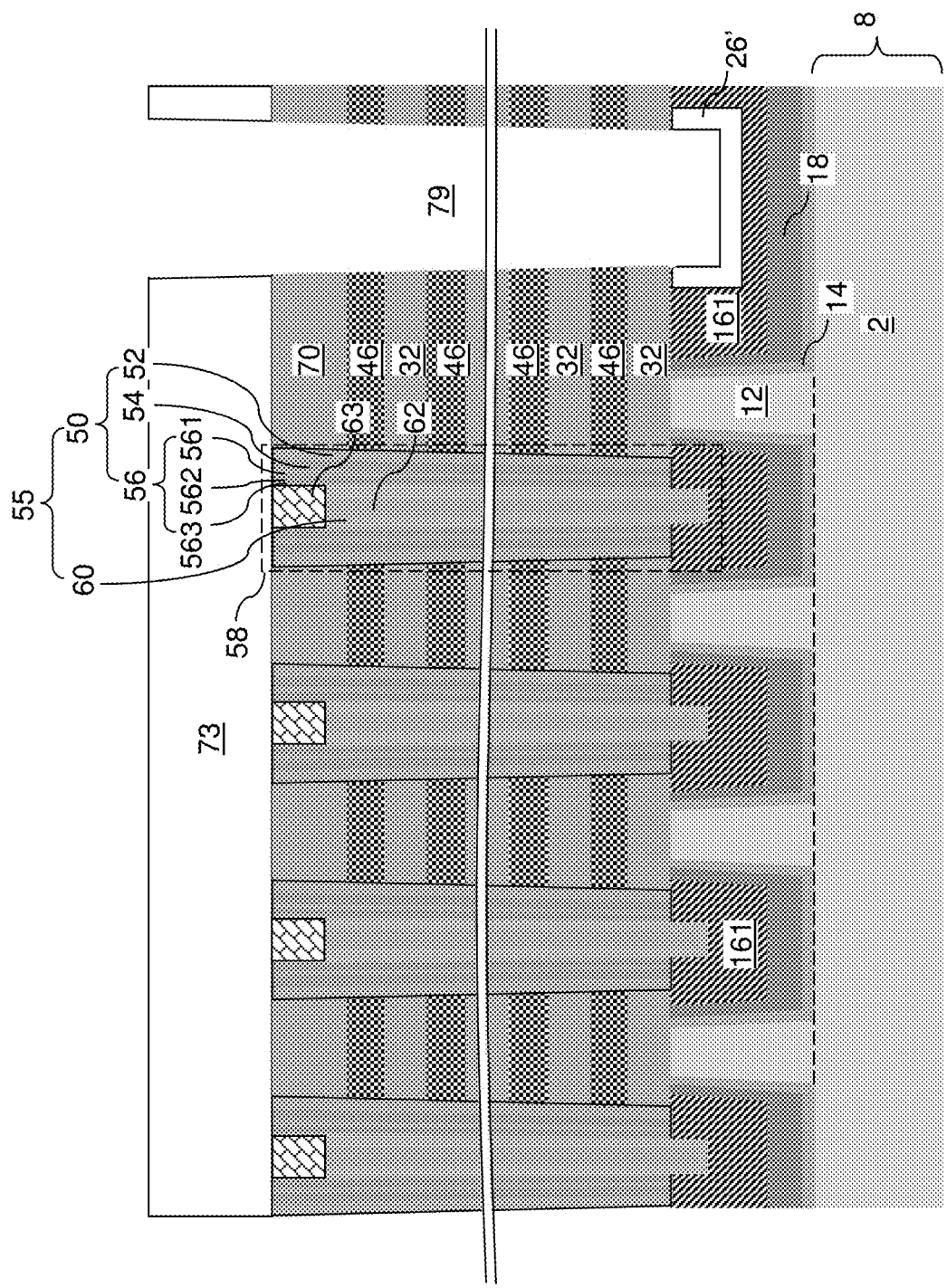
FIG. 40 is a schematic vertical cross-sectional view of the third exemplary structure after formation of electrically conductive layers according to an embodiment of the present disclosure.

Referring to FIG. 40, the processing steps of FIG. 12 can be performed to form electrically conductive layers 46 in the backside trenches. The sacrificial material layers 42 are replaced with the electrically conductive layers 46. Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55.

Figure 41:
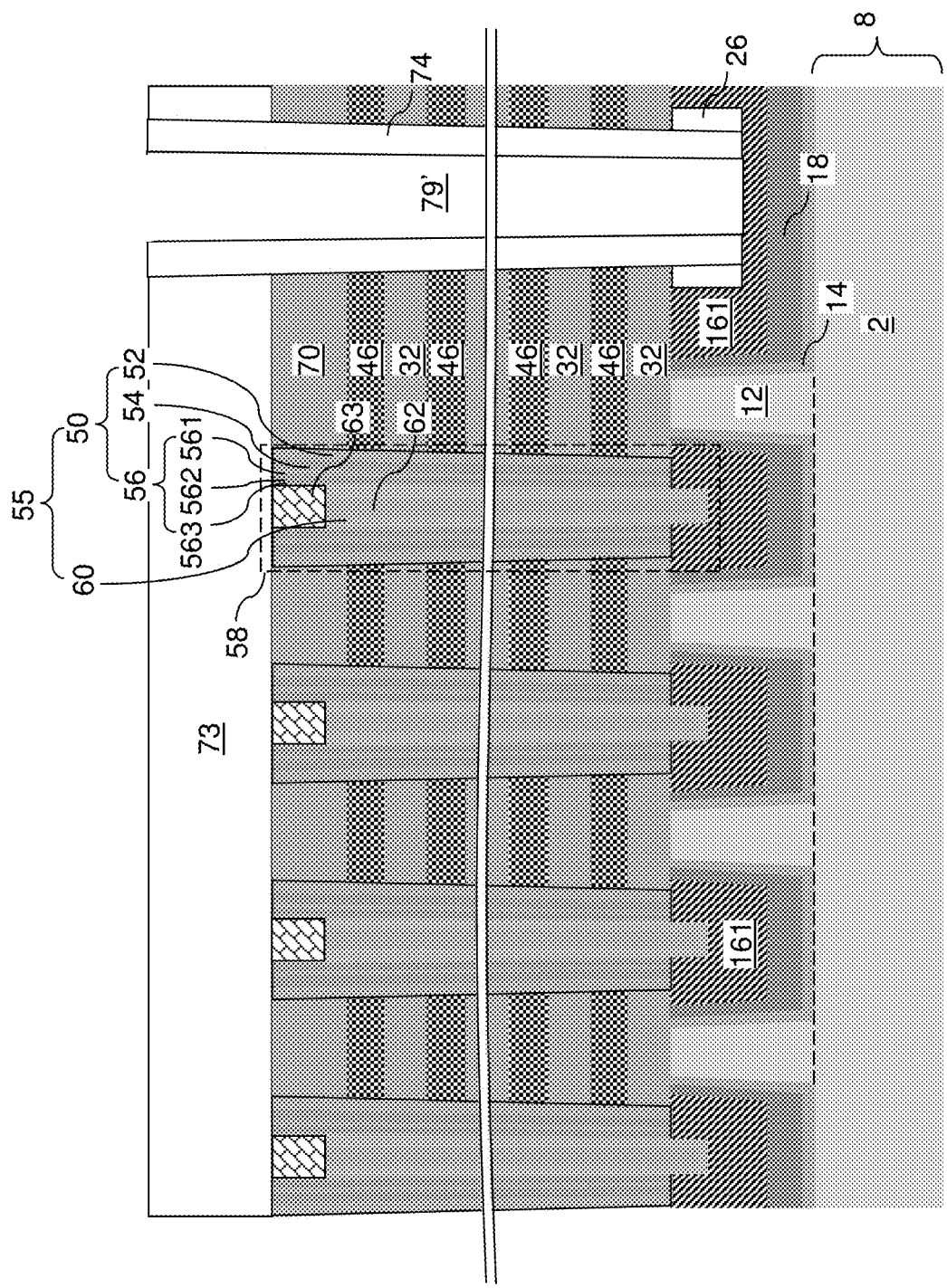
FIG. 41 is a schematic vertical cross-sectional view of the third exemplary structure after formation of an insulating spacer in the backside trench according to an embodiment of the present disclosure.

Referring to FIG. 41, the processing steps of FIG. 13 can be performed to form an insulating spacer 74 within each backside trench 79. A center portion of each sacrificial semiconductor oxide portion 26' may be removed during the anisotropic etch process to provide a semiconductor oxide spacer 26 having a tubular configuration and laterally surrounding a respective insulating spacer 74. Alternatively, the entirety of each sacrificial semiconductor oxide portion 26' may be removed by the anisotropic etch process. A backside cavity 79' is present within a volume surrounded by each insulating spacer 74. A top surface of the source-level semiconductor material layer 161 can be physically exposed at the bottom of each backside trench 79.

Figure 42:
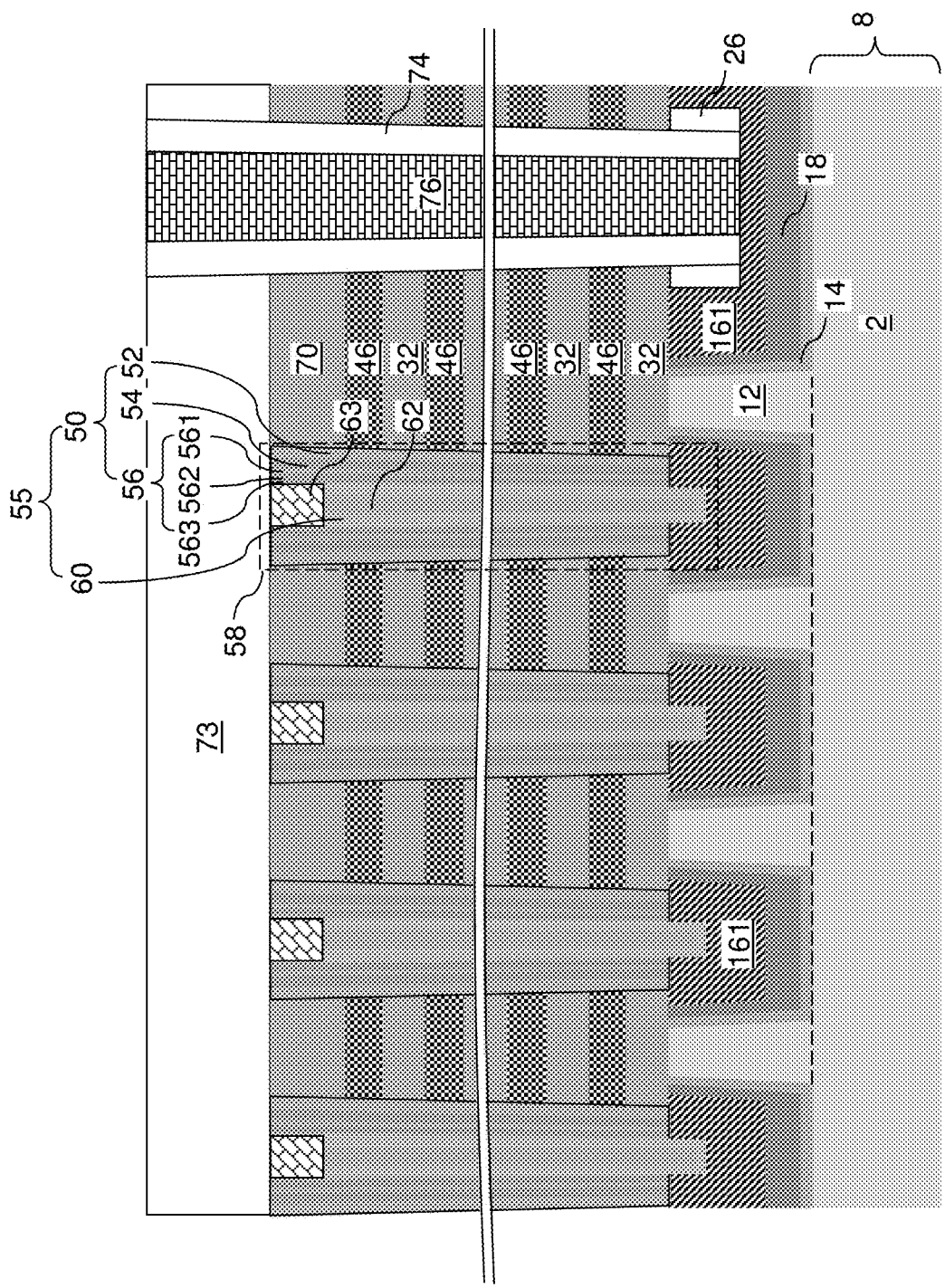
FIG. 42 is a schematic vertical cross-sectional view of the third exemplary structure after formation of a backside contact via structure according to an embodiment of the present disclosure.

Referring to FIG. 42, the processing steps of FIG. 14 can be performed to form a backside contact via structure 76 within each backside cavity 79' directly on the source-level semiconductor material layer 161. Each backside contact via structure 76 extends through the alternating stack (32, 46), and contacts a top surface of the source-level semiconductor material layer 161. Subsequently, the processing steps of FIG. 15 can be performed to form additional contact via structures (88, 86) through the contact level dielectric layer 73, and optionally through the retro-stepped dielectric material portion 65. The additional contact via structures (88, 85) can include drain contact via structures 88 and word line contact via structures 86 as illustrated in FIG. 15.

Referring to FIGS. 43A and 43B, a fourth exemplary structure according to a fourth embodiment of the present disclosure can be derived from the first exemplary structure of FIGS. 1A and 1B by forming a dielectric liner layer 14 and a source-level sacrificial layer 15. The dielectric liner layer 14 can be formed by performing a processing step of FIGS. 2A and 2B. As such, the dielectric liner layer 14 can have the same composition and the same thickness as in the first, second, and third embodiments. Subsequently, the processing steps of FIGS. 3A and 3B can be performed to form a source-level sacrificial layer 15, which can have the same material composition as in the first, second, and third embodiments. The source-level sacrificial layer 15 has a planar top surface that is coplanar with the top surfaces of the semiconductor pillar structures 12. The semiconductor pillar structures 12, the dielectric liner layer 14, and the source-level sacrificial layer 15 are collectively referred to as a pillar-level assembly 21.

Figure 44:
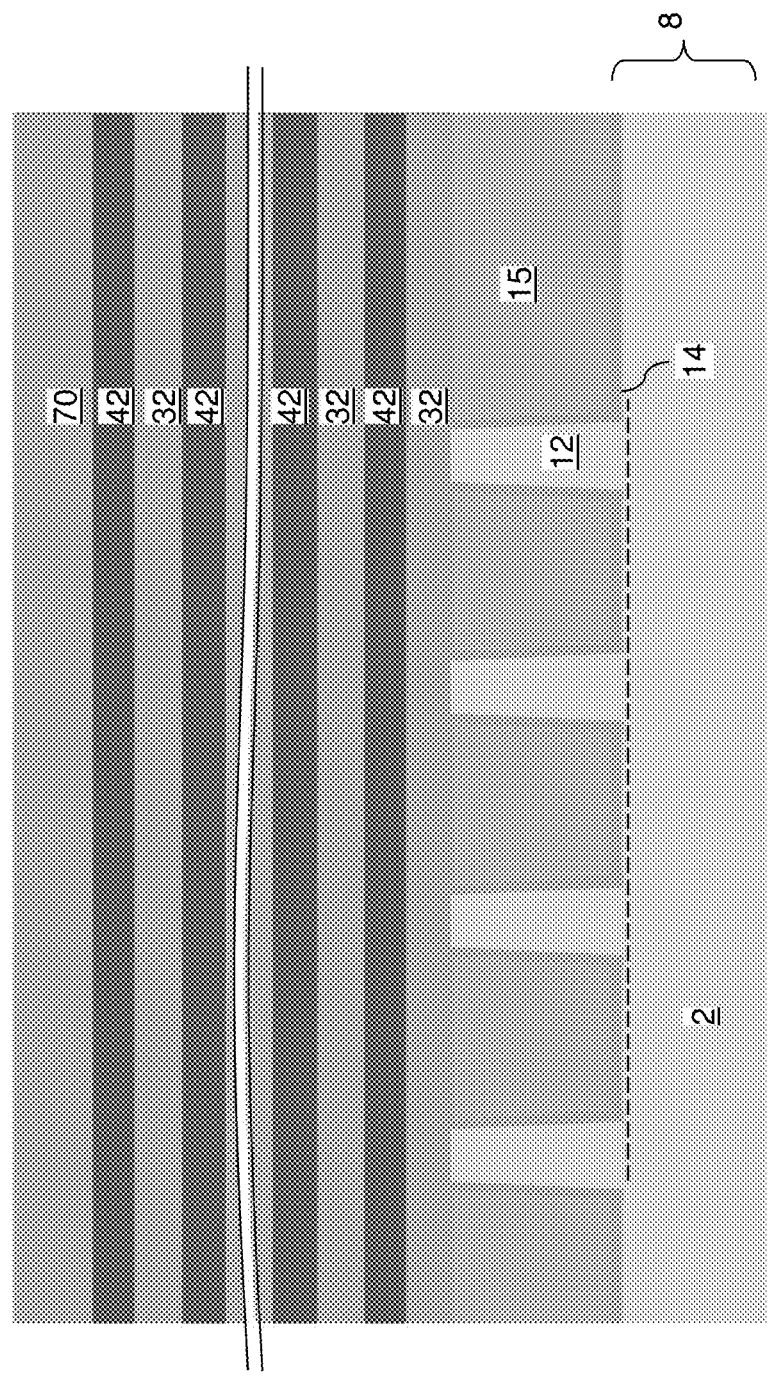
FIG. 44 is a schematic vertical cross-sectional view of the fourth exemplary structure after formation of an alternating stack of insulating layers and sacrificial material layers according to an embodiment of the present disclosure.

Referring to FIG. 44, the processing steps of FIGS. 4A-4C can be performed to form an alternating stack of insulating layers 32 and sacrificial material layers 42, an insulating cap layer 70, stepped surfaces of the alternating stack (32, 42) (that are formed in a staircase region 300 as illustrated in FIG. 4B), and a retro-stepped dielectric material portion 65 (as illustrated in FIG. 4B). The bottommost insulating layer 32 within the alternating stack (32, 42) can be formed directly on the top surfaces of the semiconductor pillar structures 12, annular top surfaces of the dielectric liner layer 14, and a top surface of the source-level sacrificial layer 15.

Figure 45A:
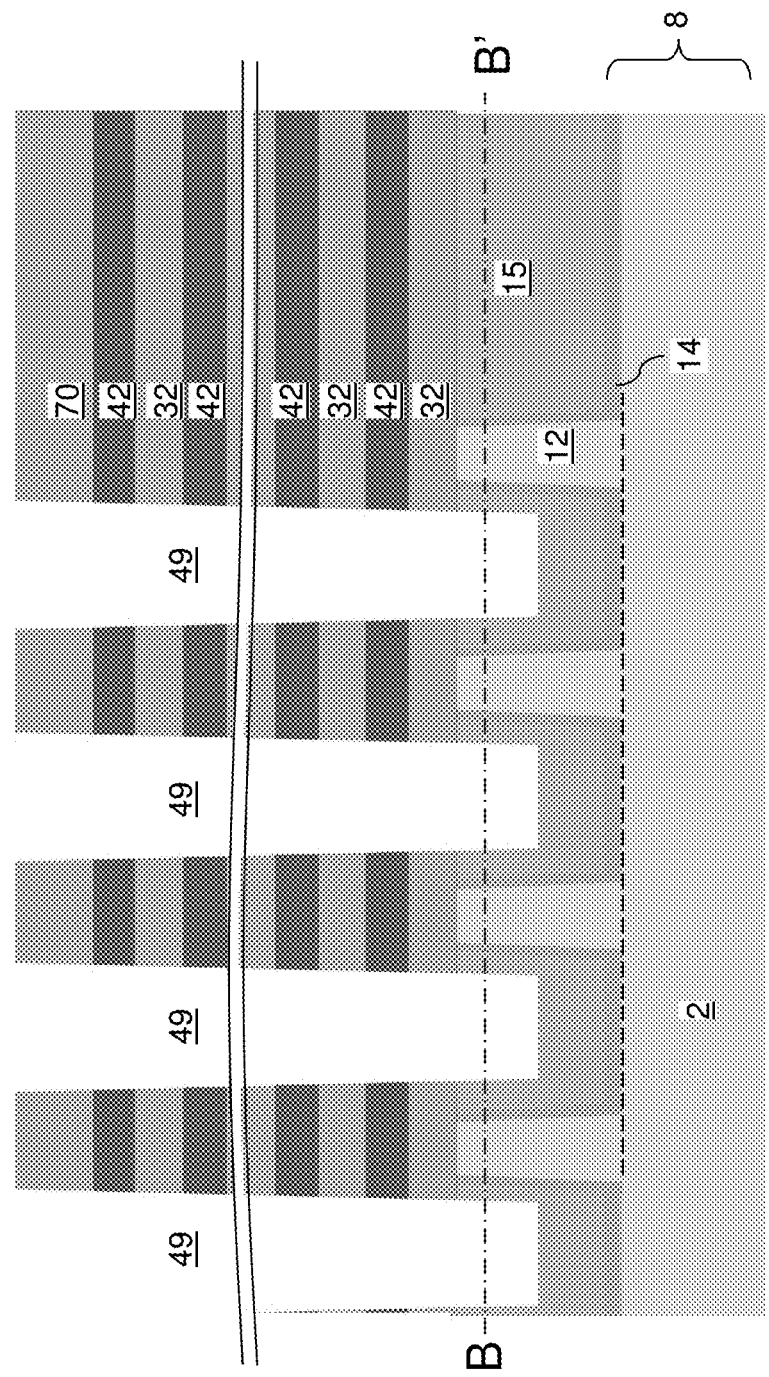
FIG. 45A is a schematic vertical cross-sectional view of the fourth exemplary structure after formation of memory openings according to an embodiment of the present disclosure.
Figure 45C:
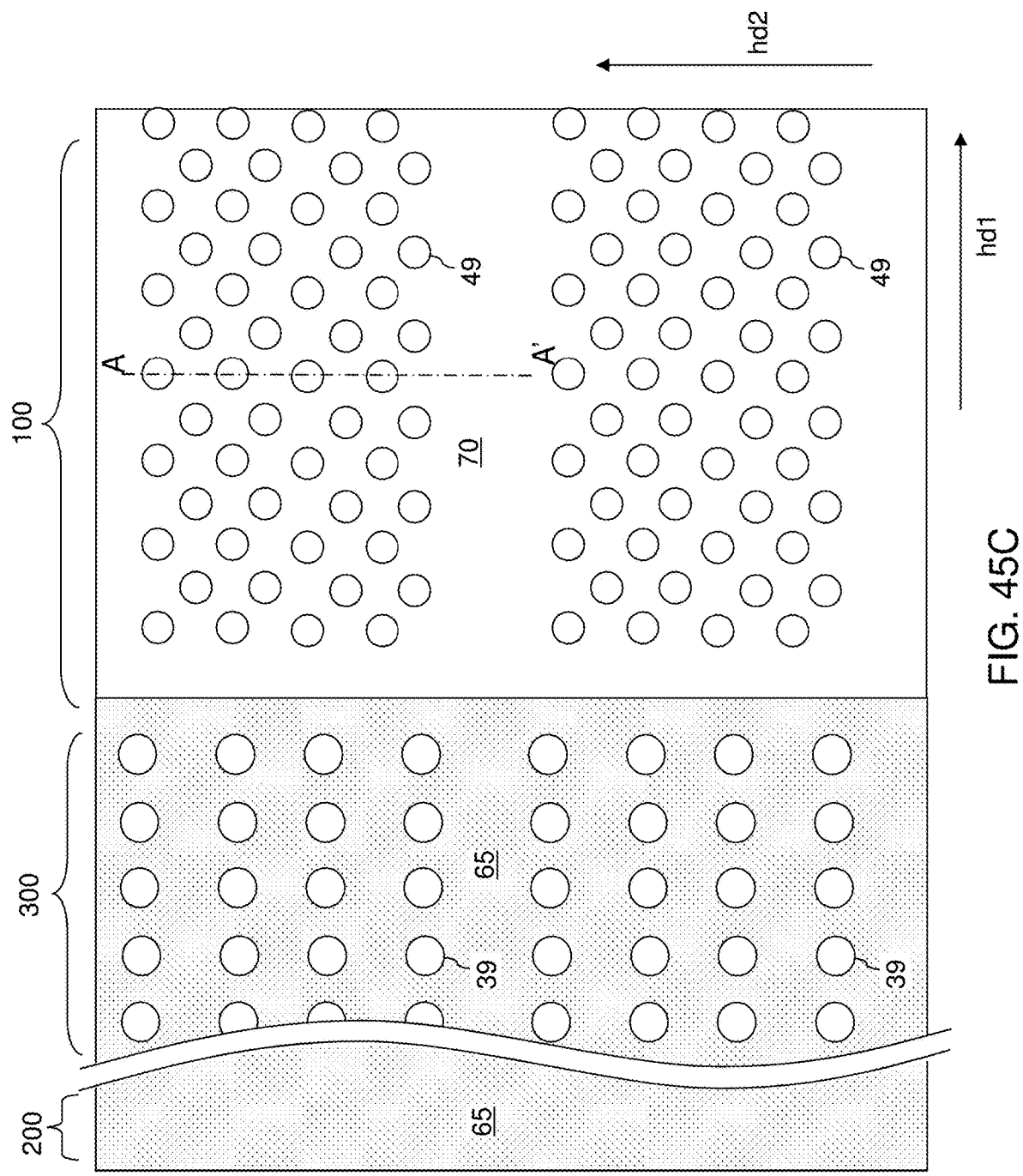
FIG. 45C is a top-down view of the fourth exemplary structure of FIG. 45A. The vertical plane A-A' is a plane of the vertical cross-sectional view of FIG. 45A.

Referring to FIGS. 45A-45C, the processing steps of FIGS. 5A-5D can be performed to form memory openings 49 and support openings 39. For example, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 39. The memory openings 49 are formed through the insulating cap layer 70 and the entirety of the alternating stack (32, 42) in the memory array region 100. The support openings 39 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 39 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 39 can be substantially vertical, or can be tapered. The patterned lithographic material stack can be subsequently removed, for example, by ashing.

The memory openings 49 can vertically extend from the top surface of the insulating cap layer 70 to at least the horizontal plane including the topmost surface of the source-level sacrificial layer 15. The support openings 39 can vertically extend from the top surface of the retro-stepped dielectric material portion 65 to a top surface of a raised portion of the substrate semiconductor material layer 2. In one embodiment, an overetch into the source-level sacrificial layer 15 may be optionally performed after the top surface of the source-level sacrificial layer 15 is physically exposed at a bottom of each memory openings 49. The lithographic material stack can be subsequently removed, for example, by ashing.

Each of the memory openings 49 and the support openings 39 may include a sidewall (or a plurality of sidewalls) that extends substantially perpendicular to the topmost surface of the substrate 8. A two-dimensional array of memory openings 49 can be formed in the memory array region 100. A two-dimensional array of support openings 39 can be formed in the staircase region 300. Each memory opening 49 extends through the insulating cap layer 70, the alternating stack (32, 42), and into an upper portion of the source-level sacrificial layer 15. At this processing step, each support openings 39 can extend through the retro-stepped dielectric material portion 65, a subset of layers in the alternating stack (32, 42), and optionally into the upper portion of the substrate semiconductor material layer 2 in the staircase region 300. In one embodiment, the source-level sacrificial layer 15 can be physically exposed at the bottom of each of the memory openings 49.

Figure 46A:
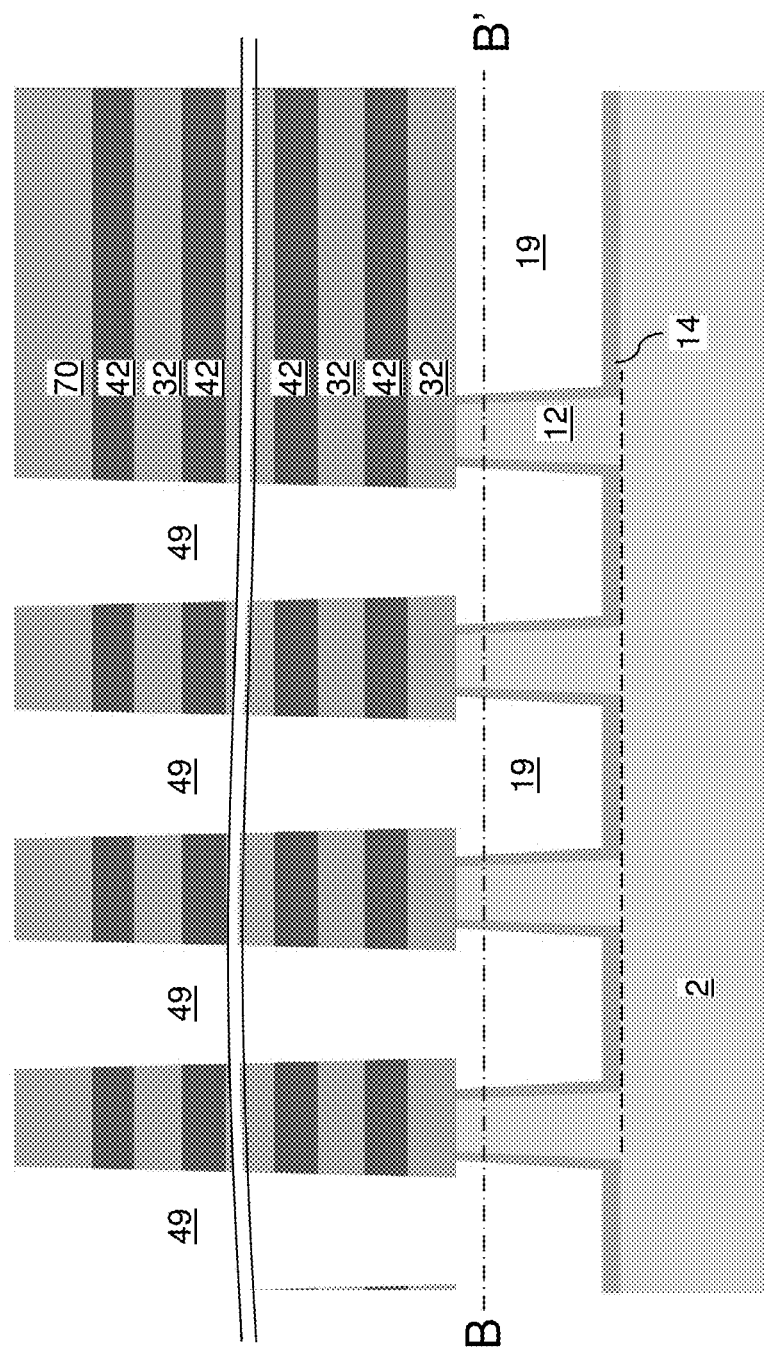
FIG. 46A is a schematic vertical cross-sectional view of the fourth exemplary structure after formation of a source-level cavity according to an embodiment of the present disclosure.
Figure 46B:
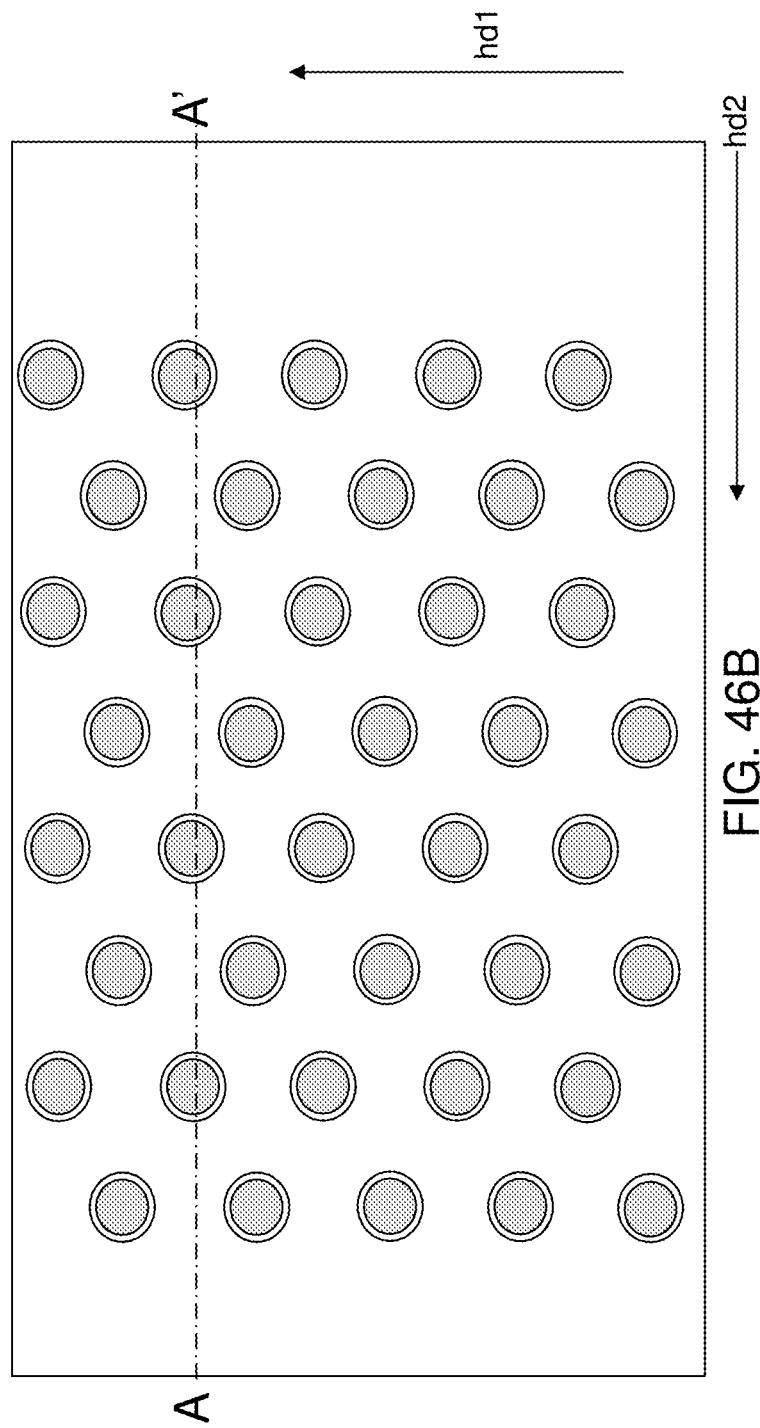
FIG. 46B is a horizontal cross-sectional view of the fourth exemplary structure along the plane B-B' of FIG. 46A. The vertical plane A-A' is a plane of the vertical cross-sectional view of FIG. 46A.

Referring to FIGS. 46A and 46B, an etchant that etches the material of the source-level sacrificial layer 15 selective to the materials of the alternating stack (32, 42), the contact level dielectric layer 73, the insulating cap layer 70, the retro-stepped dielectric material portion 65, and the dielectric liner layer 14 can be introduced into the memory openings 49 in an isotropic etch process. In one embodiment, an isotropic etchant that etches the material of the source-level sacrificial layer 15 can be introduced into the memory openings 49 in a wet etch process. For example, if the source-level sacrificial layer 15 includes undoped amorphous silicon or an undoped amorphous silicon-germanium alloy and if the dielectric liner layer 14 includes silicon oxide, a wet etch process using hot trimethyl-2 hydroxyethyl ammonium hydroxide ("hot TMY") or tetramethyl ammonium hydroxide (TMAH) can be used to remove the source-level sacrificial layer 15 selective to the alternating stack (32, 42), the contact level dielectric layer 73, the insulating cap layer 70, the retro-stepped dielectric material portion 65, and the dielectric liner layer 14. Upon etching of the source-level sacrificial layer 15 by the isotropic etchant, a source-level cavity 19 is formed in the volume from which the source-level sacrificial layer 15 is removed. The source-level cavity 19 is formed by removing the source-level sacrificial layer 15 while the semiconductor pillar structures 12 provide mechanical support to the alternating stack (32, 42). The source-level cavity 19 is connected to each of the memory openings 49 upon formation. The source-level cavity 19 can be spaced from the substrate semiconductor material layer 2 and the semiconductor pillar structures 12 by the dielectric liner layer 14.

Figure 47A:
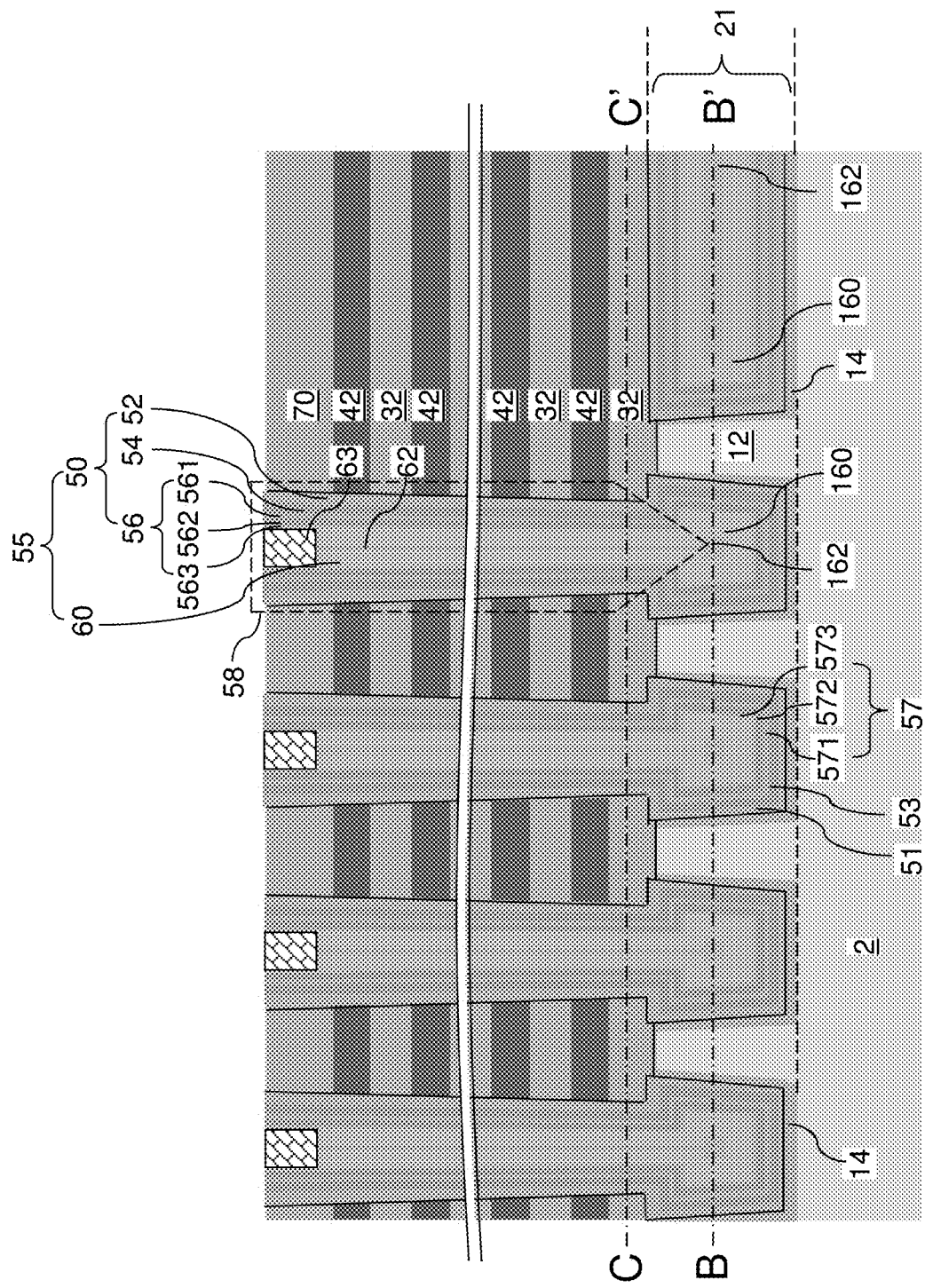
FIG. 47A is a schematic vertical cross-sectional view of the fourth exemplary structure after formation of memory opening fill structures and a source-level assembly according to an embodiment of the present disclosure.
Figure 47C:
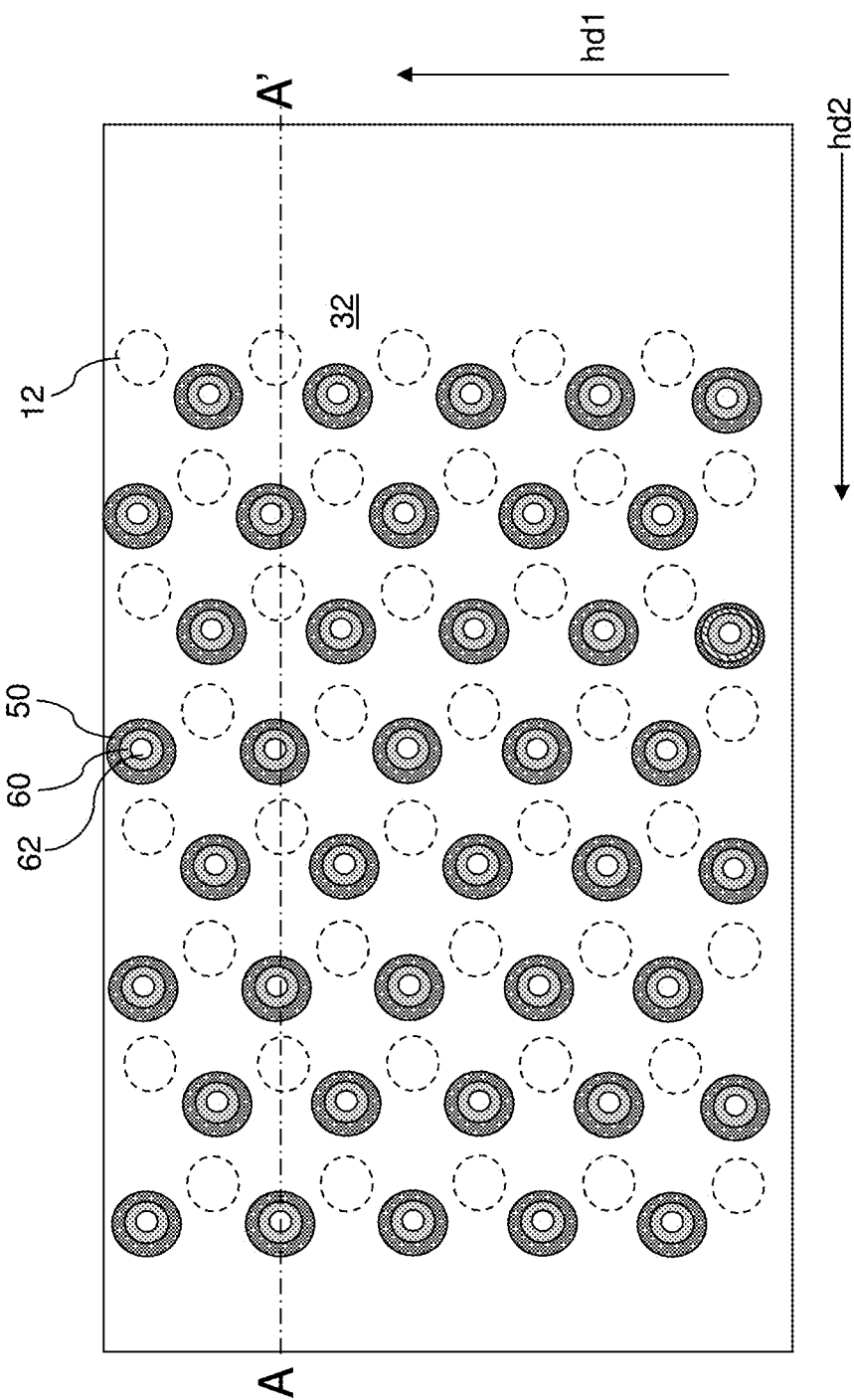
FIG. 47C is a horizontal cross-sectional view of the fourth exemplary structure along the plane C-C' of FIG. 47A. The vertical plane A-A' is a plane of the vertical cross-sectional view of FIG. 47A.

Referring to FIGS. 47A-47C, a series of conformal material deposition processes can be performed to form a conformal material layer stack (55, 250, 60, 160) that extends across the source-level cavity 19 and each of the memory openings 49. The conformal material layer stack (55, 250, 60, 160) includes a continuous blocking dielectric material layer (52, 51) that include blocking dielectric layers 52 that are formed in a respective one of the memory openings 49 and a source-level blocking dielectric material layer 51 that is formed in the source-level cavity 19 directly on the dielectric liner layer 14 and on bottom surfaces of the bottommost insulating layer 32 of the alternating stack (32, 42). The continuous blocking dielectric material layer (52, 51) can have a same composition and a same thickness throughout.

The conformal material layer stack (55, 250, 60, 160) includes a continuous charge storage material layer (54, 53) that include charge storage layers 54 that are formed on a respective one of the blocking dielectric layers 52 and a source-level charge storage material layer 53 that is formed in the source-level cavity 19 directly on the source-level blocking dielectric material layer 51. The conformal material layer stack (55, 250, 60, 160) can have a same composition and a same thickness throughout.

The conformal material layer stack (55, 250, 60, 160) includes a continuous tunneling dielectric material layer (56, 57) that include tunneling dielectric layers 56 that are formed on a respective one of the charge storage layers 54 and a source-level charge storage material layer 53 that is formed in the source-level cavity 19 directly on the source-level charge storage material layer 53. The continuous tunneling dielectric material layer (56, 57) can include a stack of a first continuous silicon oxide tunneling dielectric material layer (561, 571), a continuous silicon oxynitride tunneling dielectric material layer (562, 572), and a second continuous silicon oxide tunneling dielectric material layer (563, 573). The first continuous silicon oxide tunneling dielectric material layer (561, 571) includes first silicon oxide layers 561 that are formed on a respective charge storage layer 54 in a respective memory opening 49 and a first source-level silicon oxide tunneling dielectric material layer 571 formed in the source-level cavity 19. The continuous silicon oxynitride tunneling dielectric material layer (562, 572) includes silicon oxynitride layers 562 that are formed on a respective first silicon oxide layer 561 in a respective memory opening 49 and a source-level silicon oxynitride tunneling dielectric material layer 572 formed in the source-level cavity 19. The second continuous silicon oxide tunneling dielectric material layer (563, 573) includes second silicon oxide layers 563 that are formed on a respective silicon oxynitride layer 562 in a respective memory opening 49 and a second source-level silicon oxide tunneling dielectric material layer 573 formed in the source-level cavity 19.

Each combination of a first silicon oxide layer 561, silicon oxynitride layer 562, and a second silicon oxide layer 563 located in a memory opening 49 constitutes a tunneling dielectric layer 56. Each combination of a blocking dielectric layer 52, a charge storage layer 54, and a tunneling dielectric layer 56 located in a memory opening 49 constitutes a memory film 50. The combination of the first source-level silicon oxide tunneling dielectric material layer 571, the source-level silicon oxynitride tunneling dielectric material layer 572, and the second source-level silicon oxide tunneling dielectric material layer 573 constitutes a source-level tunneling dielectric material layer 57 formed within the source-level cavity 19. The combination of the source-level blocking dielectric material layer 51, the source-level charge storage material layer 53, and the source-level tunneling dielectric material layer 57 constitutes a source-level dielectric layer stack 250. Each bottom end of a memory film 50 is adjoined to the source-level dielectric layer stack 250.

The conformal material layer stack (55, 250, 60, 160) can include a continuous semiconductor channel material layer (60, 160). The continuous semiconductor channel material layer (60, 160) can include vertical semiconductor channels 60 that are formed on a respective one of the tunneling dielectric layer 56 and a source-level semiconductor material layer 160 that is formed in the source-level cavity 19 directly on the source-level tunneling dielectric material layer 57. The continuous semiconductor channel material layer (60, 160) includes a doped semiconductor material having a doping of the first conductivity type. The atomic concentration of dopants of the first conductivity type in the continuous semiconductor channel material layer (60, 160) can be in a range from $1.0 \times 10^{14}/cm^3$ to $1.0 \times 10^{18}/cm^3$, although lesser and greater atomic dopant concentrations can also be used. In one embodiment, the continuous semiconductor channel material layer (60, 160) can have a same composition and a same thickness throughout. Each combination of a memory film 50 and a vertical semiconductor channel 60 within a same memory opening 49 constitutes a memory stack structure 55.

Each portion of the conformal material layer stack (55, 250, 60, 160) in a memory opening 49 can include a charge storage layer 54 comprising a charge storage material, a tunneling dielectric layer 56 deposited on the charge storage layer 54, and a vertical semiconductor channel 60 that is deposited on the tunneling dielectric layer 56. The source-level semiconductor material layer 160 and the vertical semiconductor channels 60 are formed by simultaneous deposition of a doped semiconductor material in the memory openings 49 and in the source-level cavity 19. The source-level semiconductor material layer 160 comprises horizontally-extending portions of the doped semiconductor material that are deposited in the source-level cavity 19, and the vertical semiconductor channels 60 comprise vertically-extending portions of the doped semiconductor material that are deposited in the memory openings.

A dielectric material can be deposited in unfilled volumes of the source-level cavity 19, the memory openings 49, and the support openings 39. Excess portions of the dielectric material overlying the insulating cap layer 70 can be removed, for example, by a recess etch. Remaining portions of the dielectric material can be recessed below the top surface of the insulating cap layer 70. The remaining portion of the dielectric material in the source-level cavity 19 constitutes a dielectric core material layer 162. Each remaining portion of the dielectric material in the memory openings and support openings constitutes a dielectric core 62.

Drain regions 63 can be formed by depositing a doped semiconductor material having a doping of the second conductivity type within each recessed region above the dielectric cores 62. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon.

Each combination of a memory film 50 and a vertical semiconductor channel 60 within a memory opening constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening is herein referred to as a memory opening fill structure 58.

The combination of the source-level dielectric layer stack 250, the source-level semiconductor material layer 160, and the dielectric core material layer 162 is herein referred to as a source-level assembly 21. Each memory opening fill structure 58 is connected to the source-level assembly 21. Each combination of a memory film 50, a vertical semiconductor channel 60, a dielectric core 62, and a drain region 63 within each support openings 39 fills the respective support openings, and constitutes a support pillar structure 20. The support pillar structures 20 of the fourth exemplary structure can be formed as discrete structures that are not adjoined one to another, and can be same as in the first, second, or third exemplary structures. The memory stack structures 55 comprise portions of the conformal material layer stack (55, 250, 60, 160) deposited in the memory openings 49. The source-level semiconductor material layer 160 comprise a portion of the conformal material layer stack (55, 250, 60, 160) deposited in the source-level cavity 19.

Figure 48:
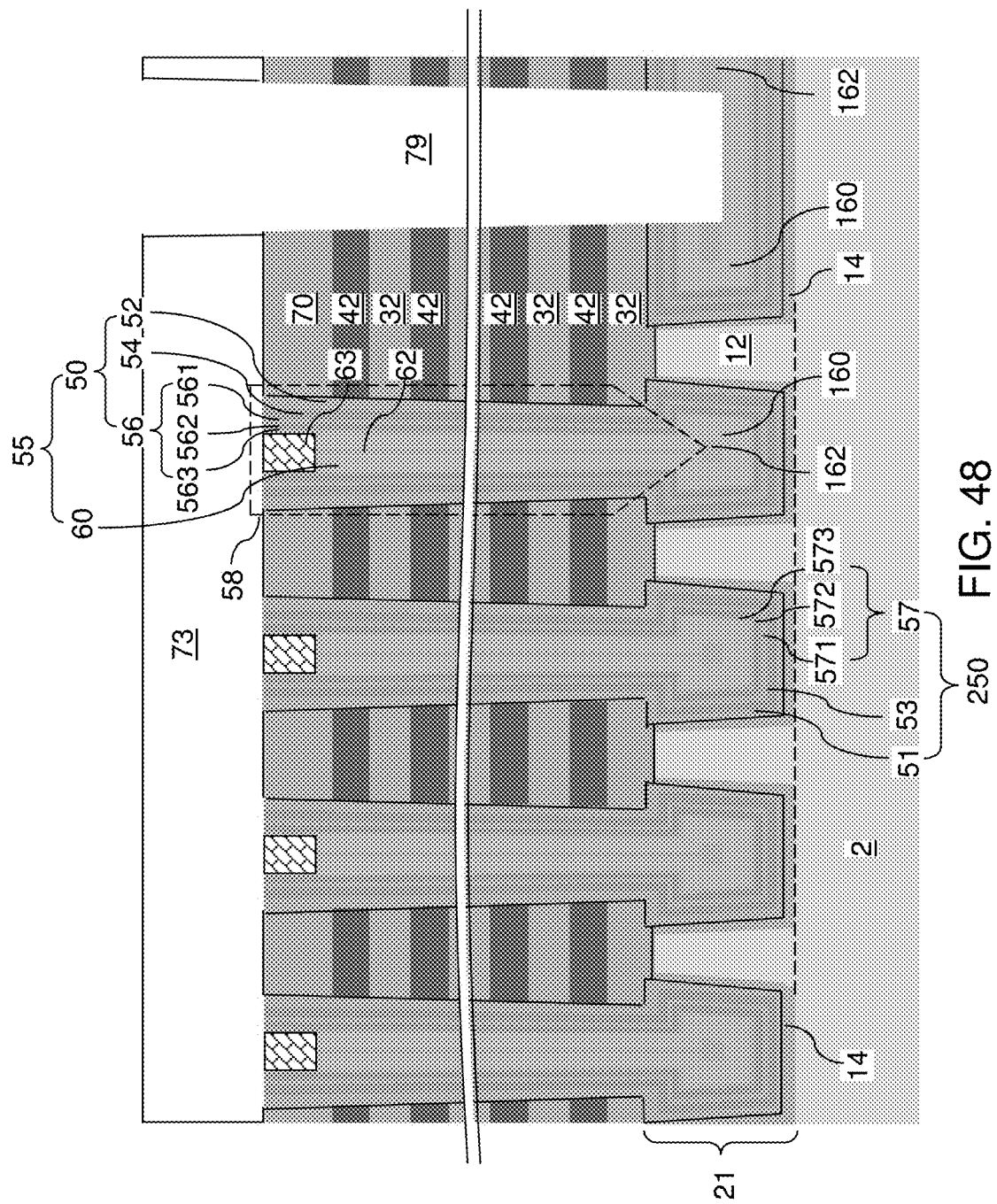
FIG. 48 is a schematic vertical cross-sectional view of the fourth exemplary structure after formation of backside trenches according to an embodiment of the present disclosure.

Referring to FIG. 48, the processing steps of FIGS. 6A-6C can be performed to form a contact level dielectric layer 73 and backside trenches 79. The backside trenches 79 vertically extend from the top surface of the contact level dielectric layer 73 and at least to the top surface of the source-level semiconductor material layer 160, and laterally extend through the memory array region 100 and the staircase region 300 (See FIG. 6C). In one embodiment, the backside trenches 79 can laterally extend along the first horizontal direction hd1. The photoresist layer can be removed, for example, by ashing. Each backside trench 79 can have a uniform width that is invariant along the lengthwise direction (i.e., along the first horizontal direction hd1). The material of the source-level sacrificial layer 15 is physically exposed at the bottom of each backside trench 79.

In one embodiment, the backside trenches 79 can vertically extend through the dielectric core material layer 162 and overlying portions of the source-level dielectric layer stack 250 and the source-level semiconductor material layer 160. In this case, a lower portion of the source-level semiconductor material layer 160 that underlie the dielectric core material layer 162 can be physically exposed at the bottom of each backside trench 79.

In another embodiment, the backside trenches 79 can vertically extend to an upper portion of the source-level semiconductor material layer 160 that overlies the dielectric core material layer 162. In this case, the lower portion of the source-level semiconductor material layer 160 that overlie the dielectric core material layer 162 can be physically exposed at the bottom of each backside trench 79.

Figure 49A:
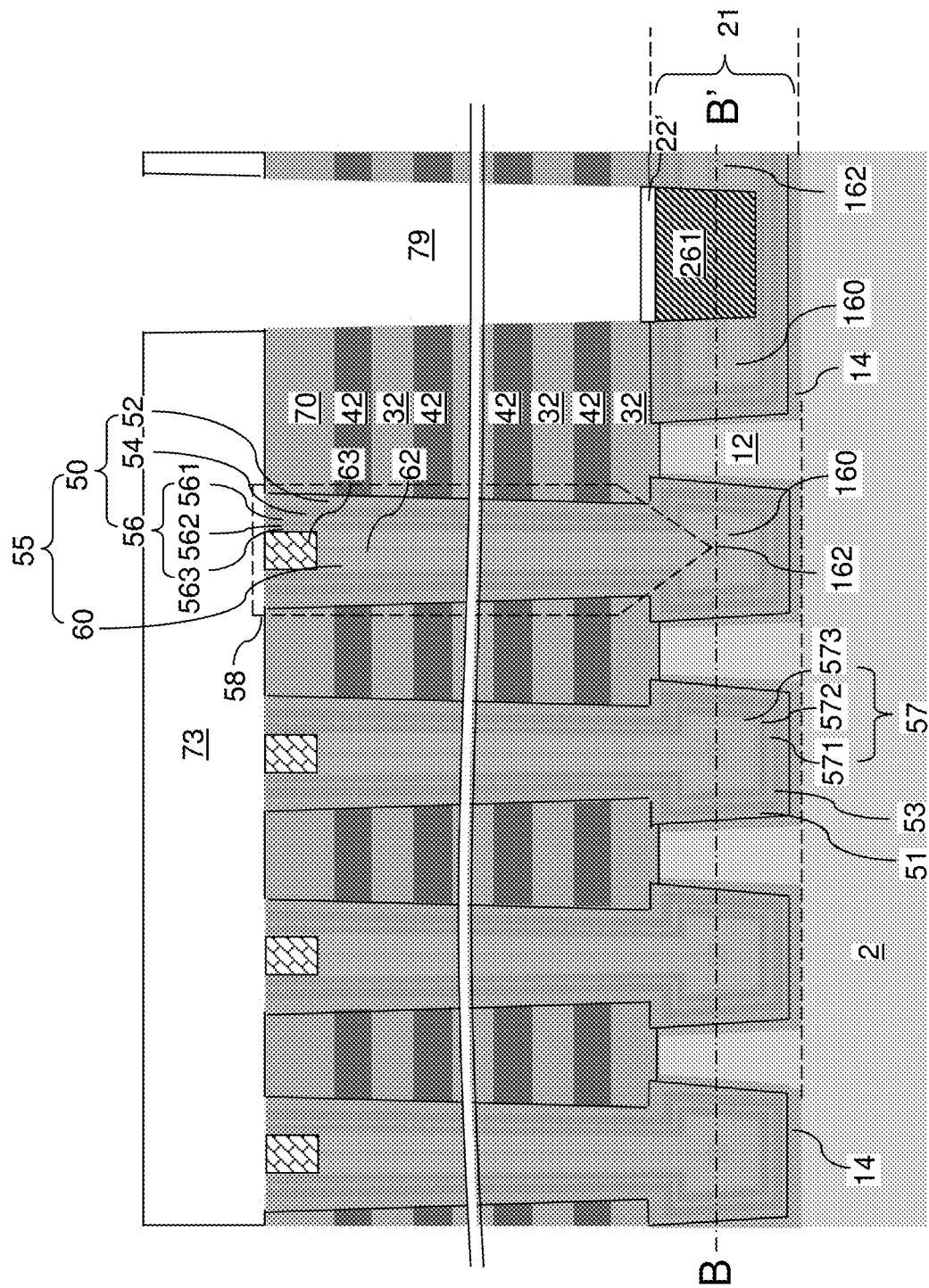
FIG. 49A is a vertical cross-sectional view of the fourth exemplary structure after formation of a source region and a sacrificial semiconductor oxide portion according to an embodiment of the present disclosure.
Figure 49B:
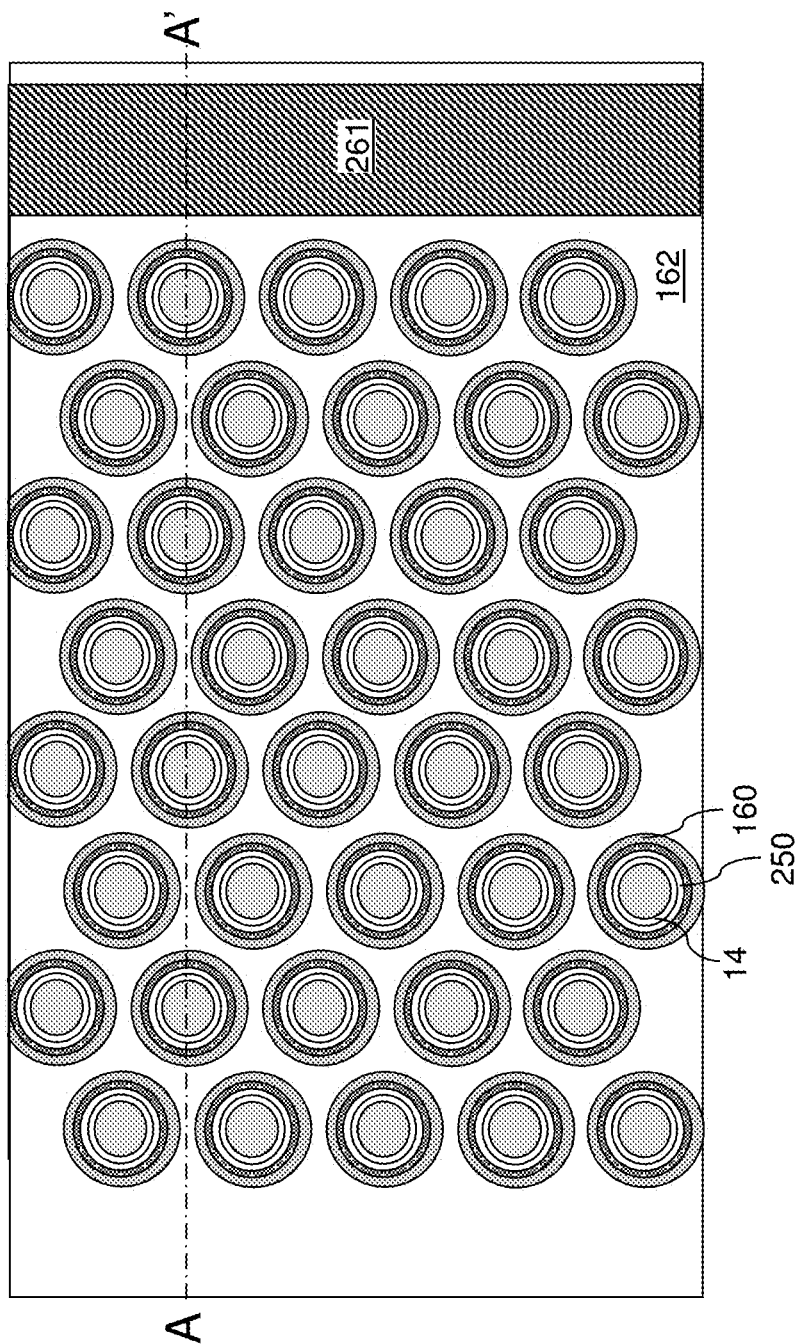
FIG. 49B is a horizontal cross-sectional view of the fourth exemplary structure along the plane B-B' of FIG. 49A. The vertical plane A-A' is a plane of the vertical cross-sectional view of FIG. 49A.

Referring to FIGS. 49A and 49B, a selective semiconductor deposition process may be optionally performed to form an additional semiconductor material portion at the bottom of each backside trench 79. The top surface of the additional semiconductor material portion can be located below the horizontal plane including the bottom surface of the bottommost one of the sacrificial material layers 42. Dopants of the second conductivity type can be introduced into semiconductor material portions that underlie the backside trenches 79, which can include portions of the source-level semiconductor material layer 160 that underlie the backside trenches 79 and the optional additional semiconductor material portions that are formed by the selective semiconductor deposition process. The dopants of the second conductivity type may be introduced into the additional semiconductor material portions by in-situ doping and/or by ion implantation of dopants of the second conductivity type toward the bottom region of each backside trench. A source region 261 having a doping of the second conductivity type can be formed underneath each backside trench 79. The net dopant concentration in the source regions 261 (i.e., the atomic concentration of dopants of the second conductivity type less the atomic concentration of dopants of the first conductivity type) can be in a range from $5.0 \times 10^{19}/cm^3$ to $2.0 \times 10^{21}/cm^3$, although lesser and greater atomic concentrations can also be used. Optionally, an oxidation process can be performed to covert physically exposed surface portions of the source regions 261 into sacrificial semiconductor oxide portions 22'. Each source region 261 can be formed at a bottom portion of a respective backside trench 79 directly on the source-level semiconductor material layer 160. Each source region 261 can contact a sidewall of the source-level semiconductor material layer 160. Each source region 261 contacts the dielectric core material layer 162, and contacts a sidewall or a top surface of the dielectric core material layer 162.

Figure 50:
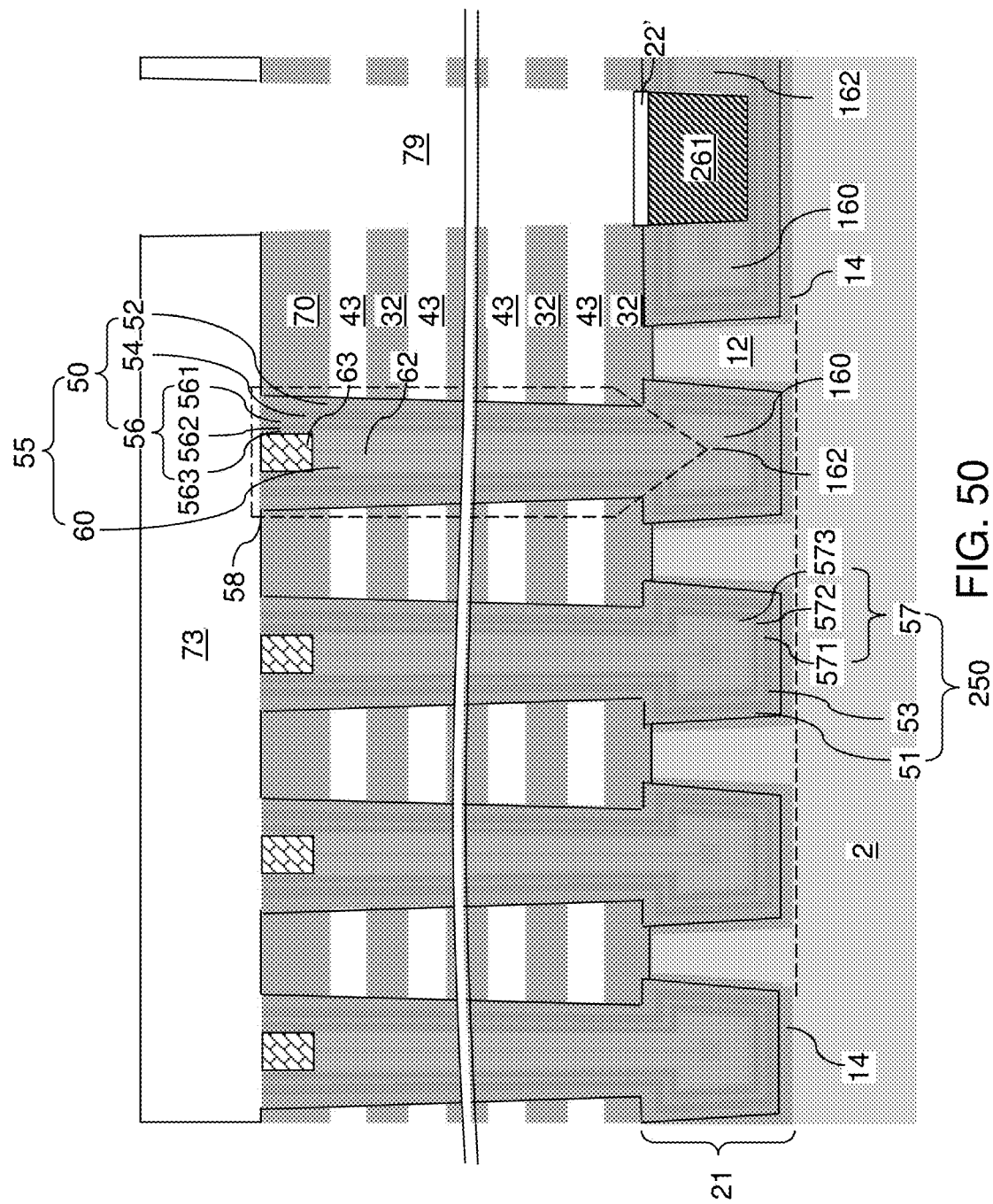
FIG. 50 is a schematic vertical cross-sectional view of the fourth exemplary structure after formation of backside recesses according to an embodiment of the present disclosure.

Referring to FIG. 50, the processing steps of FIG. 11 can be performed to remove the sacrificial material layers 42 selective to the insulating layers 32, and to form backside recesses 43 in the volumes from which the sacrificial material layers 42 are removed. A backside recess 43 can be vertically bounded by a top surface of an underlying insulating layer 32 and a bottom surface of an overlying insulating layer 32. In one embodiment, each backside recess 43 can have a uniform height throughout.

Figure 51:
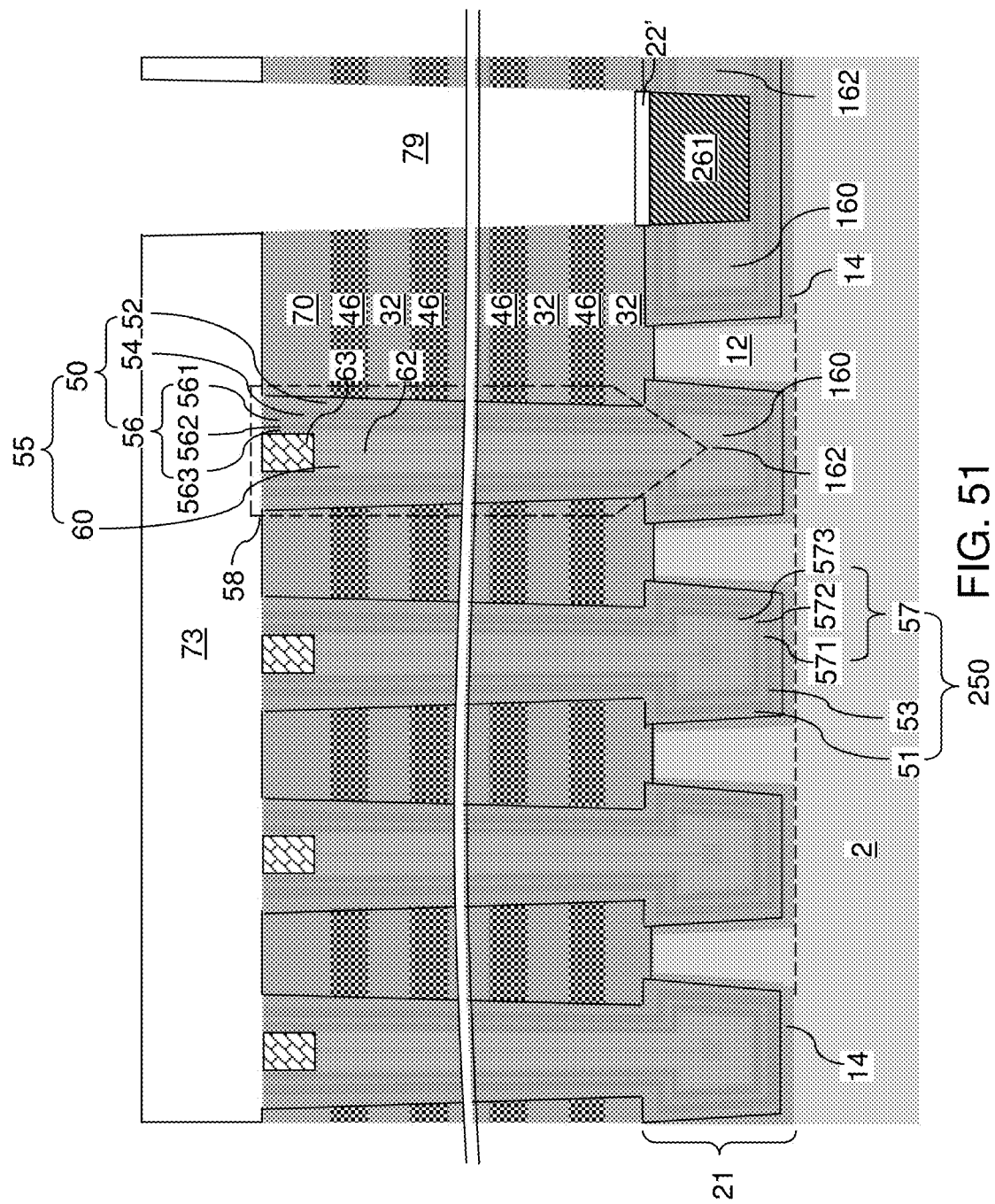
FIG. 51 is a schematic vertical cross-sectional view of the fourth exemplary structure after formation of electrically conductive layers according to an embodiment of the present disclosure.

Referring to FIG. 51, the processing steps of FIG. 12 can be performed to form electrically conductive layers 46 in the backside trenches. The sacrificial material layers 42 are replaced with the electrically conductive layers 46. Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55.

Figure 52:
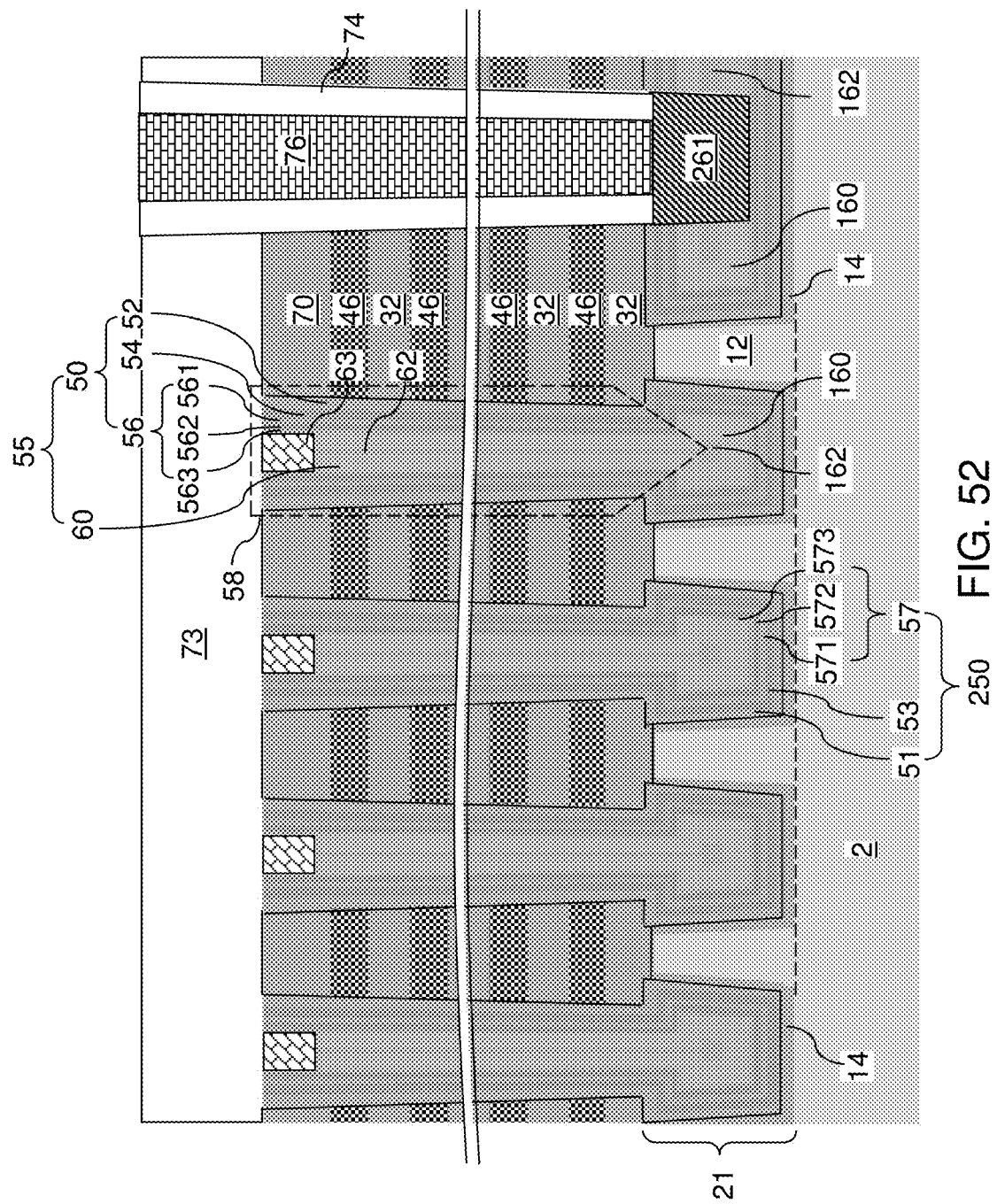
FIG. 52 is a schematic vertical cross-sectional view of the fourth exemplary structure after formation of an insulating spacer and a backside contact via structure according to an embodiment of the present disclosure.

Referring to FIG. 52, the processing steps of FIG. 13 can be performed to form an insulating spacer 74 within each backside trench 79. A center portion of each sacrificial semiconductor oxide portion 22' may be removed during the anisotropic etch process. An annular peripheral portion of each sacrificial semiconductor oxide portion 22' can be incorporated into a respective insulating spacer 74. A backside cavity is present within a volume surrounded by each insulating spacer 74. A top surface of a source region 261 can be physically exposed at the bottom of each backside trench 79.

Subsequently, the processing steps of FIG. 14 can be performed to form a backside contact via structure 76 within each backside cavity 79' directly on a respective one of the source regions 61. Each backside contact via structure 76 extends through the alternating stack (32, 46), and contacts a top surface of the source region 261. Subsequently, the processing steps of FIG. 15 can be performed to form additional contact via structures (88, 86) through the contact level dielectric layer 73, and optionally through the retro-stepped dielectric material portion 65. The additional contact via structures (88, 86) can include drain contact via structures 88 and word line contact via structures 86 as illustrated in FIG. 15.

Referring to all drawings and according to various embodiments of the present disclosure, a three-dimensional memory device is provided, which comprises: semiconductor pillar structures 12 adjoined to a top surface of a semiconductor material layer (such as a substrate semiconductor material layer 2 or a first conductivity type semiconductor layer 6); an alternating stack of insulating layers 32 and electrically conductive layers 46 overlying the semiconductor pillar structures 12; memory stack structures 55 vertically extending through the alternating stack (32, 46), wherein each of the memory stack structures 55 comprises a respective vertical semiconductor channel 60 and a respective vertical stack of memory elements located at levels of the electrically conductive layers 46 (comprising portions of a charge storage layer 54 located at the levels of the electrically conductive layers 46); and a source-level semiconductor material layer (16, 161, or 160) in contact with bottom end portions of the vertical semiconductor channels 60 and laterally surrounding the semiconductor pillar structures 12.

In one embodiment, a bottommost surface of each of the vertical semiconductor channels 60 directly contacts the source-level semiconductor material layer (16, 161, or 160). In one embodiment, a lower portion of an outer sidewall of each of the vertical semiconductor channels 60 directly contacts the source-level semiconductor material layer (16, 161, or 160).

In one embodiment, each of the memory stack structures 55 includes a memory film 50 having a tubular configuration, laterally surrounding and contacting a respective one of the vertical semiconductor channels 60, and including a respective vertical stack of memory elements. Each of the memory films 50 has an annular bottom surface that contact the source-level semiconductor material layer (16, 161).

In one embodiment, the semiconductor material layer (such as the first conductivity type semiconductor layer 6) comprises a first conductivity type semiconductor layer 6 having a doping of a first conductivity type and contacting bottom surfaces of the semiconductor pillar structures 12, wherein the semiconductor pillar structures 12 and the source-level semiconductor material layer 16 have a doping of the first conductivity type. A second conductivity type semiconductor layer 4 underlies the first conductivity type semiconductor layer 6, has a doping of a second conductivity type that is an opposite of the first conductivity type, and forms a p-n junction at an interface with the first conductivity type semiconductor layer 6.

In one embodiment, a dielectric liner layer 14 laterally surrounds each of the semiconductor pillar structures 12, is disposed between the source-level semiconductor material layer (161, 160) and the semiconductor material layer (such as the substrate semiconductor material layer 2), and provides electrical isolation of the source-level semiconductor material layer (161, 160) from the semiconductor material layer (such as the substrate semiconductor material layer 2) and from the semiconductor pillar structures 12.

In one embodiment, annular top surfaces of the dielectric liner layer 14 contact a bottom surface of a bottommost insulating layer 32 within the alternating stack (32, 42).

In one embodiment, the three-dimensional memory device comprises a source-level metallic layer 18 including a horizontal portion located between the semiconductor material layer (such as the substrate semiconductor material layer 2) and the source-level semiconductor material layer 161 and tubular portions laterally surrounding a respective one of the semiconductor pillar structures 12 and contacting a respective sidewall of the source-level semiconductor material layer 161.

In one embodiment, annular top surfaces of the tubular portions of the source-level metallic layer 18 contact a bottom surface of a bottommost insulating layer 32 within the alternating stack (32, 42).

In one embodiment, the vertical semiconductor channels 60 have a doping of a first conductivity type, the source-level semiconductor material layer 161 has a doping of a second conductivity type that is opposite of the first conductivity type, and p-n junctions are present at interfaces between the vertical semiconductor channels 60 and the source-level semiconductor material layer 161.

In one embodiment, the source-level semiconductor material layer 160 has a same material composition as the vertical semiconductor channels 60.

In one embodiment, the source-level semiconductor material layer 160 comprises: an upper planar portion adjoined to each of the vertical semiconductor channels 60 and overlies a dielectric core material layer 162; a lower planar portion that is vertically spaced from the upper planar portion by a separation distance that is the thickness of the dielectric core material layer 162; and tubular connection portions that laterally surround a respective one of the semiconductor pillar structures 12 and connecting the upper planar portion and the lower planar portion.

In one embodiment, each of the vertical semiconductor channels 60 has a lateral thickness between an inner sidewall and an outer sidewall; and the lateral thickness is the same as a vertical thickness of the upper planar portion of the source-level semiconductor material layer 160, and is the same as a vertical thickness of the lower portion of the source-level semiconductor material layer 160.

According to another aspect of the present disclosure, a three-dimensional memory device is provided, which comprises: a substrate 8 including a stack of a first conductivity type semiconductor layer 6 having a doping of a first conductivity type and a second conductivity type semiconductor layer 4 having a doping of a second conductivity type that is an opposite of the first conductivity type and providing a p-n junction at an interface with a bottom surface of the first conductivity type semiconductor layer 6; a source-level semiconductor material layer 16 contacting a top surface of the first conductivity type semiconductor layer 6 and having a doping of the first conductivity type; an alternating stack of insulating layers 32 and electrically conductive layers 46 overlying the semiconductor pillar structures 12; and memory stack structures 55 vertically extending through the alternating stack (32, 46), wherein each of the memory stack structures 55 comprises a respective vertical semiconductor channel 60 and a respective memory film 50.

In one embodiment, a lower portion of an outer sidewall of each of the vertical semiconductor channels 60 directly contacts the source-level semiconductor material layer 16.

In one embodiment, the three-dimensional memory device comprises dielectric layer stacks 150 contacting a bottom surface of a respective one of the vertical semiconductor channels 60 and a respective recessed surface of the first conductivity type semiconductor layer 6, wherein each of the dielectric layer stacks 150 contacts, and is laterally surrounded by, the source-level semiconductor material layer 16.

In one embodiment, each of the memory films 50 comprises a charge storage layer 54 and a tunneling dielectric layer 56; and each of the dielectric layer stacks 150 comprises a tunneling dielectric material portion 156 having a same composition and a same thickness as the tunneling dielectric layer 56, and a charge storage material portion 154 having a same composition and a same thickness as the charge storage layer 54.

In one embodiment, a bottommost surface of each of the vertical semiconductor channels 60 directly contacts the source-level semiconductor material layer 16.

In one embodiment, each of the memory films 50 has a tubular configuration, laterally surrounds and contacts a respective one of the vertical semiconductor channels 60, and includes a respective vertical stack of memory elements; and each of the memory films 50 has an annular bottom surface that contact the source-level semiconductor material layer 16.

In one embodiment, the three-dimensional memory device comprises: a source region 61 included within the source-level semiconductor material layer 16, having a doping of the second conductivity type, and laterally spaced from the vertical semiconductor channels 60; a backside trench 79 vertically extending through the alternating stack (32, 46); and a backside contact via structure 76 located within the backside trench 79 and contacting a top surface of the source region 61. Optionally, the source region 61 can be vertically spaced from the first conductivity type semiconductor layer 6 and from the alternating stack (32, 46).

The various exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings can be located over another memory cell (comprising another portion of the charge storage layer 54 at a level of another electrically conductive layer 46) in a second device level of the array of monolithic three-dimensional NAND strings. The silicon substrate may contain an integrated circuit comprising a driver circuit (not expressly illustrated) for the memory device located thereon. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels ((16, 60), 60, (60, 160)}, wherein at least one end portion (such as a vertical semiconductor channel 60) of each of the plurality of semiconductor channels ((16, 60), 60, (60, 160)} extends substantially perpendicular to a top surface of the substrate 8 and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels ((16, 60), 60, (60, 160)}.

According to another aspect of the present disclosure, a method of forming a three-dimensional memory device is provided, which comprises: forming semiconductor pillar structures protruding above a horizontal top surface of a substrate semiconductor material layer located in a substrate; forming a source-level sacrificial layer around the semiconductor pillar structures; forming an alternating stack of insulating layers and spacer material layers over the source-level sacrificial layer and the semiconductor pillar structures, wherein the spacer material layers are formed as, or are subsequently replaced with, electrically conductive layers; forming memory stack structures including a respective vertical semiconductor channel and a respective memory film through the alternating stack; forming a source-level cavity by removing the source-level sacrificial layer while the semiconductor pillar structures provide mechanical support to the alternating stack; and forming a source-level semiconductor material layer within a volume of the source-level cavity, wherein the source-level semiconductor material layer adjoins bottom end portions of the vertical semiconductor channels and laterally surrounds the semiconductor pillar structures.

In one embodiment, a bottommost insulating layer within the alternating stack is formed directly on top surfaces of the semiconductor pillar structures and directly on a top surface of the source-level sacrificial layer.

In one embodiment, the source-level cavity is formed after formation of the vertical semiconductor channels; and the source-level semiconductor material layer is formed by deposition of a doped semiconductor material on physically exposed surfaces of the vertical semiconductor channels. Such embodiments further may comprise forming a first conductivity type semiconductor layer having a doping of a first conductivity type and a second conductivity type semiconductor layer having a doping of a second conductivity type that is an opposite of the first conductivity type and contacting a bottom surface of the first conductivity type semiconductor layer by implanting electrical dopants into the semiconductor material layer, wherein the semiconductor pillar structures are adjoined to, and have a same doping type as, the first conductivity type semiconductor layer, wherein the source-level semiconductor material layer is formed by depositing a semiconductor material having a doping of the first conductivity type on bottom surfaces of the vertical semiconductor channels, sidewalls of the semiconductor pillar structures, and a top surface of the first conductivity type semiconductor layer. In such embodiments the substrate semiconductor material layer may have a doping of a first conductivity type; and the source-level semiconductor material layer may be formed by depositing a semiconductor material having a doping of a second conductivity type on bottom surfaces of the vertical semiconductor channels, wherein the second conductivity type is an opposite of the first conductivity type.

One embodiment further comprises: forming a backside trench through the alternating stack, wherein a material of the source-level sacrificial layer is physically exposed to the backside trench; and removing the source-level sacrificial layer while the semiconductor pillar structures provide mechanical support to the alternating stack, wherein the source-level cavity is formed. In such embodiments, each of the memory films may include a charge storage layer and a tunneling dielectric layer; the method may further comprise removing cylindrical portions of the memory films that are physically exposed to the source-level cavity after removal of the source-level sacrificial layer, wherein lower portions of outer sidewalls of the vertical semiconductor channels are physically exposed; and the source-level semiconductor material layer may be formed directly on the lower portions of the outer sidewalls of the vertical semiconductor channels.

One embodiment further comprises: forming a dielectric liner layer on the semiconductor pillar structures; forming a source-level metallic layer on the dielectric liner layer, wherein the source-level metallic layer is formed on the dielectric liner layer, and surfaces of the source-level metallic layer are physically exposed upon removal of the source-level sacrificial layer; and forming the source-level semiconductor material layer on the source-level metallic layer, wherein the source-level semiconductor material layer and the source-level metallic layer is electrically isolated from the substrate semiconductor material layer by the dielectric liner layer.

One embodiment further comprises forming memory openings through the alternating stack, wherein the source-level cavity is formed after formation of the memory openings and prior to formation of the vertical semiconductor channels. In such an embodiment, the source-level sacrificial layer may be physically exposed at a bottom of each of the memory openings; and the method may further comprise applying an isotropic etchant to the source-level sacrificial layer through the memory openings, wherein the source-level cavity is connected to each of the memory openings upon formation. In such an embodiment, the source-level semiconductor material layer and the vertical semiconductor channels may be formed by simultaneous deposition of a doped semiconductor material in the memory openings and in the source-level cavity. In such an embodiment, the source-level semiconductor material layer may comprise horizontally-extending portions of the doped semiconductor material that are deposited in the source-level cavity; and the vertical semiconductor channels may comprise vertically-extending portions of the doped semiconductor material that are deposited in the memory openings. Such an embodiment may further comprise depositing a conformal material layer stack that extends across the source-level cavity and each of the memory openings, wherein: the memory stack structures comprise portions of the conformal material layer stack deposited in the memory openings; and the source-level semiconductor material layer comprise a portion of the conformal material layer stack deposited in the source-level cavity. In such an embodiment, the conformal material layer stack may comprise a charge storage layer comprising a charge storage material; a tunneling dielectric layer deposited on the charge storage layer; and a vertical semiconductor channel that is deposited on the tunneling dielectric layer.

One embodiment further comprises: forming memory openings through the alternating stack, wherein the source-level cavity is formed after formation of the memory openings and prior to formation of the vertical semiconductor channels; forming a backside trench through the alternating stack by etching through unmasked portions of the alternating stack; forming a source region at a bottom portion of the backside trench directly on the source-level semiconductor material layer; and forming a backside contact via structure on the source region within the backside trench.

According to another aspect of the present disclosure, a method of forming a three-dimensional memory device is provided, which comprises: forming a stack of a first conductivity type semiconductor layer having a doping of a first conductivity type and a second conductivity type semiconductor layer having a doping of a second conductivity type that is an opposite of the first conductivity type and providing a p-n junction at an interface with a bottom surface of the first conductivity type semiconductor layer in an upper portion of a substrate; forming a source-level sacrificial layer over the first conductivity type semiconductor layer; forming an alternating stack of insulating layers and spacer material layers over the source-level sacrificial layer and the semiconductor pillar structures, wherein the spacer material layers are formed as, or are subsequently replaced with, electrically conductive layers; forming memory stack structures including a respective vertical semiconductor channel and a respective memory film; forming a source-level cavity by removing the source-level sacrificial layer; and forming a source-level semiconductor material layer within a volume of the source-level cavity directly on the vertical semiconductor channels and a top surface of the first conductivity type semiconductor layer.

One embodiment further comprises removing portions of the memory films that are physically exposed to the source-level cavity using an isotropic etch process, wherein: a lower portion of an outer sidewall of each of the vertical semiconductor channels is physically exposed by the isotropic etch process; and the source-level semiconductor material layer is formed directly on the lower portion of the outer sidewall of each of the vertical semiconductor channels.

In one embodiment, the second conductivity type semiconductor layer is formed over a substrate semiconductor material layer that has a doping of the first conductivity type, and the source-level semiconductor material layer has a doping of the first conductivity type and is electrically isolated from the substrate semiconductor material layer by a series of two p-n junctions having opposite polarities.

One embodiment further comprises: forming a dielectric liner layer on a top surface of the first conductivity type semiconductor layer, wherein the source-level sacrificial layer is formed on the dielectric liner layer; and removing the dielectric liner layer and portions of the memory films underlying the alternating stack using an isotropic etch process.

One embodiment further comprises: forming a backside trench through the alternating stack by etching through unmasked portions of the alternating stack; applying an isotropic etchant that etches a material of the source-level sacrificial layer through the backside trench, wherein the source-level cavity is formed upon etching of the source-level sacrificial layer by the isotropic etchant; forming a source region at a bottom portion of the backside trench directly on the source-level semiconductor material layer; and forming a backside contact via structure on the source region within the backside trench.

Various embodiments of the present disclosure provide three-dimensional memory devices and methods of making the same that include electrical connections between vertical semiconductor channels and buried source regions that have greater margin and are easier to form, thereby enabling higher yields and lower manufacturing costs.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a substrate including a stack of a first conductivity type semiconductor layer having a doping of a first conductivity type and a second conductivity type semiconductor layer having a doping of a second conductivity type that is an opposite of the first conductivity type and providing a p-n junction at an interface with a bottom surface of the first conductivity type semiconductor layer;
a source-level semiconductor material layer contacting a top surface of the first conductivity type semiconductor layer and having a doping of the first conductivity type;
an alternating stack of insulating layers and electrically conductive layers overlying semiconductor pillar structures and the source-level semiconductor material layer; and
memory stack structures vertically extending through the alternating stack, wherein each of the memory stack structures comprises a respective vertical semiconductor channel and a respective memory film.

2. The three-dimensional memory device of claim 1, wherein a lower portion of an outer sidewall of each of the vertical semiconductor channels directly contacts the source-level semiconductor material layer.

3. The three-dimensional memory device of claim 1, further comprising dielectric layer stacks contacting a bottom surface of a respective one of the vertical semiconductor channels and a respective recessed surface of the first conductivity type semiconductor layer.

4. The three-dimensional memory device of claim 3, wherein each of the dielectric layer stacks contacts, and is laterally surrounded by, the source-level semiconductor material layer.

5. The three-dimensional memory device of claim 4, wherein each of the memory films comprises a charge storage layer and a tunneling dielectric layer.

6. The three-dimensional memory device of claim 5, wherein each of the dielectric layer stacks comprises a tunneling dielectric material portion having a same composition and a same thickness as the tunneling dielectric layer, and a charge storage material portion having a same composition and a same thickness as the charge storage layer.

7. The three-dimensional memory device of claim 1, wherein a bottommost surface of each of the vertical semiconductor channels directly contacts the source-level semiconductor material layer.

8. The three-dimensional memory device of claim 1, wherein each of the memory films has a tubular configuration, laterally surrounds and contacts a respective one of the vertical semiconductor channels, and includes a respective vertical stack of memory elements.

9. The three-dimensional memory device of claim 8, wherein each of the memory films has an annular bottom surface that contact the source-level semiconductor material layer.

10. The three-dimensional memory device of claim 1, further comprising:
a source region included within the source-level semiconductor material layer, having a doping of the second conductivity type, and laterally spaced from the vertical semiconductor channels;
a backside trench vertically extending through the alternating stack; and
a backside contact via structure located within the backside trench and contacting a top surface of the source region.

11. A method of forming a three-dimensional memory device comprising:
forming a stack of a first conductivity type semiconductor layer having a doping of a first conductivity type and a second conductivity type semiconductor layer having a doping of a second conductivity type that is an opposite of the first conductivity type and providing a p-n junction at an interface with a bottom surface of the first conductivity type semiconductor layer in an upper portion of a substrate;
forming a source-level sacrificial layer over the first conductivity type semiconductor layer;
forming an alternating stack of insulating layers and spacer material layers over the source-level sacrificial layer and semiconductor pillar structures, wherein the spacer material layers are formed as, or are subsequently replaced with, electrically conductive layers;
forming memory stack structures including a respective vertical semiconductor channel and a respective memory film;
forming a source-level cavity by removing the source-level sacrificial layer; and
forming a source-level semiconductor material layer within a volume of the source-level cavity directly on the vertical semiconductor channels and a top surface of the first conductivity type semiconductor layer.

12. The method of claim 11, further comprising removing portions of the memory films that are physically exposed to the source-level cavity using an isotropic etch process.

13. The method of claim 12, wherein a lower portion of an outer sidewall of each of the vertical semiconductor channels is physically exposed by the isotropic etch process.

14. The method of claim 13, wherein the source-level semiconductor material layer is formed directly on the lower portion of the outer sidewall of each of the vertical semiconductor channels.

15. The method of claim 11, wherein:
the second conductivity type semiconductor layer is formed over a substrate semiconductor material layer that has a doping of the first conductivity type; and
the source-level semiconductor material layer has a doping of the first conductivity type and is electrically isolated from the substrate semiconductor material layer by a series of two p-n junctions having opposite polarities.

16. The method of claim 11, further comprising forming a dielectric liner layer on a top surface of the first conductivity type semiconductor layer, wherein the source-level sacrificial layer is formed on the dielectric liner layer.

17. The method of claim 16, further comprising removing the dielectric liner layer and portions of the memory films underlying the alternating stack using an isotropic etch process.

18. The method of claim 1, further comprising forming a backside trench through the alternating stack by etching through unmasked portions of the alternating stack.

19. The method of claim 18, further comprising applying an isotropic etchant that etches a material of the source-level sacrificial layer through the backside trench, wherein the source-level cavity is formed upon etching of the source-level sacrificial layer by the isotropic etchant.

20. The method of claim 19, further comprising:
   forming a source region at a bottom portion of the backside trench directly on the source-level semiconductor material layer; and
   forming a backside contact via structure on the source region within the backside trench.

* * * * *